(12) United States Patent
Nishizawa et al.

(10) Patent No.: US 9,568,313 B2
(45) Date of Patent: Feb. 14, 2017

(54) ELECTRONIC DEVICE, ELECTRONIC APPARATUS, AND MOVING OBJECT

(71) Applicant: Seiko Epson Corporation, Tokyo (JP)

(72) Inventors: Ryuta Nishizawa, Matsumoto (JP); Takashi Nomiya, Matsumoto (JP); Keiichi Yamaguchi, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/886,591

(22) Filed: Oct. 19, 2015

(65) Prior Publication Data

US 2016/0116286 A1    Apr. 28, 2016

(30) Foreign Application Priority Data

Oct. 28, 2014   (JP) .................... 2014-219774
Oct. 28, 2014   (JP) .................... 2014-219775

(51) Int. Cl.
| H01L 29/84 | (2006.01) |
| H01L 31/0203 | (2014.01) |
| H01L 23/20 | (2006.01) |
| H01L 21/00 | (2006.01) |
| G01C 19/5628 | (2012.01) |

(52) U.S. Cl.
CPC .................. *G01C 19/5628* (2013.01)

(58) Field of Classification Search
CPC .. G01C 19/5719; H01L 41/047; H01L 41/107; H01L 41/0825; H01L 41/1132; H01L 2224/16225

USPC ...... 257/415, E21.215, 682, 433; 438/53, 48
See application file for complete search history.

(56) References Cited

U.S. PATENT DOCUMENTS

| 2009/0085191 A1* | 4/2009 | Najafi .................. B81B 7/0058 257/698 |
| 2011/0140575 A1* | 6/2011 | Nishizawa ......... G01C 19/5628 310/323.21 |
| 2012/0074233 A1* | 3/2012 | Finn ...................... G06K 19/077 235/492 |
| 2012/0126664 A1* | 5/2012 | Ogura ................ G01C 19/5607 310/312 |
| 2013/0126622 A1* | 5/2013 | Finn ................. G06K 19/07771 235/492 |

FOREIGN PATENT DOCUMENTS

| JP | 2005-292079 A | 10/2005 |
| JP | 2008-058258 A | 3/2008 |
| JP | 2010-256332 A | 11/2010 |
| JP | 2012-079751 A | 4/2012 |

* cited by examiner

*Primary Examiner* — Dzung Tran

(57) ABSTRACT

An electronic device includes a vibration element having a detection signal electrode and a drive signal electrode, an IC disposed so as to be opposed to the vibration element, a first wiring pattern located between the IC and the vibration element, and electrically connected to the drive signal electrode, and a shield wiring pattern located on the vibration element side of the first wiring pattern, and electrically connected to a constant potential (ground).

6 Claims, 37 Drawing Sheets

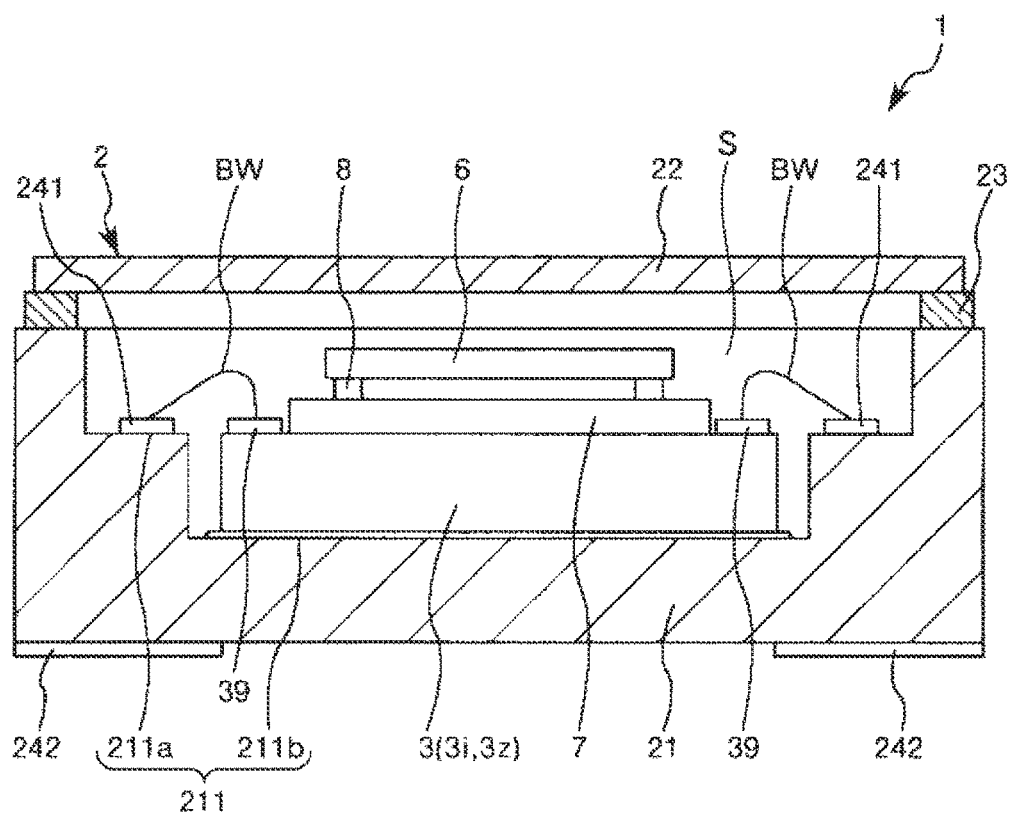
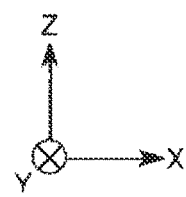
FIG. 1

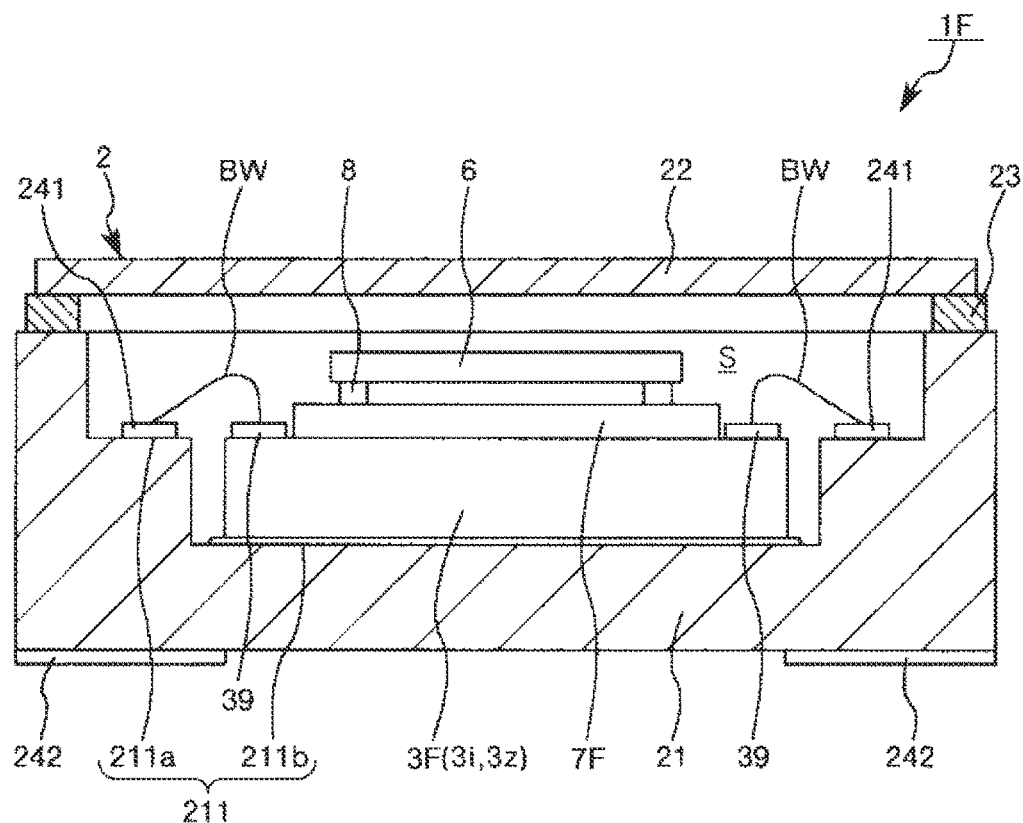
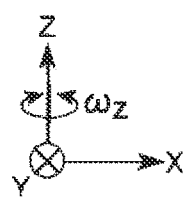
FIG. 20

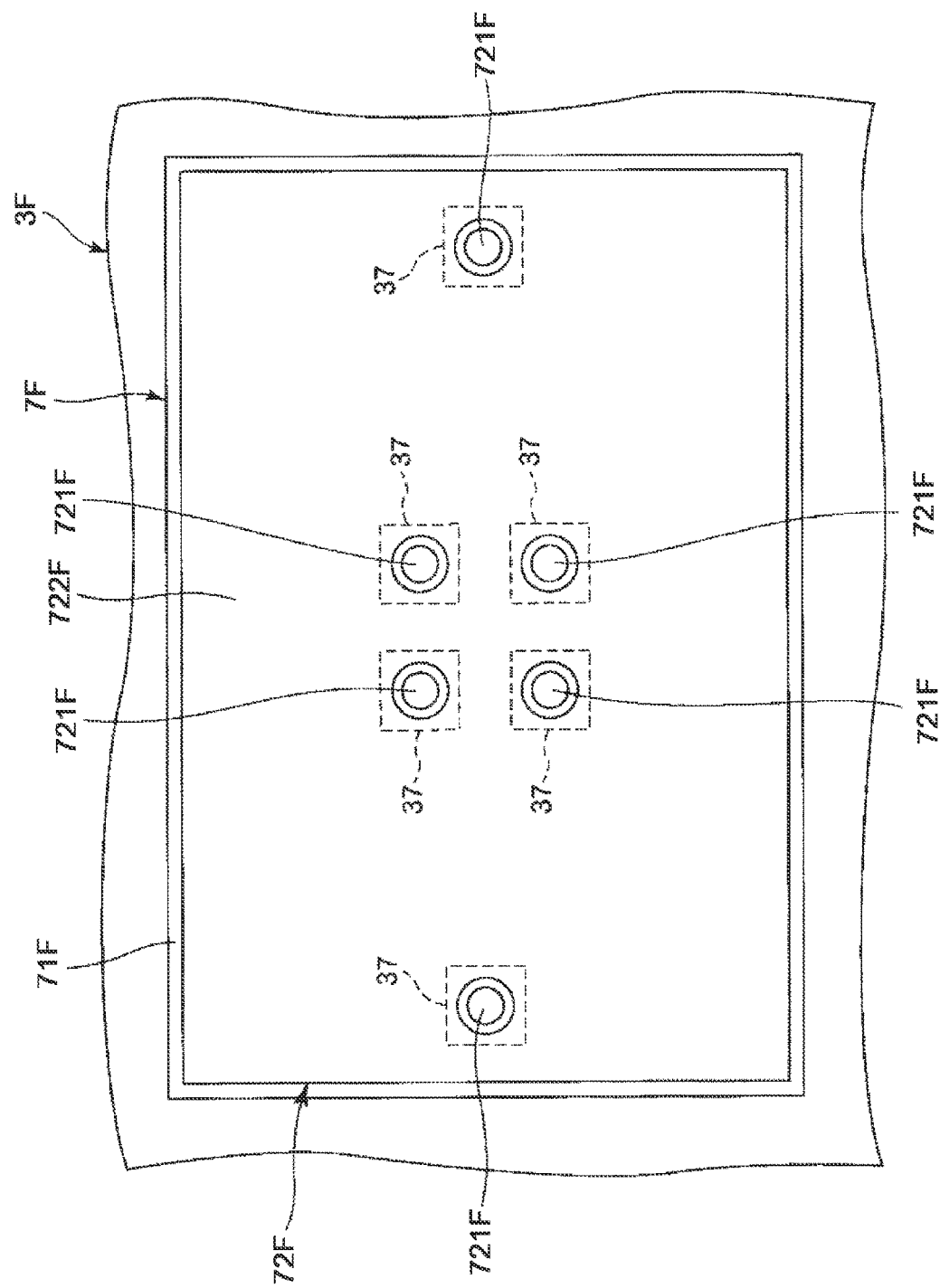

ELECTRONIC DEVICE, ELECTRONIC APPARATUS, AND MOVING OBJECT

BACKGROUND

1. Technical Field

The present invention relates to an electronic device, an electronic apparatus, and a moving object.

2. Related Art

In the past, as an electronic device for detecting an angular velocity, there has been known the electronic device described in JP-A-2012-79751 (Document 1). The electronic device described in Document 1 has a semiconductor substrate, a stress relaxation layer disposed on the active surface side of the semiconductor substrate, a wiring disposed on the stress relaxation layer, and a vibration element disposed on the stress relaxation layer so as to electrically be connected to the wiring. By disposing the vibration element on the semiconductor substrate via the stress relaxation layer in such a manner as described above, height reduction of the electronic device can be achieved.

However, in such an electronic device, an electrostatic capacitance occurs between an electrode provided to the vibration element and wiring lines on the stress relaxation layer or between wiring lines on the semiconductor substrate and the wiring lines on the stress relaxation layer, and the noise due to the electrostatic capacitance is generated. Therefore, in the electronic device described in Document 1, there is a problem that the detection accuracy of the angular velocity is degraded.

SUMMARY

An advantage of the invention is to provide an electronic device, an electronic apparatus, and a moving object each capable of reducing the degradation of the detection accuracy of the physical quantity.

The invention can be implemented as the following forms or application examples.

Application Example 1

An electronic device according to this application example includes a vibration element including a vibration body and an electrode provided to the vibration body, a substrate disposed so as to be opposed to the vibration element, a first wiring pattern located between the substrate and the vibration element, and electrically connected to a potential different from the electrode, and a first shield wiring pattern located on the vibration element side of the first wiring pattern, and electrically connected to a constant potential.

According to this application example, it is possible to provide an electronic device capable of reducing the degradation of detection accuracy of a physical quantity.

Application Example 2

In the electronic device according to the application example described above, it is preferable that the vibration body includes a drive vibrating section and a detection vibrating section, a drive signal electrode electrically connected to the first wiring pattern is disposed in the drive vibrating section, and a detection signal electrode as the electrode is disposed in the detection vibrating section.

According to this application example, mixture of noise into the detection signal electrode and the drive signal electrode is reduced.

Application Example 3

In the electronic device according to the application example described above, it is preferable that the vibration body includes a drive vibrating section and a detection vibrating section, a drive signal electrode as the electrode is disposed in the drive vibrating section, and a detection signal electrode electrically connected to the first wiring pattern is disposed in the detection vibrating section.

According to this application example, mixture of noise into the detection signal electrode and the drive signal electrode is reduced.

Application Example 4

In the electronic device according to the application example described above, it is preferable that the first shield wiring pattern is grounded.

According to this application example, the configuration of the device becomes simple.

Application Example 5

In the electronic device according to the application example described above, it is preferable to further include a second wiring pattern located on the substrate side of the first wiring pattern, and electrically connected to a potential different from the first wiring pattern, and a second shield wiring pattern located between the first wiring pattern and the second wiring pattern, and electrically connected to a constant potential.

According to this application example, it is possible to further reduce the degradation of the detection accuracy of the physical quantity.

Application Example 6

An electronic device according to this application example includes a vibration element including a vibration body and an electrode provided to the vibration body, a semiconductor substrate disposed so as to be opposed to the vibration element, a first wiring pattern located between the semiconductor substrate and the vibration element, a second wiring pattern located between the first wiring pattern and the vibration element, and different in potential from the first wiring pattern, and a shield wiring pattern disposed at least a part of an area, which is located between the first wiring pattern and the second wiring pattern, and in which the first wiring pattern and the second wiring pattern overlap each other in a planar view, the shield wiring pattern being electrically connected to a constant potential.

According to this application example, it is possible to provide an electronic device capable of reducing the degradation of detection accuracy of a physical quantity.

Application Example 7

In the electronic device according to the application example described above, it is preferable that the vibration body includes a drive vibrating section and a detection vibrating section, the electrode includes a drive signal electrode disposed in the drive vibrating section and a detection signal electrode disposed in the detection vibrating section, and one of the first wiring pattern and the second wiring pattern is electrically connected to the drive signal electrode, and the other of the first wiring pattern and the second wiring pattern is electrically connected to the detection signal electrode.

According to this application example, mixture of noise into the detection signal electrode and the drive signal electrode is reduced.

Application Example 8

In the electronic device according to the application example described above, it is preferable that the shield wiring pattern is grounded.

According to this application example, the configuration of the device becomes simple.

Application Example 9

In the electronic device according to the application example described above, it is preferable to further include an insulating layer disposed between the first wiring pattern and the shield wiring pattern.

According to this application example, it becomes easy to dispose the first wiring pattern and the shield wiring pattern.

Application Example 10

In the electronic device according to the application example described above, it is preferable to further include an insulating layer disposed between the second wiring pattern and the shield wiring pattern.

According to this application example, it becomes easy to dispose the second wiring pattern and the shield wiring pattern.

Application Example 11

In the electronic device according to the application example described above, it is preferable that the insulating layer has elasticity.

According to this application example, propagation of an impact to the vibration element is reduced.

Application Example 12

An electronic apparatus according to this application example includes the electronic device according to any one of the application examples described above.

According to this application example, the electronic apparatus high in reliability can be obtained.

Application Example 13

A moving object according to this application example includes the electronic device according to any one of the application examples described above.

According to this application example, the moving object high in reliability can be obtained.

BRIEF DESCRIPTION OF THE DRAWINGS

The invention will be described with reference to the accompanying drawings, wherein like numbers reference like elements.

FIG. 1 is a cross-sectional view showing an electronic device according to a first embodiment of the invention.

FIGS. 4A and 4B are diagrams showing an electrode arrangement of the vibration element shown in FIG. 3, wherein FIG. 4A is a top view, and FIG. 4B is a transparent view.

FIG. 20 is a cross-sectional view showing an electronic device according to a sixth embodiment of the invention.

FIG. 23 is a plan view of the stress relaxation layer shown in FIG. 21.

DESCRIPTION OF EXEMPLARY EMBODIMENTS

Hereinafter, an electronic device, an electronic apparatus, and a moving object according to the invention will be explained in detail based on some embodiments shown in the accompanying drawings.

First Embodiment

Figure 2:
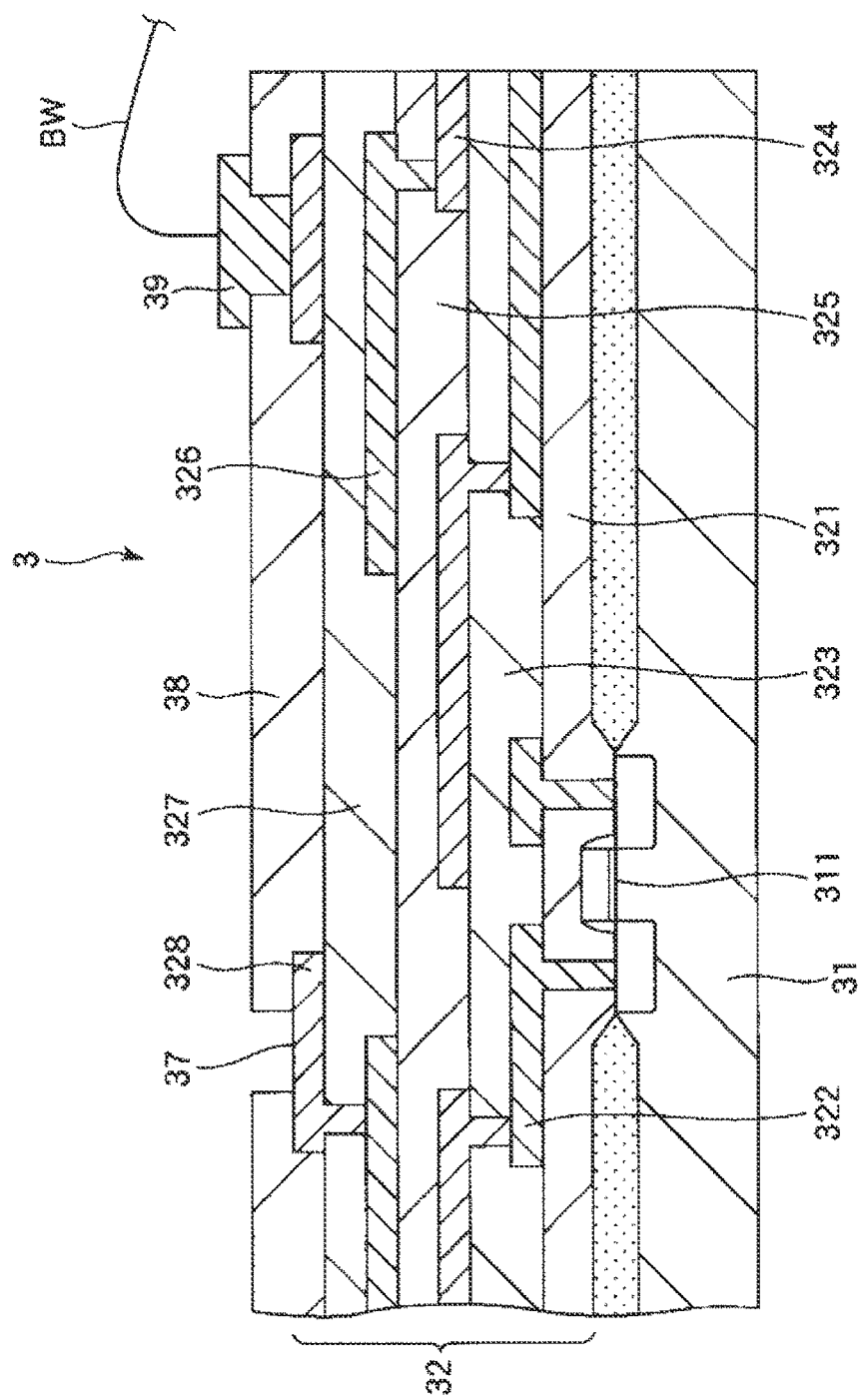
FIG. 2 is a cross-sectional view of an IC provided to the electronic device shown in FIG. 1.
Figure 3:
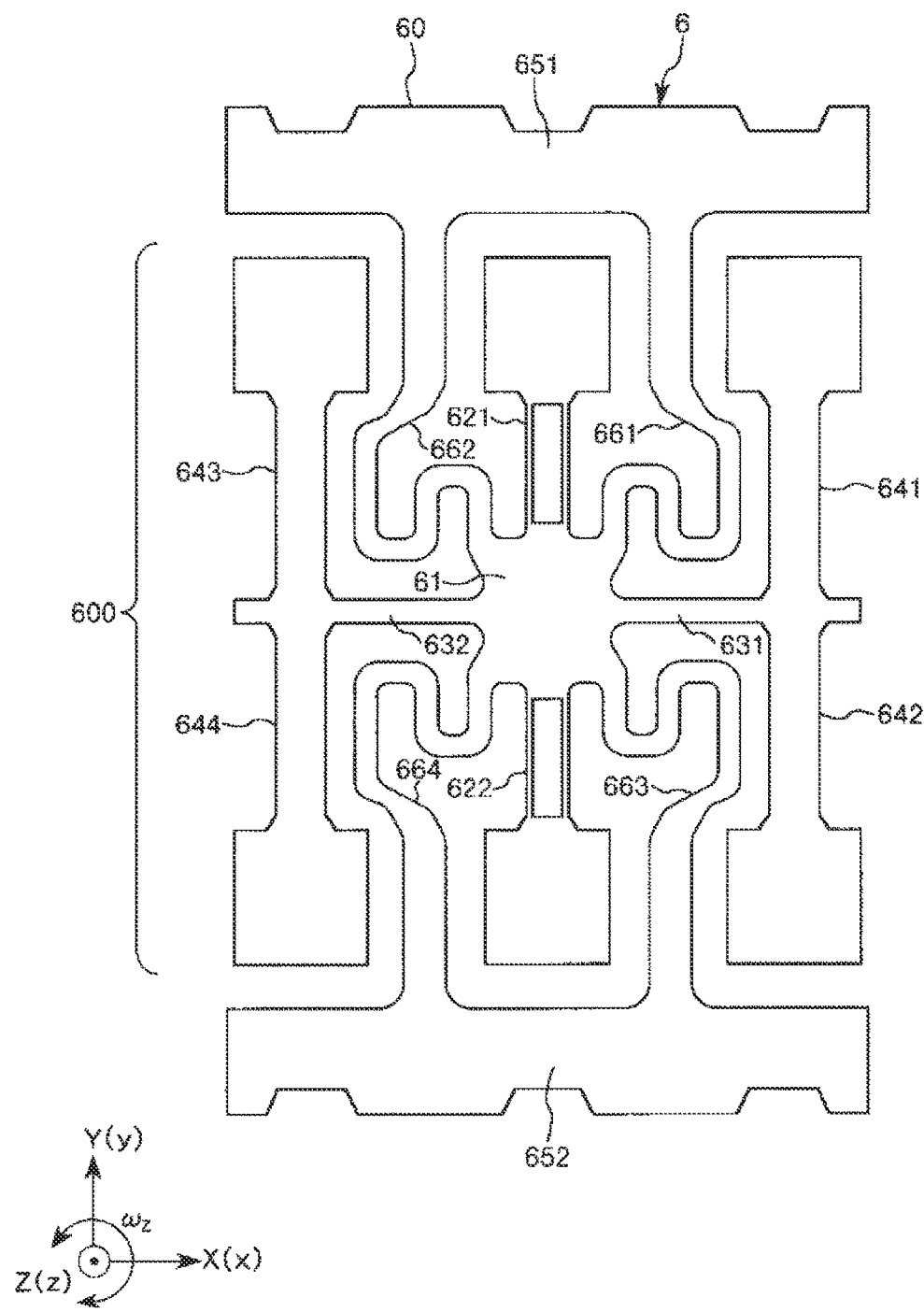
FIG. 3 is a plan view of a vibration element provided to the electronic device shown in FIG. 1.
Figures 4A, 4B:
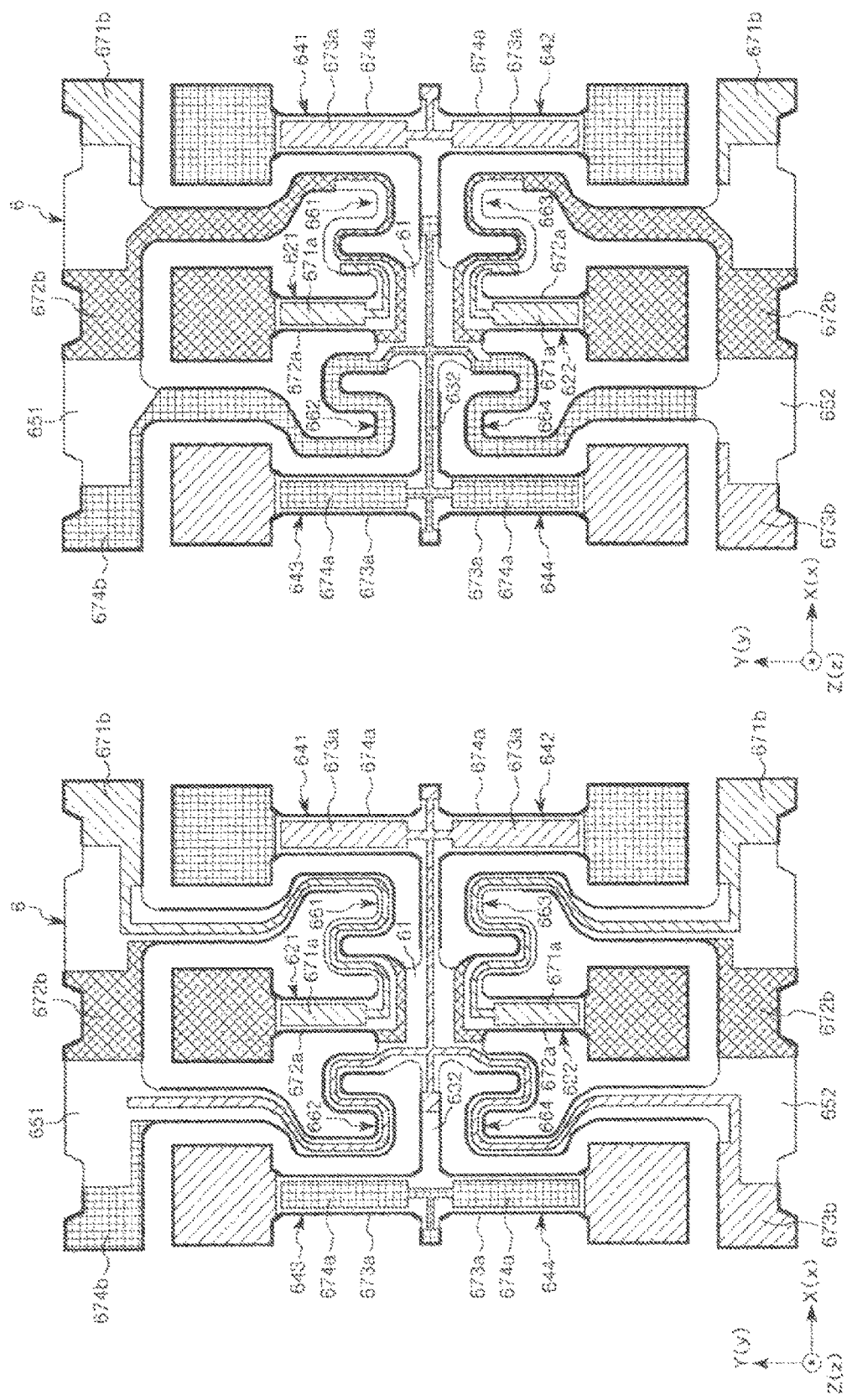
Figure 5A:
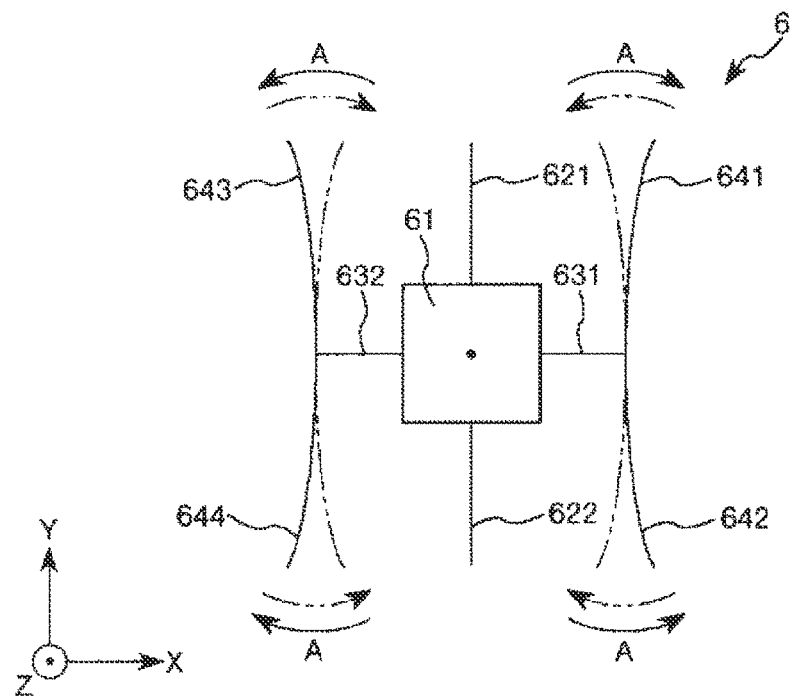
FIGS. 5A and 5B are schematic diagrams for explaining an action of the vibration element shown in FIG. 3.
Figure 5B:
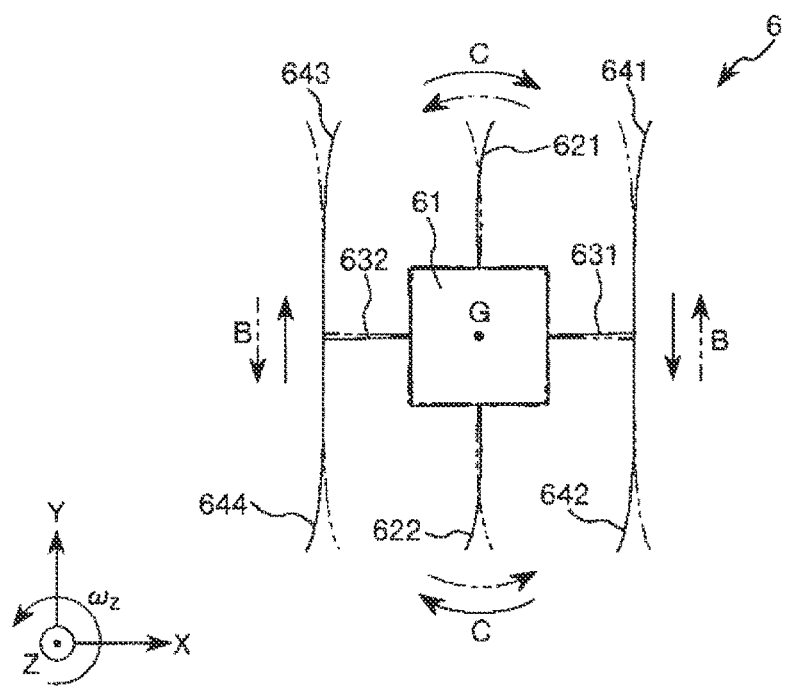
Figure 6:
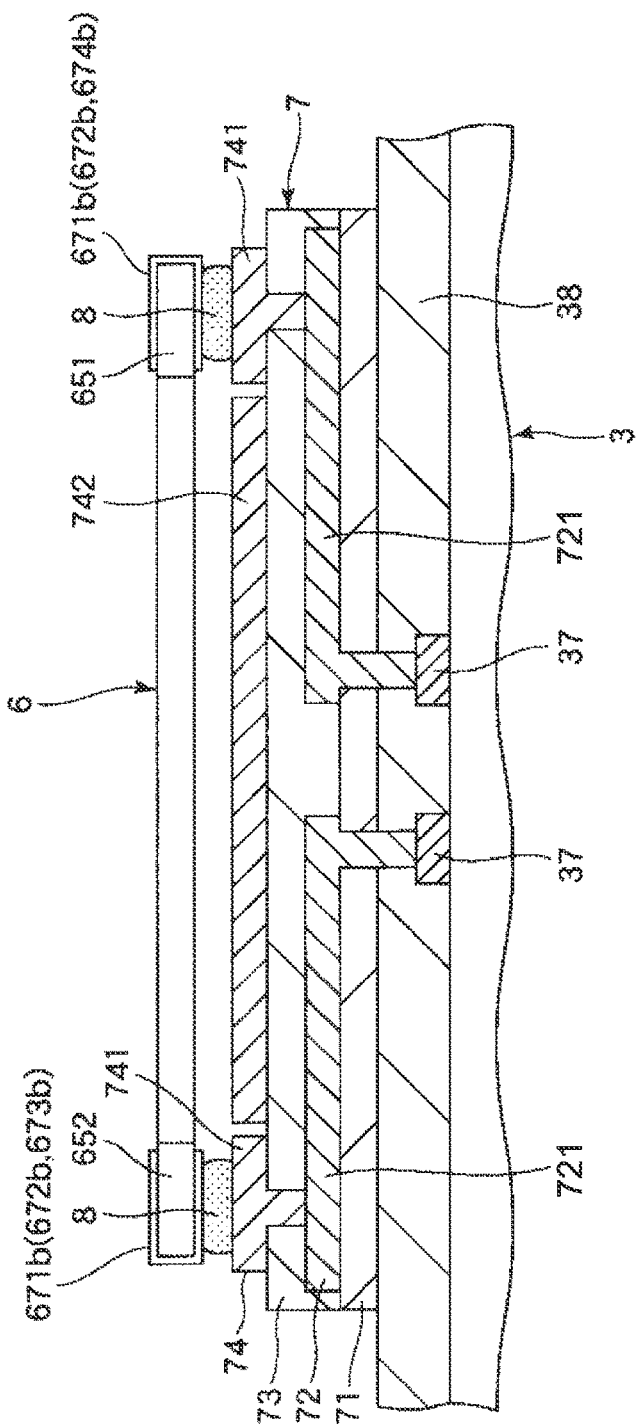
FIG. 6 is a cross-sectional view of a stress relaxation layer provided to the electronic device shown in FIG. 1.
Figure 7:
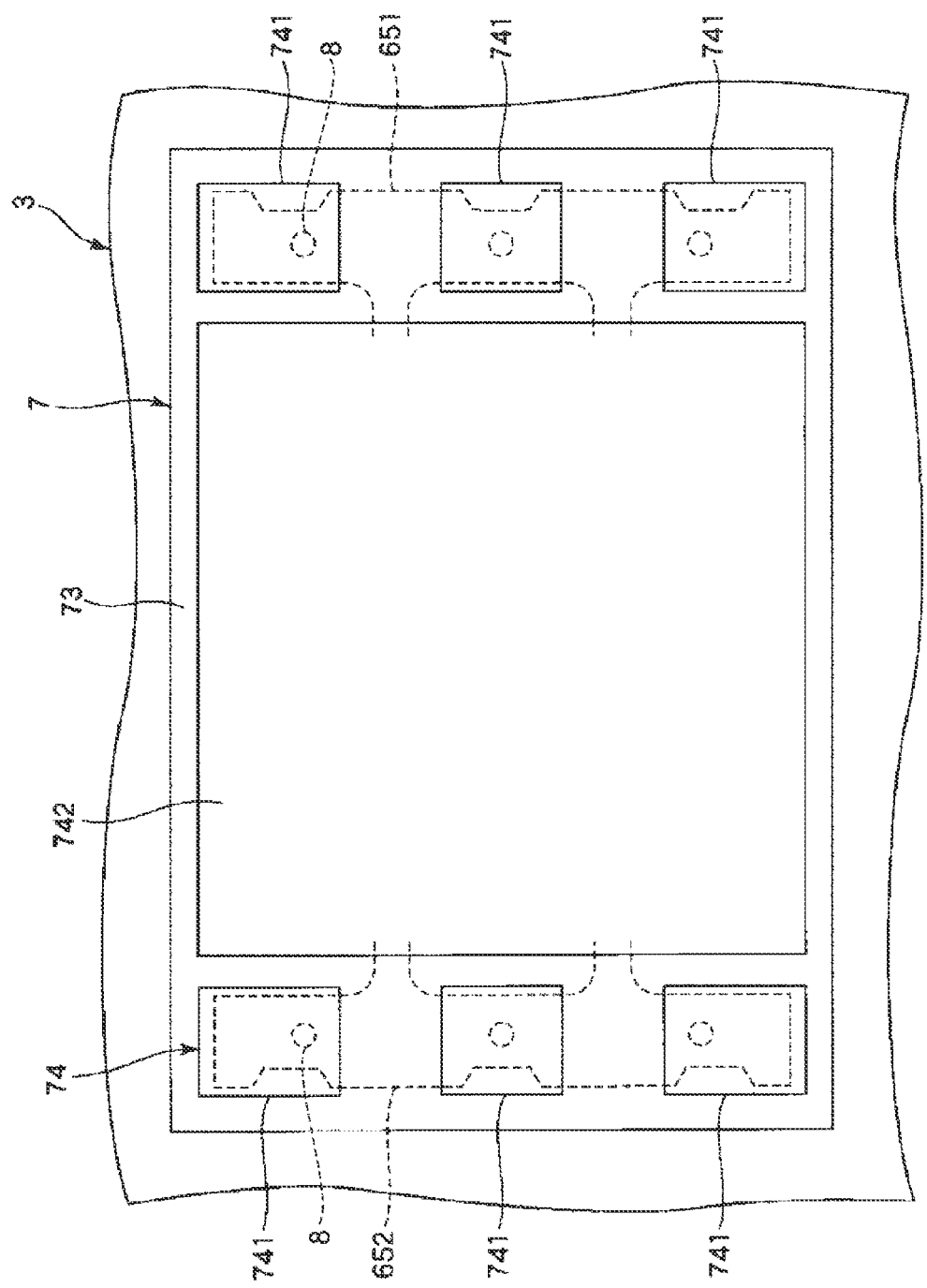
FIG. 7 is a plan view of the stress relaxation layer shown in FIG. 6.
Figure 8:
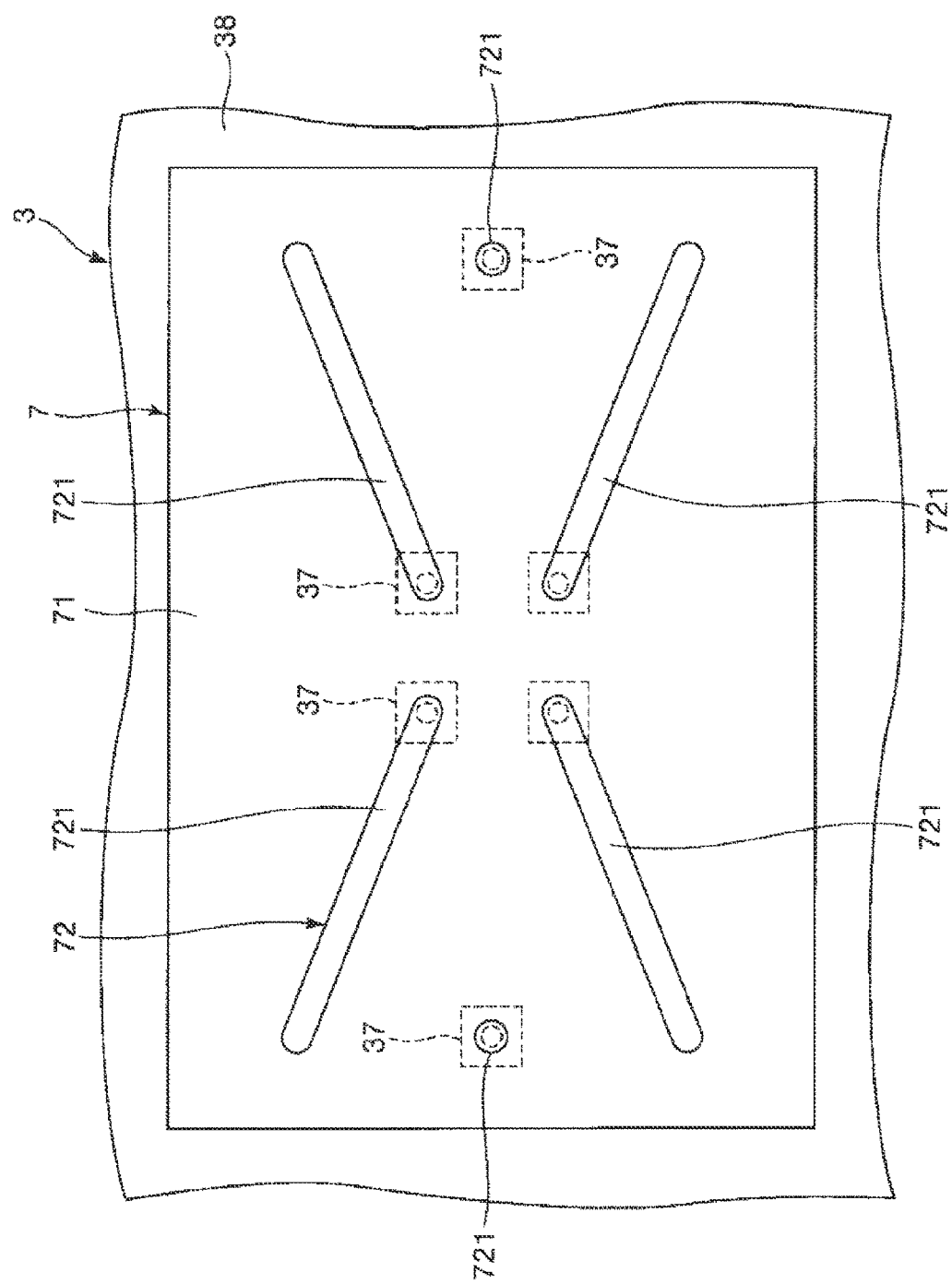
FIG. 8 is a plan view of the stress relaxation layer shown in FIG. 6.
Figure 9A:
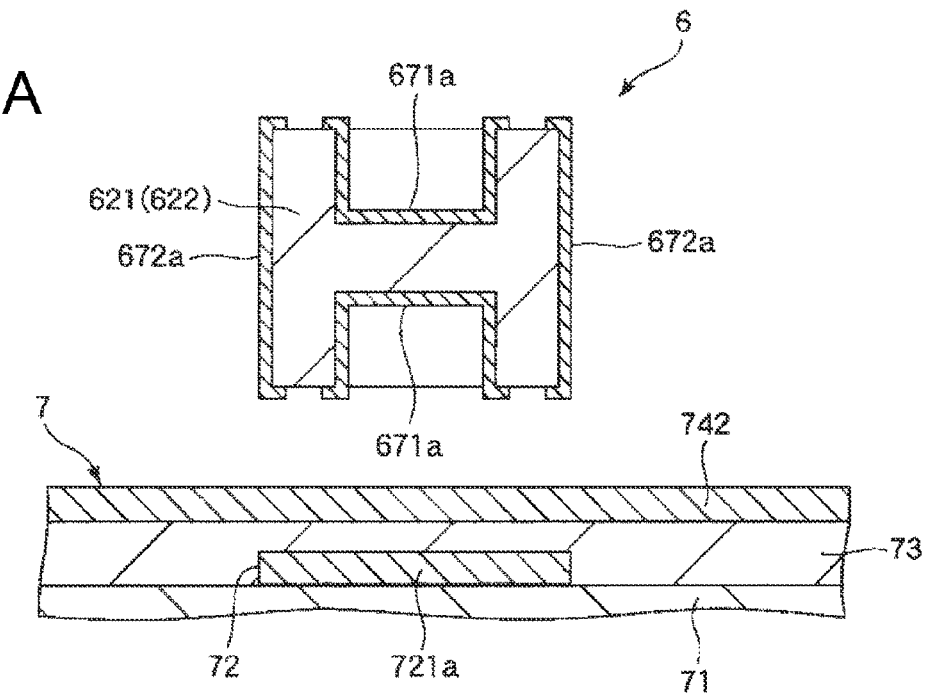
FIGS. 9A and 9B are cross-sectional views of a shield wiring pattern.
Figure 9B:
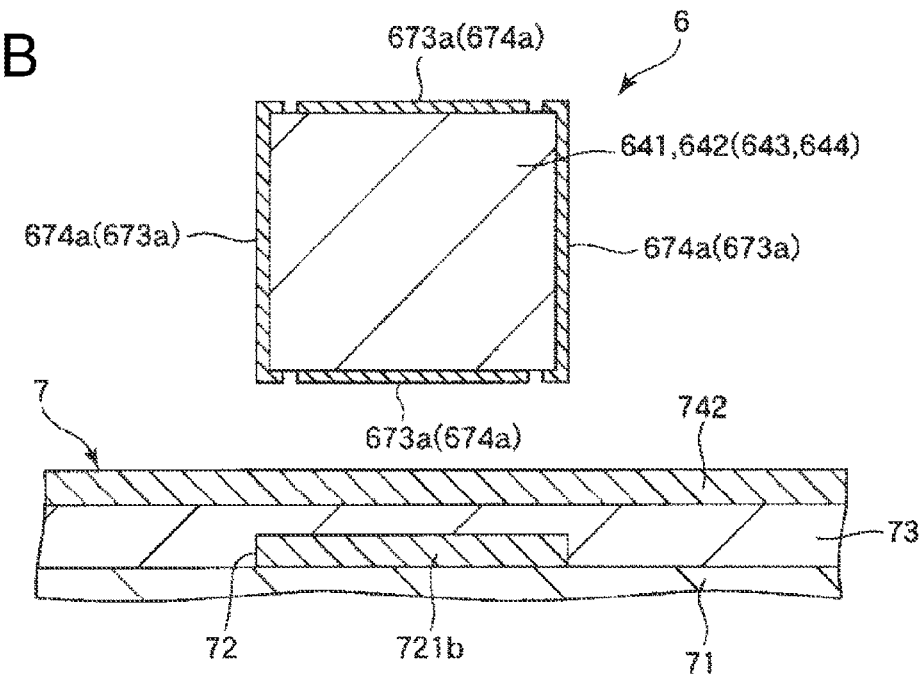

FIG. 1 is a cross-sectional view showing an electronic device according to a first embodiment of the invention. FIG. 2 is a cross-sectional view of an IC provided to the electronic device shown in FIG. 1. FIG. 3 is a plan view of a vibration element provided to the electronic device shown in FIG. 1. FIGS. 4A and 4B are diagrams showing an electrode arrangement of the vibration element shown in FIG. 3, wherein FIG. 4A is a top view, and FIG. 4B is a transparent view. FIGS. 5A and 5B are schematic diagrams for explaining an action of the vibration element shown in FIG. 3. FIG. 6 is a cross-sectional view of a stress relaxation layer provided to the electronic device shown in FIG. 1. FIGS. 7 and 8 are each a plan view of the stress relaxation layer shown in FIG. 6. FIGS. 9A and 9B are cross-sectional views of a shield wiring pattern, for explaining an advantage of the shield wiring pattern. It should be noted that the upper side of FIG. 1 is also referred to as an "upper side" and the lower side thereof is also referred to as a "lower side" in the following descriptions for the sake of convenience of explanation. Further, as shown in FIG. 1, it is assumed that three axes perpendicular to each other are defined as an X axis, a Y axis, and a Z axis, and the thickness direction of the electronic device coincides with the Z axis.

The electronic device 1 shown in FIG. 1 is an angular velocity sensor capable of detecting the angular velocity ωz around the Z axis. Such an electronic device 1 includes a package 2 having a housing space S inside, an IC 3 housed in the housing space S, a stress relaxation layer 7 disposed on the IC 3, and a vibration element 6 disposed on the stress relaxation layer 7. Hereinafter, each of these constituents will sequentially be explained.

Package

The package 2 includes a base 21 shaped like a box having a recessed section 211 opening in the upper surface, a lid 22 shaped like a plate for blocking the opening of the recessed section 211, and a seam ring 23 intervening between the base 21 and the lid 22 and adapted to bond the base 21 and the lid 22 to each other. Further, the IC 3 and the vibration element 6 are housed in the housing space S formed by blocking the opening of the recessed section 211 with the lid 22. It should be noted that the atmosphere in the housing space S is not particularly limited, but is set to, for example, a vacuum state (a reduced pressure state no higher than 10 Pa). Thus, the viscosity resistance is reduced, and it is possible to efficiently drive the vibration element 6.

Base 21

The base 21 has a roughly square planar shape. Further, the recessed section 211 includes a first recessed section 211a opening in the upper surface of the base 21, and a second recessed section 211b opening in a central portion of a bottom surface of the first recessed section 211a except an edge portion of the bottom surface. It should be noted that the planar shape of the base 21 is not particularly limited, but can also be, for example, a rectangular shape or a circular shape. Such a base 21 can be formed by sintering a plurality of ceramic green sheets, which are formed of, for example, an aluminum oxide material, an aluminum nitride material, a silicon carbide material, a mullite material, or a glass ceramic material, and are stacked one another.

Further, on the bottom surface of the first recessed section 211a, there is disposed a plurality of internal terminals 241 electrically connected to the IC 3 via a bonding wires BW, and on the bottom surface of the base 21, there is disposed a plurality of external terminals 242. Further, the internal terminals 241 and the external terminals 242 are electrically connected to each other via an internal wiring and so on not shown and disposed to the base 21. The configuration of such internal terminals 241 and external terminals 242 is not particularly limited, but it is possible to adopt a configuration in which a foundation layer made of, for example, tungsten (W), molybdenum (Mo), or manganese (Mg) is covered with a metal layer made of gold (Au) or the like.

The lid 22 has a plate-like shape, and is bonded to the upper surface of the base 21 via the seam ring 23. The constituent material of the lid 22 is not particularly limited, but an alloy such as kovar is preferably used. It should be noted that it is also possible for the lid 22 to electrically be connected to a ground wiring via, for example, the seam ring 23. Thus, it is possible to make the lid 22 function as a shield section for shielding against the noise from the outside of the package 2.

IC

The IC 3 is fixed to the bottom surface of the second recessed section 211b with a silver paste or the like. The IC 3 includes an interface section 3i for communicating with, for example, an external host device, and a drive/detection circuit 3z for driving the vibration element 6 to detect the angular velocity ωz applied to the vibration element 6.

Further, as shown in, for example, FIG. 2, the IC 3 includes a silicon substrate 31 as a substrate (a semiconductor substrate) having an active surface 311 on which circuit elements such as transistor are disposed, a wiring layer 32 stacked on the active surface 311 of the silicon substrate 31, and a passivation film 38 disposed on the wiring layer 32. Further, the wiring layer 32 includes a first insulating layer 321 disposed on the silicon substrate 31, a first wiring pattern layer 322 disposed on the first insulating layer 321, a second insulating layer 323 disposed on the first insulating layer 321 and the first wiring pattern layer 322, a second wiring pattern layer 324 disposed on the second insulating layer 323, a third insulating layer 325 disposed on the second insulating layer 323 and the second wiring pattern layer 324, a third wiring pattern layer 326 disposed on the third insulating layer 325, a fourth insulating layer 327 disposed on the third insulating layer 325 and the third wiring pattern layer 326, and a fourth wiring pattern layer 328 disposed on the fourth insulating layer 327. It should be noted that the configuration of the wiring layer 32 is not limited to this example, but the number of the insulating layers or the wiring layers stacked one another can also be no larger than 3, or no smaller than 5, for example.

Further, the IC 3 is provided with a plurality of connection terminals 37, 39 disposed on the upper surface, and the connection terminal 37 is electrically connected to the vibration element 6 via the stress relaxation layer 7, and the connection terminal 39 is electrically connected to the internal terminal 241 via the bonding wire BW. Thus, it is possible for the IC 3 to transmit and receive a signal to and from the vibration element 6, and at the same time, communicate with the host device via the external terminal 242. It should be noted that the communication method of the IC 3 is not particularly limited, but it is possible to use, for example, SPI (registered trademark; Serial Peripheral Interface, or I$^2$C (registered trademark; Inter-Integrated Circuit). Further, it is also possible for the IC 3 to have a selection function for selecting the communication method to be able to select the communication method from the SPI and I$^2$C. Thus, the electronic device 1 compatible with a plurality of communication methods, and therefore high in convenience is obtained.

Vibration Element

As shown in FIGS. 3, 4A, and 4B, the vibration element 6 has a vibrating element 60 made of quartz crystal, and electrodes disposed on the vibrating element 60. It should be noted that the material of the vibrating element 60 is not limited to quartz crystal, but it is also possible to use a piezoelectric material such as lithium tantalate or lithium niobate.

The vibrating element 60 has a plate-like shape having a spread in an x-y plane defined by an x axis (an electric axis) and a y axis (a mechanical axis) as the crystal axes of the quartz crystal and a thickness in a z-axis (an optical axis) direction. Such a vibrating element 60 includes abase section 61, detection vibrating arms 621, 622 as a pair of detection vibrating sections extending from the base section 61 toward both sides in the y-axis direction, a pair of connecting arms 631, 632 extending from the base section 61 toward both sides in the x-axis direction, drive vibrating arms 641, 642 as a pair of drive vibrating sections extending from a tip portion of the connecting arm 631 toward both sides in the y-axis direction, drive vibrating arms 643, 644 as a pair of drive vibrating sections extending from a tip portion of the connecting arm 632 toward both sides in the y-axis direction, a pair of support sections 651, 652 for supporting the base section 61, a pair of beam sections 661, 662 for connecting the support section 651 and the base section 61 to each other, and a pair of beam sections 663, 664 for connecting the support section 652 and the base section 61. It should be noted that in such a vibrating element 60, the base section 61, the detection vibrating arms 621, 622, the connecting arms 631, 632, and the drive vibrating arms 641 through 644 constitute a vibration body 600.

Further, in both principal surfaces (an upper surface and a lower surface) of each of the detection vibrating arms 621, 622, there are formed grooves each extending along the y-axis direction, and thus, the detection vibrating arms 621, 622 each have a roughly H-shaped horizontal cross-sectional shape. Further, the tip portion of each of the detection vibrating arms 621, 622, and the drive vibrating arms 641, 642, 643, and 644 is provided with a hammerhead large in width. It should be noted that the configuration of the vibrating element 60 is not limited to this example, but it is also possible to, for example, eliminate the grooves from the detection vibrating arms 621, 622, or eliminate the hammerheads from the detection vibrating arms 621, 622, and the drive vibrating arms 641, 642, 643, and 644. Further, it is also possible to form grooves in both principal surfaces of each of the drive vibrating arms 641, 642, 643, and 644 to provide a roughly H-shaped cross-sectional shape.

Then, the electrodes disposed on the vibrating element 60 will be explained. As shown in FIGS. 4A and 4B, the electrodes include detection signal electrodes 671a and detection signal terminals 671b, detection ground electrodes 672a and detection ground terminals 672b, drive signal electrodes 673a and a drive signal terminal 673b, and drive ground electrodes 674a and a drive ground terminal 674b. It should be noted that in FIGS. 4A and 4B, for the sake of convenience of explanation, the detection signal electrodes 671a and the detection signal terminals 671b, the detection ground electrodes 672a and the detection ground terminals 672b, the drive signal electrodes 673a and the drive signal terminal 673b, and the drive ground electrodes 674a and the drive ground terminal 674b are shown with respective hatching patterns different from each other. Further, the electrodes, wiring lines, terminals, and so on formed on the side surfaces of the vibrating element 60 are shown with heavy lines.

Drive Signal Electrodes and Drive Signal Terminal

The drive signal electrodes 673a are respectively disposed on the upper surface and the lower surface of each of the drive vibrating arms 641, 642, and both side surfaces of each of the drive vibrating arms 643, 644. Such drive signal electrodes 673a are electrodes for exciting the drive vibrations of the drive vibrating arms 641 through 644.

The drive signal terminal 673b is disposed in an end portion located on the −X-axis side of the support section 652. Further, the drive signal terminal 673b is electrically connected to the drive signal electrodes 673a, which are disposed on the drive vibrating arms 641 through 644, via the drive signal wiring line disposed on the beam section 664.

Drive Ground Electrodes and Drive Ground Terminal

The drive ground electrodes 674a are respectively disposed on the upper surface and the lower surface of each of the drive vibrating arms 643, 644, and both side surfaces of each of the drive vibrating arms 641, 642. Such drive ground electrodes 674a have an electrical potential to be a constant potential (a reference potential) with respect to the drive signal electrodes 673a. Here, the constant potential denotes a ground potential or a potential fixed to a certain potential.

The drive ground terminal 674b is disposed in an end portion located on the −X-axis side of the support section 651. Further, the drive ground terminal 674b is electrically connected to the drive ground electrodes 674a, which are disposed on the drive vibrating arms 641 through 644, via the drive ground wiring line disposed on the beam section 662.

By disposing the drive signal electrodes 673a and the drive signal terminal 673b, and the drive ground electrodes 674a and the drive ground terminal 674b in such a manner as described above, it is possible to generate an electric field between the drive signal electrodes 673a and the drive ground electrodes 674a respectively disposed on the drive vibrating arms 641 through 644 by applying the drive signal between the drive signal terminal 673b and the drive ground terminal 674b, to thereby make the drive vibrating arms 641 through 644 perform drive vibrations.

Detection Signal Electrodes and Detection Signal Terminals

The detection signal electrodes 671a are respectively disposed on the upper surface and the lower surface (the inner surface of the groove) of each of the detection vibrating arms 621, 622. Such detection signal electrodes 671a are electrodes for detecting the charge generated by detection vibrations of the detection vibrating arms 621, 622 when the detection vibrations are excited.

The detection signal terminal 671b is disposed on each of the support sections 651, 652. The detection signal terminal 671b disposed on the support section 651 is disposed in an end portion located on the +x-axis side of the support section 651, and is electrically connected to the detection signal electrodes 671a disposed on the detection vibrating arm 621 via the detection signal wiring line formed on the beam section 661. On the other hand, the detection signal terminal 671b disposed on the support section 652 is disposed in an end portion located on the +x-axis side of the support section 652, and is electrically connected to the detection signal electrodes 671a disposed on the detection vibrating arm 622 via the detection signal wiring line formed on the beam section 663.

Detection Ground Electrodes and Detection Ground Terminals

The detection ground electrodes 672a are respectively disposed on both side surfaces of each of the detection vibrating arms 621, 622. Such detection ground electrodes 672a have an electrical potential to be a constant potential (a reference potential) with respect to the detection signal electrodes 671a. Here, the constant potential denotes a ground potential or a potential fixed to a certain potential.

The detection ground terminal 672b is disposed on each of the support sections 651, 652. The detection ground terminal 672b disposed on the support section 651 is disposed in a central portion of the support section 651, and is electrically connected to the detection ground electrodes 672a disposed on the detection vibrating arm 621 via the detection ground wiring line formed on the beam section 661. On the other hand, the detection ground terminal 672b disposed on the support section 652 is disposed in a central portion of the support section 652, and is electrically connected to the detection ground electrodes 672a disposed on the detection vibrating arm 622 via the detection ground wiring line formed on the beam section 663.

By disposing the detection signal electrodes 671a and the detection signal terminals 671b, and the detection ground electrodes 672a and the detection ground terminals 672b in such a manner as described above, the detection vibration generated in the detection vibrating arm 621 appears as the charge between the detection signal electrodes 671a and the detection ground electrodes 672a disposed on the detection vibrating arm 621, and can be taken out as a signal between the detection signal terminal 671b and the detection ground terminal 672b disposed on the support section 651. Further, the detection vibration generated in the detection vibrating arm 622 appears as the charge between the detection signal electrodes 671a and the detection ground electrodes 672a disposed on the detection vibrating arm 622, and can be taken out as a signal between the detection signal terminal 671b and the detection ground terminal 672b disposed on the support section 652.

The configuration of the electrodes is not particularly limited as long as electrical conductively is provided, but the electrodes each can be formed of a metal coating obtained by stacking a coat made of Ni (nickel), Au (gold), Ag (silver), Cu (copper), or the like on a metalization layer (a foundation layer) made of, for example, Cr (chromium), or W (tungsten).

Such a vibration element 6 is fixed to the stress relaxation layer 7 in the support sections 651, 652. Further, fixation of the vibration element 6 to the stress relaxation layer 7 is achieved using fixation members (connecting members) 8 having electrical conductivity, and the vibration element 6 and the IC 3 are electrically connected to each other via the fixation members 8 and the stress relaxation layer 7. The fixation member 8 is not particularly limited, but there can be used, for example, a metal brazing material, a metal bump, or an electrically conductive adhesive.

Then an action of the vibration element 6 will be explained.

In the state in which no angular velocity is applied to the vibration element 6, when the drive signal is applied between the drive signal terminal 673b and the drive ground terminal 674b to thereby generate the electric field between the drive signal electrodes 673a and the drive ground electrode 674a, each of the drive vibrating arms 641, 642, 643, and 644 flexurally vibrates in the direction indicated by the arrow A as shown in FIG. 5A. On this occasion, since the drive vibrating arms 641, 642 and the drive vibrating arms 643, 644 vibrate symmetrically with respect to the base section 61, the detection vibrating arms 621, 622 hardly vibrate.

When the angular velocity ωz is applied to the vibration element 6 in the state of performing the drive vibration described above, the detection vibration shown in FIG. 5B is excited. Specifically, Coriolis force in the arrow B direction acts on the drive vibrating arms 641 through 644, and the connecting arms 631, 632, and thus a new vibration is excited. Further, in accordance with the vibration of the arrow B, the detection vibration in the arrow C direction is excited in the detection vibrating arms 621, 622. Then, the charge generated in the detection vibrating arms 621, 622 due to the vibration is taken out from the detection signal electrodes 671a and the detection ground electrodes 672a as a signal, and is transmitted to the IC 3 from the detection signal terminals 671b and the detection ground terminals 672b. Then, by processing the signal in the IC 3, the angular velocity ωz is obtained.

Stress Relaxation Layer

As shown in FIG. 6, the stress relaxation layer 7 is located between the IC 3 and the vibration element 6, and is disposed on the upper surface of the IC 3. By disposing the stress relaxation layer 7, an impact received by the package 2 is relaxed, and it becomes difficult for the impact to be transmitted to the vibration element 6. Further, the stress caused by the difference in thermal expansion between the IC 3 and the vibration element 6 is relaxed, and it becomes difficult for the vibration element 6 to bend. Therefore, the mechanical strength of the electronic device 1 can be increased, and at the same time, the angular velocity ωz can more accurately be detected.

Such a stress relaxation layer 7 has a first insulating layer 71 stacked on the upper surface (on a passivation film 38) of the IC 3, a first wiring pattern layer disposed on the first insulating layer 71, a second insulating layer 73 disposed on the first insulating layer 71 and the first wiring pattern layer 72, and a second wiring pattern layer 74 disposed on the second insulating layer 73.

Further, the first insulating layer 71 and the second insulating layer 73 each have elasticity. Therefore, the relaxation of the impact described above can be achieved. The constituent material of such first insulating layer 71 and second insulating layer 73 is not particularly limited, but there can be used a resin material such as polyimide, silicone-modified polyimide resin, epoxy resin, silicone-modified epoxy resin, acrylic resin, phenol resin, silicone resin, modified polyimide resin, benzocyclobutene, or polybenzooxazole. Thus, it is possible to form the first insulating layer 71 and the second insulating layer 73 each having sufficient elasticity, and thus, the advantages described above can more surely be exerted.

Further, as shown in FIG. 7, the second wiring pattern layer 74 has six terminals (connection pads) 741 disposed so as to be opposed to the respective terminals (connection electrodes) 671b through 674b disposed on the support sections 651, 652 of the vibration element 6. Further, the vibration element 6 is fixed to the terminals 741 via the fixation members 8. Meanwhile, as shown in FIG. 8, the first wiring pattern layer 72 has wiring sections 721 for electrically connecting the terminals 741 of the second wiring pattern layer 74 and the connection terminals 37 of the IC 3, respectively. Thus, the IC 3 and the vibration element 6 are electrically connected to each other via the fixation members 8 and the stress relaxation layer 7, and it is possible to transmit and receive the signals between the IC 3 and the vibration element 6. As described above, the first wiring pattern layer 72 and the second wiring pattern layer 74 function as a wiring (relocation wiring) for electrically connecting the IC 3 and the vibration element 6 to each other. Therefore, for example, the connection terminals 37 of the IC 3 can freely be disposed without taking the positions of the terminals 671b through 674b of the vibration element 6 into consideration. Therefore, the flexibility in design of the electronic device 1 is enhanced.

Further, the second wiring pattern layer 74 has a shield wiring pattern (first shield wiring pattern) 742 besides the terminals 741. The shield wiring pattern 742 is disposed so as to spread on the second insulating layer 73 as long as the arrangement of the terminals 741 is not hindered. Further, the shield wiring pattern 742 is electrically connected to a constant potential, in particular, to the ground in the present embodiment. Here, the constant potential denotes a ground potential or a potential fixed to a certain potential. Such a shield wiring pattern 742 is located between the vibration element 6 and the wiring sections 721, and functions as a shield layer for reducing the capacitive coupling (the capacitance between the electrodes provided to the vibration element 6 and the wiring sections 721) between the electrodes provided to the vibration element 6 and the wiring sections 721. Therefore, by disposing the shield wiring pattern 742, the S/N ratio is improved, and the electronic device 1 capable of more accurately detecting the angular velocity is obtained. Further, even in the case in which the noise has temperature dependency, since the noise itself can be reduced, the electronic device 1 superior in temperature characteristics is obtained.

In the more specific explanation, as shown in FIG. 9A, there is disposed the shield wiring pattern 742 between the detection signal electrodes 671a provided to the vibration element 6 and a wiring section (a first wiring pattern) 721a provided to the first wiring pattern layer 72 and electrically connected to the drive signal terminal 673b. Therefore, mixture of noise from the wiring section 721a into the detection signal electrodes 671a is reduced, and thus, a more accurate detection signal can be transmitted to the IC 3.

Similarly, as shown in FIG. 9B, there is disposed the shield wiring pattern 742 between the drive signal electrodes 673a provided to the vibration element 6 and wiring sections (the first wiring pattern) 721b provided to the first wiring pattern layer 72 and electrically connected to the detection signal terminals 671b. Therefore, mixture of noise from the drive signal electrodes 673a into the wiring sections 721b is reduced, and thus, a more accurate detection signal can be transmitted to the IC 3. By disposing the shield wiring pattern 742 in such a manner as described above, the electronic device 1 capable of more accurately detecting the angular velocity is obtained.

Here, the method of connecting the shield wiring pattern 742 to the ground is not particularly limited. For example, it is also possible for the shield wiring pattern 742 to be electrically connected to the ground wiring included in the IC 3. According to this method, since the wiring originally provided to the IC 3 can be used, there is obtained an advantage that a complication (an increase in size) of the device is not involved.

Further, as another method, it is also possible to dispose a dedicated wiring, which connects the shield wiring pattern 742 to the ground, on the upper surface (a fourth wiring pattern layer 328) of the IC 3, electrically connect the shield wiring pattern 742 to the dedicated wiring, and electrically connect the dedicated wiring and the internal terminal 241 for grounding to each other with a bonding wire BW. According to such a method as described above, since the shield wiring pattern 742 can be connected to the ground without the intervention of the internal wiring of the IC 3, the impedance of the wiring line between the shield wiring pattern 742 and the ground can be reduced. Therefore, the shield effect of the shield wiring pattern 742 can further be enhanced. It should be noted that in this method, it is also possible to share the internal terminal 241 for grounding with the IC 3, or to separately dispose the internal terminal 241 for the IC 3 and the internal terminal 241 for the shield wiring pattern 742, but it is preferable to share the internal terminal 241. Thus, it is possible to prevent an increase in the number of components to thereby prevent an increase in size and degradation in reliability of the device.

Further, as another method, it is also possible to directly connect the shield wiring pattern 742 to the internal terminal 241 for grounding disposed on the package 2 with a bonding wire or the like without the intervention of a wiring disposed in the IC 3 or a wiring disposed on the IC 3. Thus, the configuration of the device becomes simpler. Further, it is possible to further decrease the impedance of the wiring line between the shield wiring pattern 742 and the ground.

Second Embodiment

Figure 10:
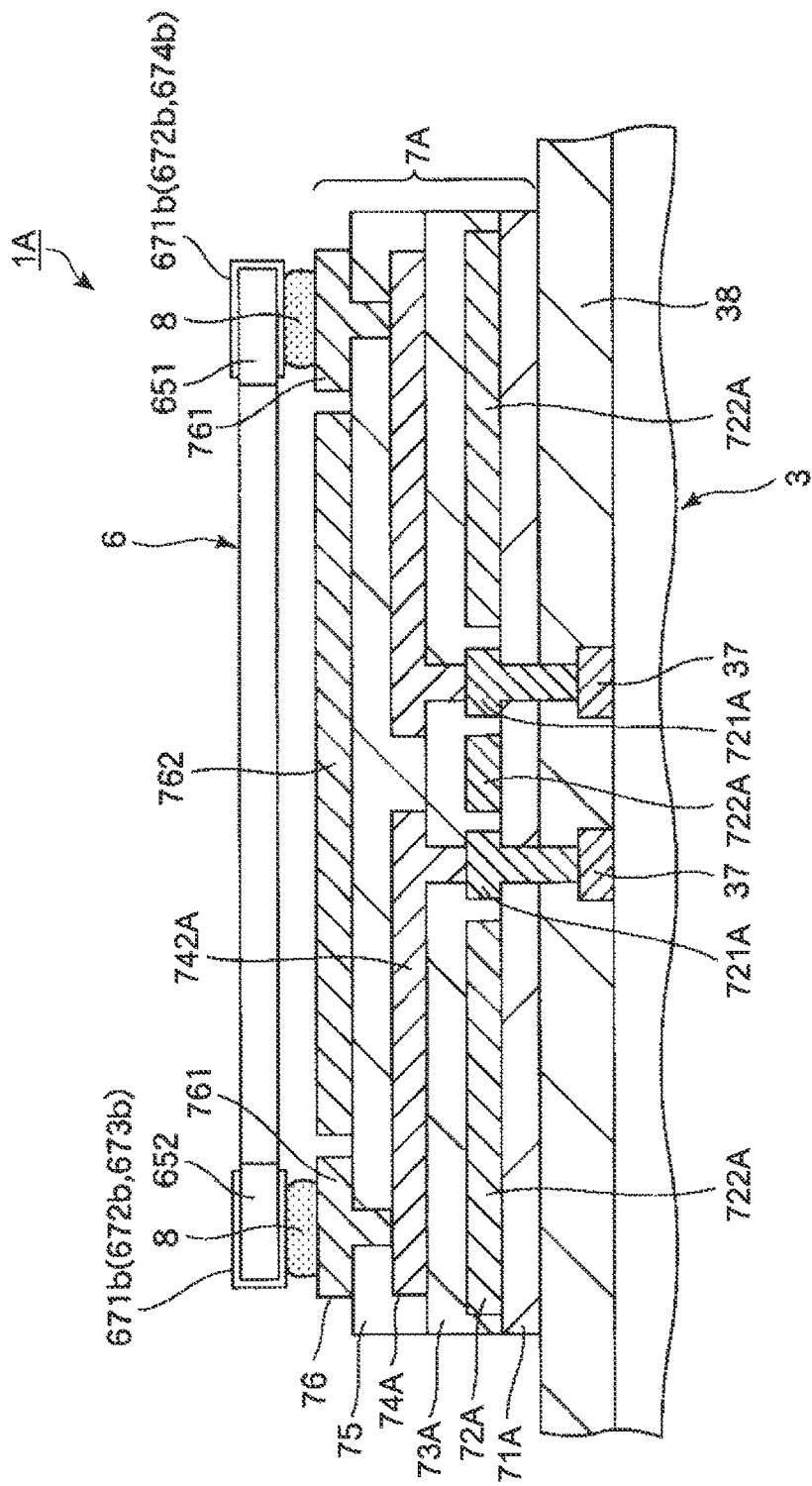
FIG. 10 is a cross-sectional view of a stress relaxation layer provided to the electronic device according to a second embodiment of the invention.
Figure 11:
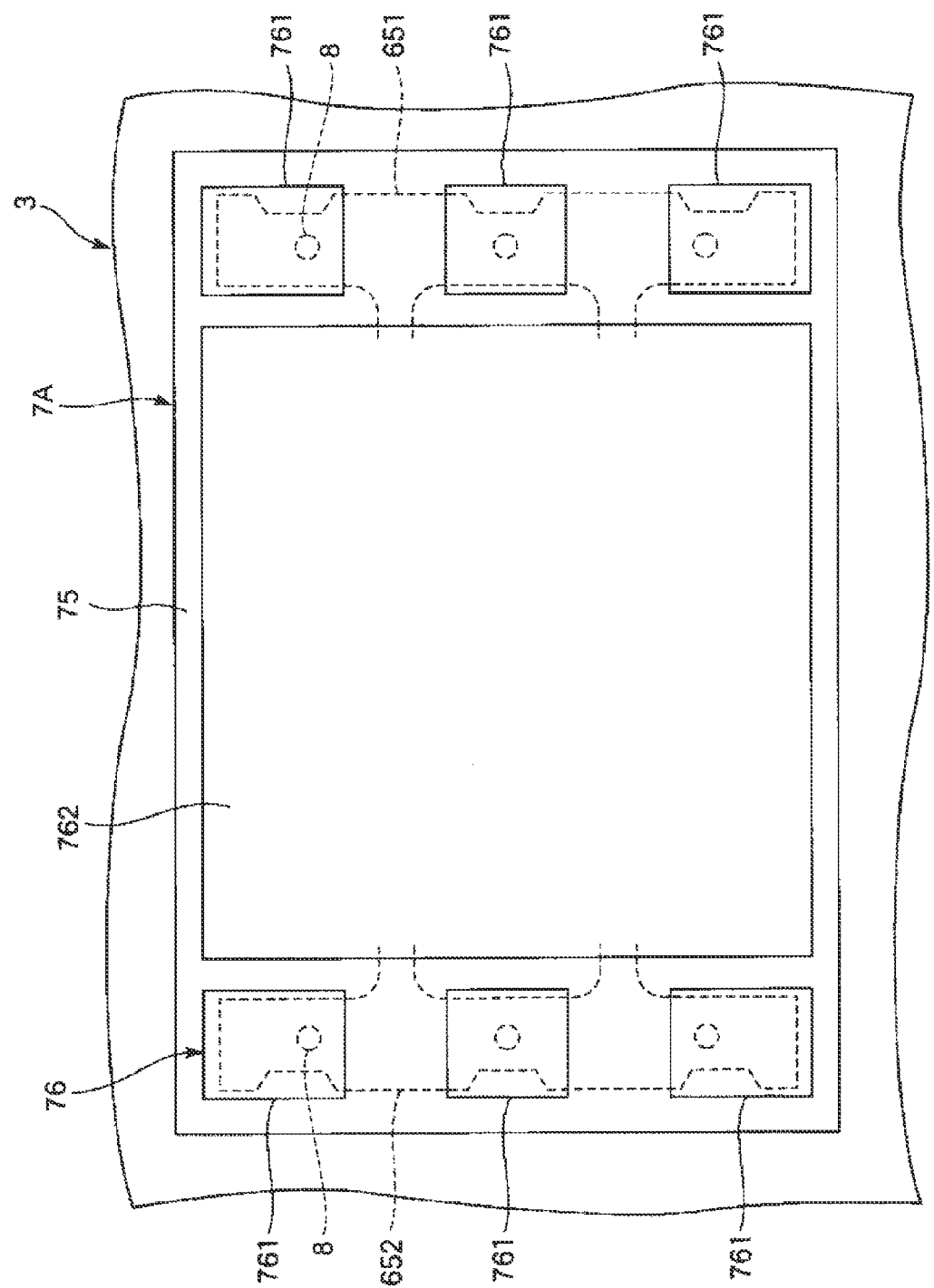
FIG. 11 is a plan view of the stress relaxation layer shown in FIG. 10.
Figure 12:
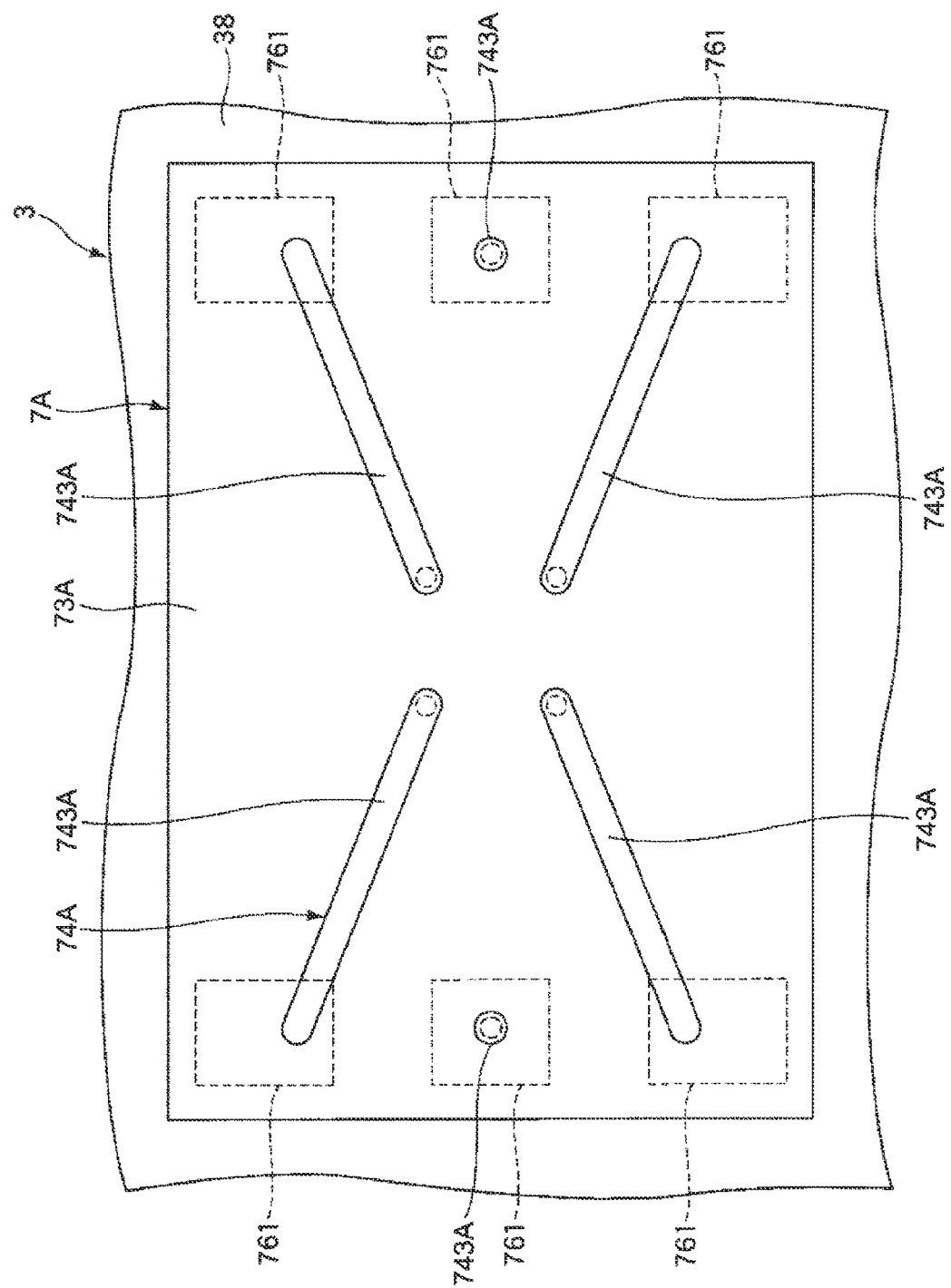
FIG. 12 is a plan view of the stress relaxation layer shown in FIG. 10.
Figure 13:
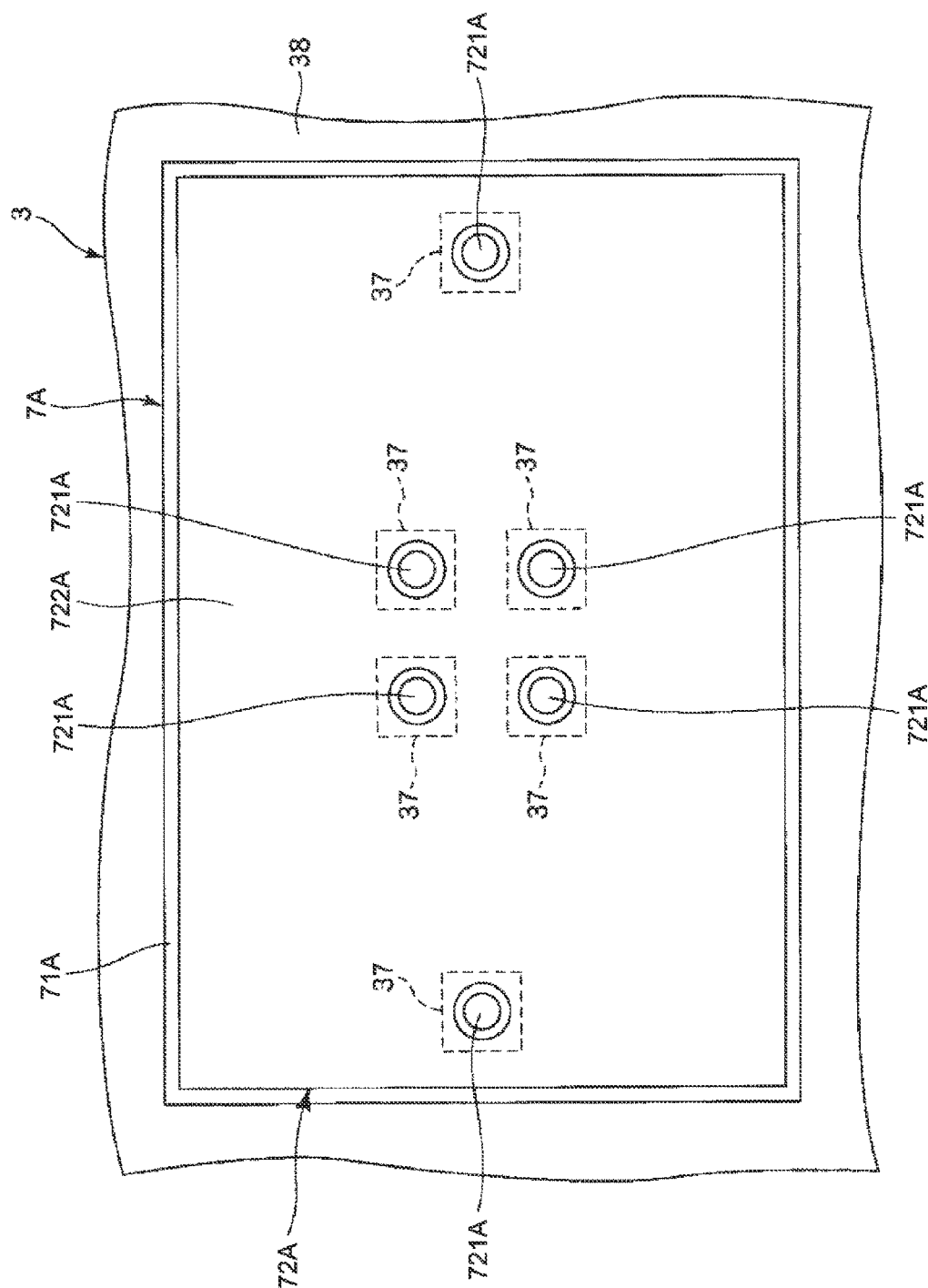
FIG. 13 is a plan view of the stress relaxation layer shown in FIG. 10.
Figure 14A:
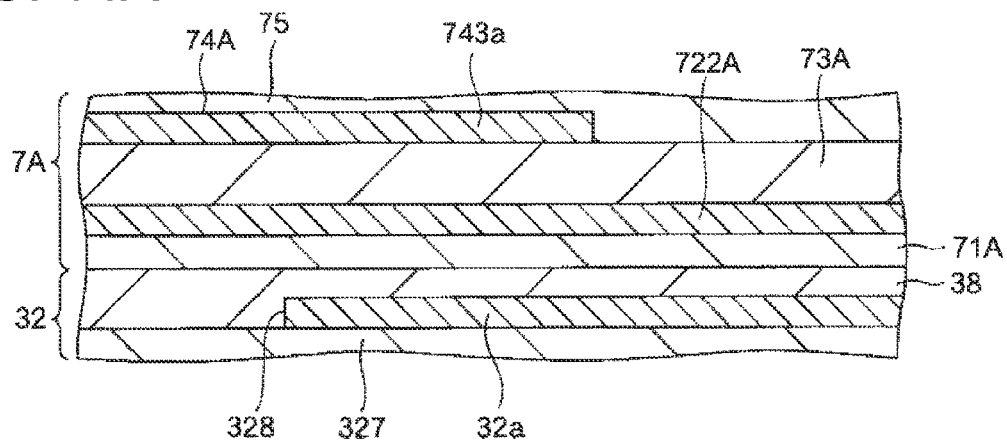
FIGS. 14A and 14B are cross-sectional views for explaining an advantage of the shield wiring pattern.
Figure 14B:
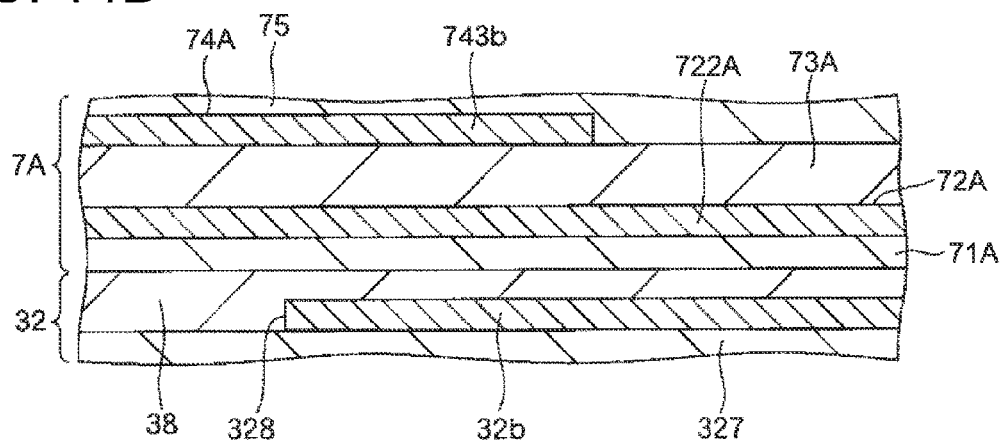

FIG. 10 is a cross-sectional view of a stress relaxation layer provided to an electronic device according to a second embodiment of the invention. FIGS. 11 through 13 are each a plan view of the stress relaxation layer shown in FIG. 10. FIGS. 14A and 14B are cross-sectional view for explaining an advantage of the shield wiring pattern. Hereinafter, the second embodiment will be explained with a focus on the differences from the first embodiment described above, and regarding substantially the same matters, the same reference symbols are provided, and the explanation thereof will be omitted.

The electronic device according to the second embodiment is different in the configuration of the stress relaxation layer from the first embodiment.

As shown in FIG. 10, the stress relaxation layer 7A provided to the electronic device 1A according to the present embodiment includes a first insulating layer 71A stacked on the upper surface (on the passivation film 38) of the IC 3, a first wiring pattern layer 72A disposed on the first insulating layer 71A, a second insulating layer 73A disposed on the first insulating layer 71A and the first wiring pattern layer 72A, a second wiring pattern layer 74A disposed on the second insulating layer 73A, a third insulating layer 75 disposed on the second insulating layer 73A and the second wiring pattern layer 74A, and a third wiring pattern layer 76 disposed on the third insulating layer 75. In the stress relaxation layer 7A having such a configuration as described above, since the number of insulating layers having elasticity is larger than, for example, that in the first embodiment described above, the impact relaxation characteristic is further improved.

Further, as shown in FIGS. 10 and 11, the third wiring pattern layer 76 has six terminals (connection pads) 761 disposed so as to be opposed to the respective terminals (connection electrodes) 671b through 674b disposed on the support sections 651, 652 of the vibration element 6. Further, the vibration element 6 is fixed to the terminals 761 via the fixation members 8. Further, the third wiring pattern layer 76 has a shield wiring pattern (first shield wiring pattern) 762. The shield wiring pattern 762 is disposed so as to spread on the third insulating layer 75 as long as the arrangement of the terminals 761 is not hindered. Further, the shield wiring pattern 762 is electrically connected to a constant potential, in particular, to the ground in the present embodiment. The advantages of the shield wiring pattern 762 are substantially the same as those of the first embodiment described above.

Further, as shown in FIG. 12, the second wiring pattern layer 74A has wiring sections 743A electrically connected to the terminals 761. Further, as shown in FIG. 13, the first wiring pattern layer 72A has wiring sections 721A for electrically connecting the wiring sections 743A of the second wiring pattern layer 74A and the connection terminals 37 of the IC 3, respectively, and a shield wiring pattern (second shield wiring pattern) 722A.

The shield wiring pattern 722A is located between the second wiring pattern layer 74A and the IC 3, and therefore functions as a shield wiring pattern for reducing the capacitive coupling between the second wiring pattern layer 74A and the IC 3. Therefore, by disposing the shield wiring pattern 762, the electronic device 1A capable of more accurately detecting the angular velocity is obtained.

In the more specific explanation, since the shield wiring pattern 722A is disposed between the wiring sections (the first wiring pattern) 743a provided to the second wiring pattern layer 74A and electrically connected respectively to the detection signal terminals 671b and a wiring section (second wiring pattern) 32a provided to the IC 3 (the wiring layer 32) and electrically connected to the drive signal terminal 673b as shown in FIG. 14A, mixture of noise from the wiring section 32a into the wiring sections 743a is reduced, and thus, it is possible to transmit a more accurate detection signal to the IC 3. Similarly, since the shield wiring pattern 722A is disposed between a wiring section 743b provided to the second wiring pattern layer 74A and electrically connected to the drive signal terminal 673b and wiring sections (the second wiring pattern) 32b provided to the IC 3 (the wiring layer 32) and electrically connected respectively to the detection signal terminals 671b, mixture of noise from the wiring section 743b into the wiring sections 32b is reduced, and thus, it is possible to transmit a more accurate detection signal to the IC 3. By disposing the shield wiring pattern 722A in such a manner as described above, the electronic device 1A capable of more accurately detecting the angular velocity is obtained.

According also to such a second embodiment as described above, substantially the same advantages as in the first embodiment described above can be obtained.

Third Embodiment

Figure 15:
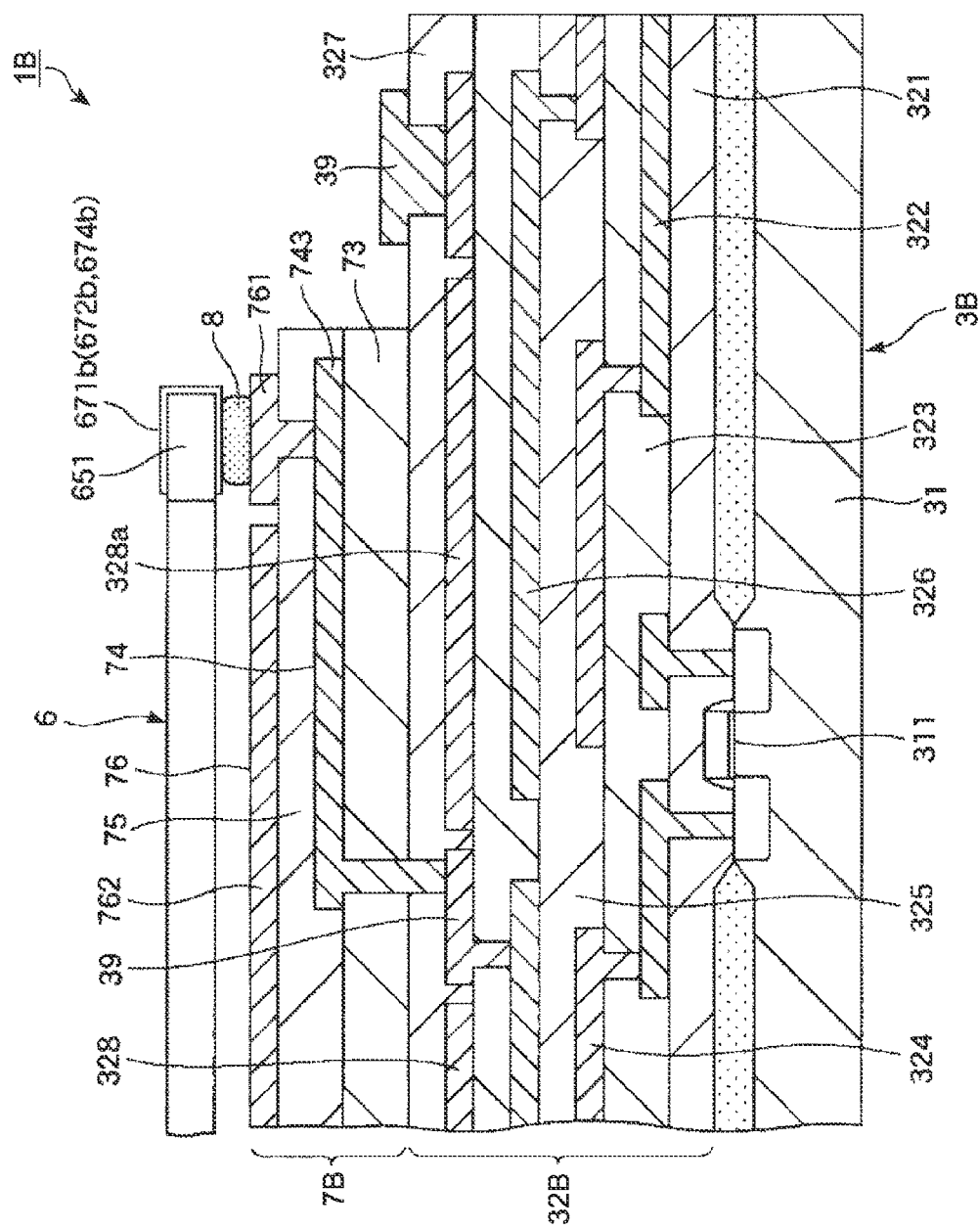
FIG. 15 is a cross-sectional view of an IC provided to an electronic device according to a third embodiment of the invention.

FIG. 15 is a cross-sectional view of an IC provided to an electronic device according to a third embodiment of the invention. Hereinafter, the third embodiment will be explained with a focus on the differences from the second embodiment described above, and regarding substantially the same matters, the same reference symbols are provided, and the explanation thereof will be omitted.

The electronic device according to the third embodiment is different from the second embodiment in the configuration of the IC and the stress relaxation layer.

As shown in FIG. 15, in the electronic device 1B according to the present embodiment, a shield wiring pattern (second shield wiring pattern) 328a is disposed in the IC 3B. Specifically, the shield wiring pattern 328a is disposed as apart of a fourth wiring pattern layer 328 provided to a wiring layer 32B of the IC 3B. By disposing the shield wiring pattern 328a in the IC 3B as described above, it is possible to exert substantially the same advantages as in the second embodiment described above, and at the same time, the following advantages can further be exerted.

That is, by disposing the shield wiring pattern 328a in the IC 3B, in the stress relaxation layer 7B, the first insulating layer 71 and the first wiring pattern layer 72 for disposing the second shield wiring pattern can be omitted. Therefore, the stress relaxation layer 7B can be made thinner, and it is possible to achieve height reduction of the electronic device 1B.

According also to such a third embodiment as described above, substantially the same advantages as in the first embodiment described above can be obtained.

Fourth Embodiment

Figure 16:
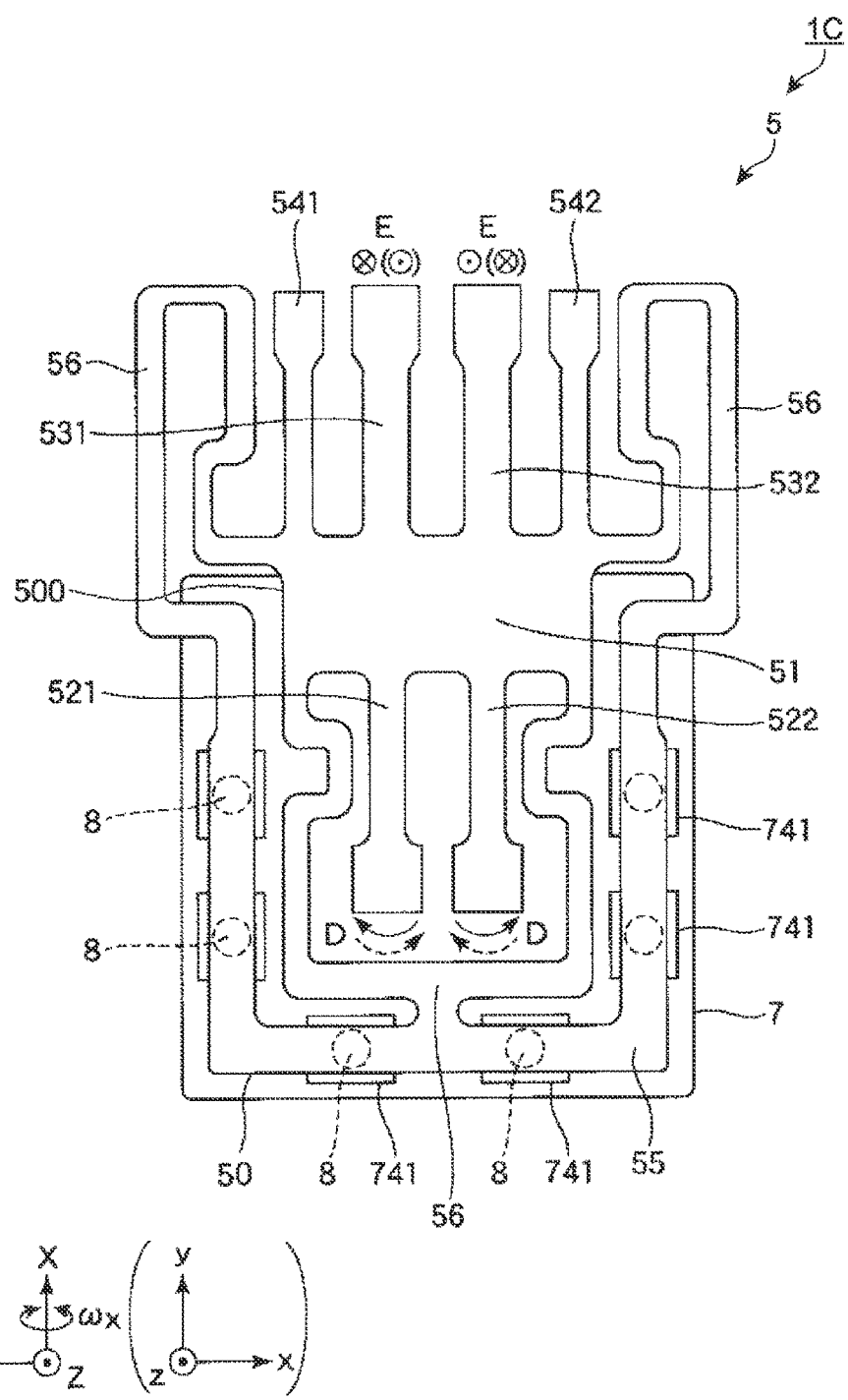
FIG. 16 is a plan view of a vibration element provided to an electronic device according to a fourth embodiment of the invention.

FIG. 16 is a plan view of a vibration element provided to an electronic device according to a fourth embodiment of the invention. Hereinafter, the fourth embodiment will be explained with a focus on the differences from the first embodiment described above, and regarding substantially the same matters, the same reference symbols are provided, and the explanation thereof will be omitted.

The electronic device according to the fourth embodiment is different in the configuration of the vibration element from the first embodiment.

The vibration element 5 provided to the electronic device 1C according to the present embodiment is a so-called "H-type" gyro element, and is capable of detecting the angular velocity ωx around the X axis. As shown in FIG. 16, such a vibration element 5 has a vibrating element 50 made of quartz crystal, and electrodes disposed on the vibrating element 50. It should be noted that the material of the vibrating element 50 is not limited to quartz crystal, but it is also possible to use a piezoelectric material such as lithium tantalate or lithium niobate.

The vibrating element 50 has a plate-like shape having a spread in an x-y plane defined by an x axis (an electric axis) and a y axis (a mechanical axis) as the crystal axes of the quartz crystal and a thickness in a z-axis (an optical axis) direction. Further, the vibrating element 50 has a base section 51, a pair of drive vibrating arms 521, 522 extending from the base section 51 toward the −y-axis side in parallel to each other, a pair of detection vibrating arms 531, 532 extending from the base section 51 toward the +y-axis side in parallel to each other, a pair of adjustment vibrating arms 541, 542 extending from the base section 51 toward the +y-axis side and located on both sides of the detection vibrating arms 531, 532, a support section 55 for supporting the base section 51, and connecting sections 56 for connecting the base section 51 and the support section 55 to each other. It should be noted that in such a vibrating element 50, the base section 51, the drive vibrating arms 521, 522, the detection vibrating arms 531, 532, and the adjustment vibrating arms 541, 542 constitute a vibration body 500.

Such a vibration element 5 is fixed to the stress relaxation layer 7 in the support section 55. Further, fixation of the vibration element 5 to the stress relaxation layer 7 is achieved using fixation members 8, and the vibration element 5 and the IC 3 are electrically connected to each other via the fixation members 8 and the stress relaxation layer 7.

The drive vibrating arms 521, 522 are provided with drive signal electrodes not shown, and by applying an oscillation drive signal (an alternating voltage) from the IC 3 to the drive signal electrodes, a drive mode indicated by the arrows D is excited. Then, when the angular velocity ωx around the X axis is applied while the drive vibrating arms 521, 522 are vibrating in the drive mode, a detection mode indicated by the arrows E is excited, and thus, the detection vibrating arms 531, 532 vibrate. The detection vibrating arms 531, 532 are provided with detection signal electrodes not shown, and a detection signal (the charge) generated by the vibration of the detection vibrating arms 531, 532 is taken out through the detection signal electrodes. Then, the IC 3 detects the angular velocity ωx based on the detection signal thus taken out.

According also to such a fourth embodiment as described above, substantially the same advantages as in the first embodiment described above can be exerted.

Fifth Embodiment

Figure 17:
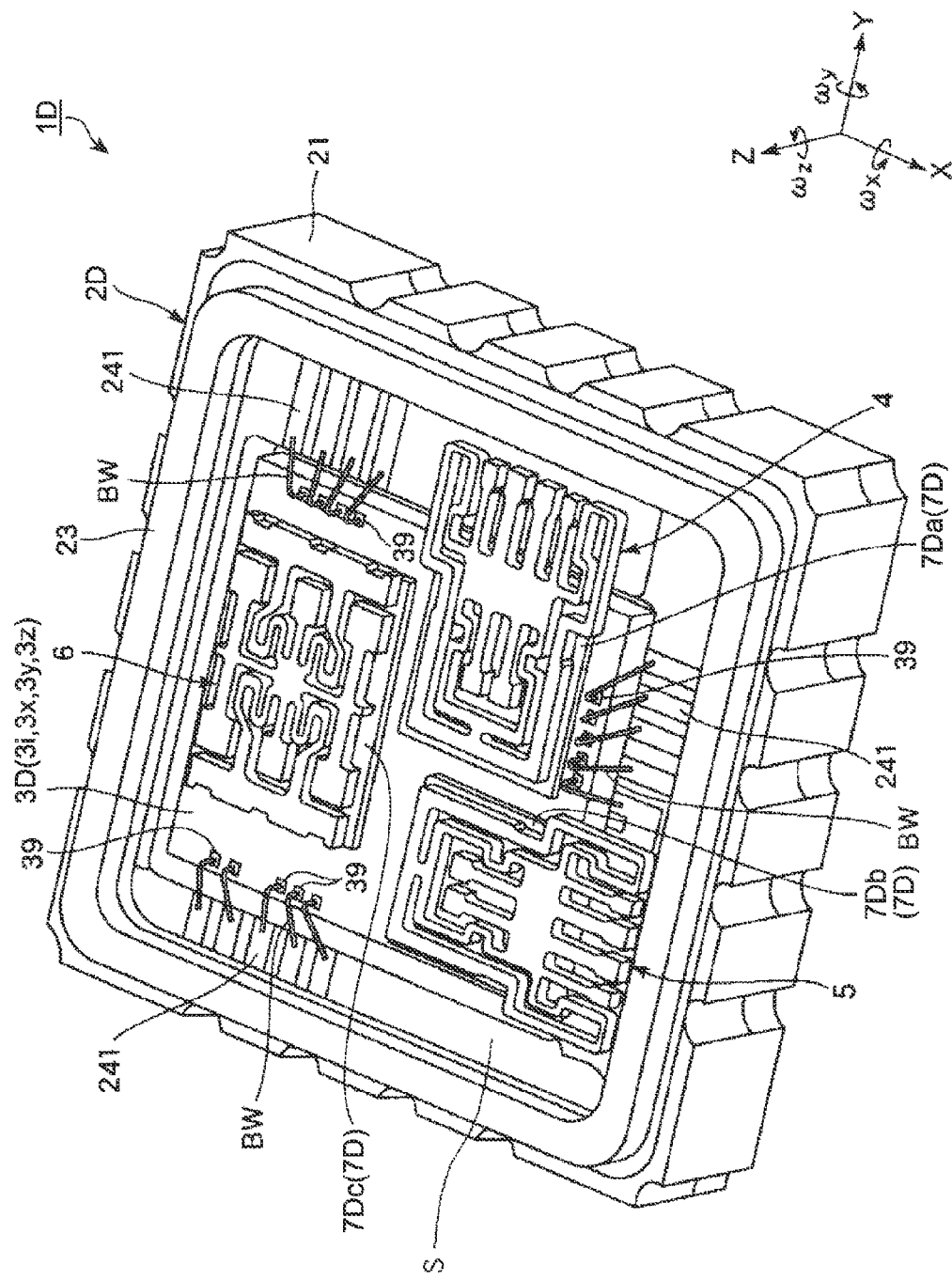
FIG. 17 is a perspective view showing an electronic device according to a fifth embodiment of the invention.
Figure 18:
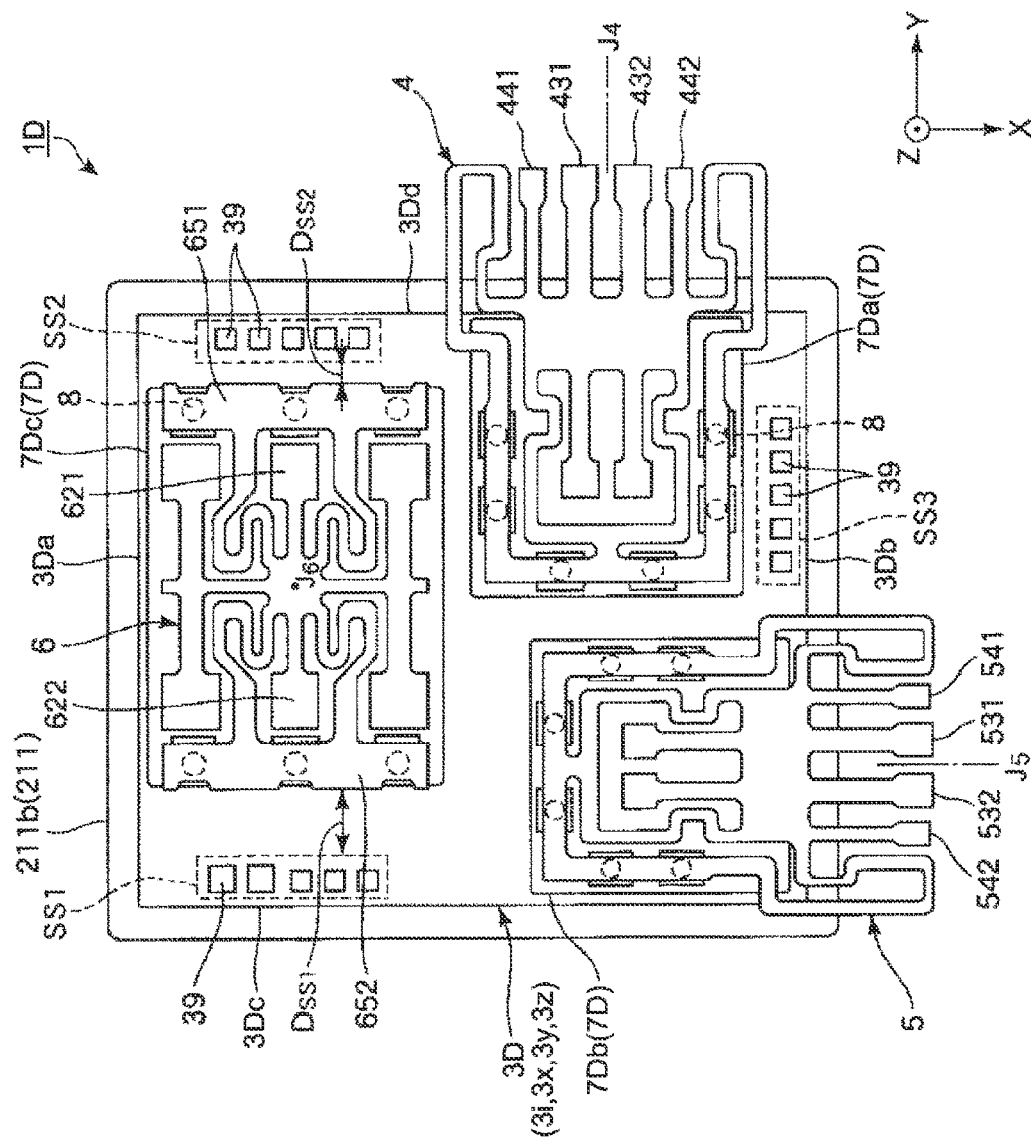
FIG. 18 is a plan view of the electronic device shown in FIG. 17.
Figure 19:
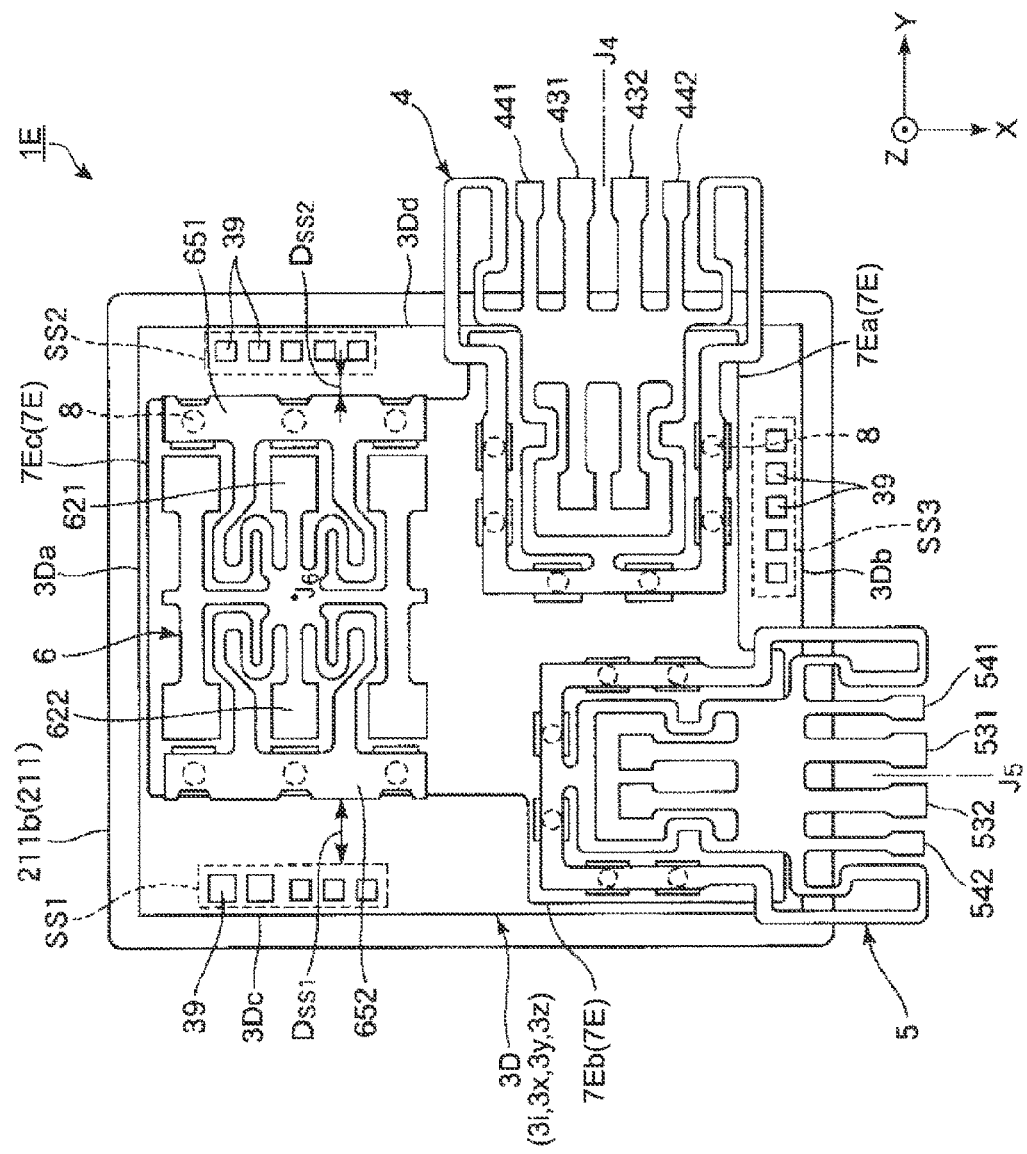
FIG. 19 is a plan view showing a modified example of the electronic device shown in FIG. 17.

FIG. 17 is a perspective view showing an electronic device according to a fifth embodiment of the invention. FIG. 18 is a plan view of the electronic device shown in FIG. 17. FIG. 19 is a plan view showing a modified example of the electronic device shown in FIG. 17. Hereinafter, the fifth embodiment will be explained with a focus on the differences from the first embodiment described above, and regarding substantially the same matters, the same reference symbols are provided, and the explanation thereof will be omitted.

The electronic device according to the fifth embodiment is different from the first embodiment in the configuration provided with a plurality of vibration elements.

The electronic device 1D according to the present embodiment is a triaxial angular velocity sensor, and is capable of detecting the angular velocity ωx around the X axis, the angular velocity ωy around the Y axis, and the angular velocity ωz around the Z axis independently of each other. As shown in FIG. 17, such an electronic device 1D has a package 2D provided with a housing space S formed inside, an IC 3D housed in the package 2D, and three vibration elements 4, 5, and 6 disposed on the IC 3D via a stress relaxation layer 7D. It should be noted that the vibration elements 5, 6 each have substantially the same configuration as explained in the above description of the embodiments, and the vibration element 4 has substantially the same configuration as that of the vibration element 5 except the point that vibration element is disposed in a different orientation.

IC

The IC 3D has a roughly rectangular planar shape, and the outer shape in the planar view includes a pair of outer edges 3Da, 3Db disposed so as to extend in the Y-axis direction, and a pair of outer edges 3Dc, 3Dd disposed so as to extend in the X-axis direction as shown in FIG. 18.

The IC 3D includes, for example, an interface section 3i for communicating with an external host device, a drive/detection circuit 3y for driving the vibration element 4 to detect the angular velocity ωy applied to the vibration element 4, a drive/detection circuit 3x for driving the vibration element 5 to detect the angular velocity ωx applied to the vibration element 5, and a drive/detection circuit 3z for driving the vibration element 6 to detect the angular velocity ωz applied to the vibration element 6.

Here, as shown in FIG. 18, a plurality of connection terminals 39 is disposed separately in three areas, namely a first terminal arrangement area SS1, a second terminal arrangement area SS2, and a third terminal arrangement area SS3, set on the upper surface of the IC 3D. The first terminal arrangement area SS1 is disposed along the outer edge 3Dc so as to be shifted toward the outer edge 3Da, the second terminal arrangement area SS2 is disposed along the outer edge 3Dd so as to be shifted toward the outer edge 3Da, and the third terminal arrangement area SS3 is disposed along the outer edge 3Db so as to be shifted toward the outer edge 3Dd.

In the first terminal arrangement area SS1, there are disposed digital signal terminals in a lump such as a digital signal terminal for a slave selection signal SS for selecting a communication method, a digital signal terminal for a data input signal MOSI, a digital signal terminal for a clock signal SCLK, and a digital signal terminal for a data output signal MISO. Further, in the second terminal arrangement area SS2 and the third terminal arrangement area SS3, there are disposed analog signal terminals in a lump such as a ground terminal for the ground GND, a power supply signal terminal for the power supply VDDI of the interface section 3i, a power supply signal terminal for the power supply VDD of the drive/detection circuits 3x, 3y, and 3z, and a test signal terminal for testing.

By disposing the digital signal terminals and the analog signal terminals separately in the respective areas different from each other as described above, mixture of digital signals into the analog signal terminals (wiring) can be reduced. Therefore, the electronic device 1D capable of reducing the noise, and thus capable of performing more accurate drive is obtained. In particular, in the present embodiment, since there is adopted an arrangement of disposing the first terminal arrangement area SS1 distant from the second terminal arrangement area SS2 and the third terminal arrangement area SS3 as much as possible, the advantages described above can more effectively be exerted.

Arrangement of Vibration Elements

As shown in FIG. 18, the vibration element 4 is arranged so that a detection axis J4 coincides with the Y axis. Thus, the vibration element 4 can detect the angular velocity ωy. Further, the vibration element 4 is disposed on the upper surface of the IC 3D at a position shifted toward the outer edge 3Db and the outer edge 3Dd. Further, on the +X-axis side of the vibration element 4 (between the vibration element 4 and the outer edge 3Db), there is located the third terminal arrangement area SS3, and on the −X-axis side of the vibration element 4 (between the vibration element 4 and the outer edge 3Da), there is located the second terminal arrangement area SS2. Further, the vibration element 4 is disposed so that the detection vibrating arms 431, 432 and the adjustment vibrating arms 441, 442 protrude from the outer edge 3Dd of the IC 3D toward the +Y side in a planar view. In other words, the vibration element 4 is disposed so that the detection vibrating arms 431, 432 and the adjustment vibrating arms 441, 442 do not overlap the IC 3D in the planar view.

Then an arrangement of the vibration element 5 will be explained. As shown in FIG. 18, the vibration element 5 is arranged so that a detection axis J5 coincides with the X axis. Thus, the vibration element 5 can detect the angular velocity ωx. Further, the vibration element 5 is disposed on the upper surface of the IC 3D at a position shifted toward the outer edge 3Db and the outer edge 3Dc. Therefore, the vibration element 5 is located on the −Y-axis side with respect to the vibration element 4 (between the vibration element 4 and the outer edge 3Dc). Further, on the −X-axis side of the vibration element 5 (between the vibration element 5 and the outer edge 3Da), there is located the first terminal arrangement area SS1. Further, the vibration element 5 is disposed so that the detection vibrating arms 531, 532 and the adjustment vibrating arms 541, 542 protrude from the outer edge 3Db of the IC 3D toward the +X side in the planar view.

Then an arrangement of the vibration element 6 will be explained. As shown in FIG. 18, the vibration element 6 is arranged so that a detection axis J6 coincides with the Z axis. Thus, the vibration element 6 can detect the angular velocity ωz. Further, the vibration element 6 is disposed on the upper surface of the IC 3D at a position shifted toward the outer edge 3Da. Therefore, the vibration element 6 is located on the −X-axis side with respect to the vibration elements 4, 5 (between the vibration elements 4, 5 and the outer edge 3Da). Further, on the −Y-axis side of the vibration element 6 (between the vibration element 6 and the outer edge 3Dc), there is located the first terminal arrangement area SS1, and on the +Y-axis side (between the vibration element 6 and the outer edge 3Dd), there is located the second terminal arrangement area SS2.

Further, the vibration element 6 is disposed so as to be shifted toward the second terminal arrangement area SS2 rather than the first terminal arrangement area SS1. In other words, the vibration element 6 is disposed so that the distance DSS2 from the second terminal arrangement area SS2 is shorter than the distance DSS1 from the first terminal arrangement area SS1. Thus, it is possible to make the vibration element 6 distant from the first terminal arrangement area SS1 as much as possible, and thus, the mixture of the digital signal into the vibration element 6 is reduced. Therefore, the electronic device 1D capable of reducing the mixture of noise into the drive signal or the detection signal, and thus capable of performing more accurate drive is obtained.

Further, the vibration element 6 is disposed so that the direction, in which the support sections 651, 652 are arranged, coincides with the Y-axis direction. Since the length of the vibration element 6 in the direction, in which the support sections 651, 652 are arranged, is larger than the length thereof in the direction (the direction in which the connecting arms 631, 632 extend) perpendicular to the direction, in which the support sections 651, 652 are arranged, by disposing the vibration element 6 as described above, it is possible to make effective use of the space on the upper surface of the IC 3D. Therefore, for example, the distance between the outer edges 3Da, 3Db can be made shorter, and miniaturization of the IC 3D can be achieved.

By disposing the vibration elements 4, 5 in an area located on the upper surface of the IC 3D and on the outer edge 3Db side so as to be arranged side by side in the Y-axis direction, and further disposing the vibration element 6 in an area located on the upper surface of the IC 3D and on the outer edge 3Da side as described above, it is possible to dispose these three vibration elements 4, 5, and 6 in a relatively small space. Therefore, miniaturization of the IC 3D can be achieved, and accordingly, miniaturization of the electronic device 1D can be achieved.

Stress Relaxation Layer

The stress relaxation layer 7D has a first stress relaxation layer 7Da disposed between the IC 3D and the vibration element 4, and having the vibration element 4 disposed on the upper surface thereof, a second stress relaxation layer 7Db disposed between the IC 3D and the vibration element 5, and having the vibration element 5 disposed on the upper surface thereof, and a third stress relaxation layer 7Dc disposed between the IC 3D and the vibration element 6, and having the vibration element 6 disposed on the upper surface thereof. By dividing the stress relaxation layer 7D into the parts corresponding respectively to the vibration elements 4, 5, and 6 in such a manner as described above, it becomes difficult for the vibrations of the vibration elements 4, 5, and 6 from propagating to each other. Therefore, it is possible for each of the vibration elements 4, 5, and 6 to more accurately detect the angular velocity. It should be noted that although the configuration of each of the first stress relaxation layer 7Da, the second stress relaxation layer 7Db, and the third stress relaxation layer 7Dc is substantially the same as the configuration of the stress relaxation layer 7 described in the description of the first embodiment, and therefore the explanation thereof will be omitted, it is also possible to use the configuration of the stress relaxation layer 7A described in the description of the second embodiment.

According also to such a fifth embodiment as described above, substantially the same advantages as in the first embodiment described above can be obtained.

Modified Example

Although in the fifth embodiment described above, the stress relaxation layer 7D is divided into the first stress relaxation layer 7Da, the second stress relaxation layer 7Db, and the third stress relaxation layer 7Dc, it is also possible to adopt an electronic device 1E provided with a stress relaxation layer 7E obtained by integrally forming a first stress relaxation layer 7Ea, a second stress relaxation layer 7Eb, and the third stress relaxation layer 7Ec with each other as shown in FIG. 19, for example. In other words, it is also possible to dispose three vibration elements 4, 5, and 6 on the single stress relaxation layer 7E. Thus, since no gaps exist between the first stress relaxation layer 7Ea, the second stress relaxation layer 7Eb, and the third stress relaxation layer 7Ec, mixture of the noise through the gaps is prevented, and thus, the shield effect can be improved.

Sixth Embodiment

Figure 21:
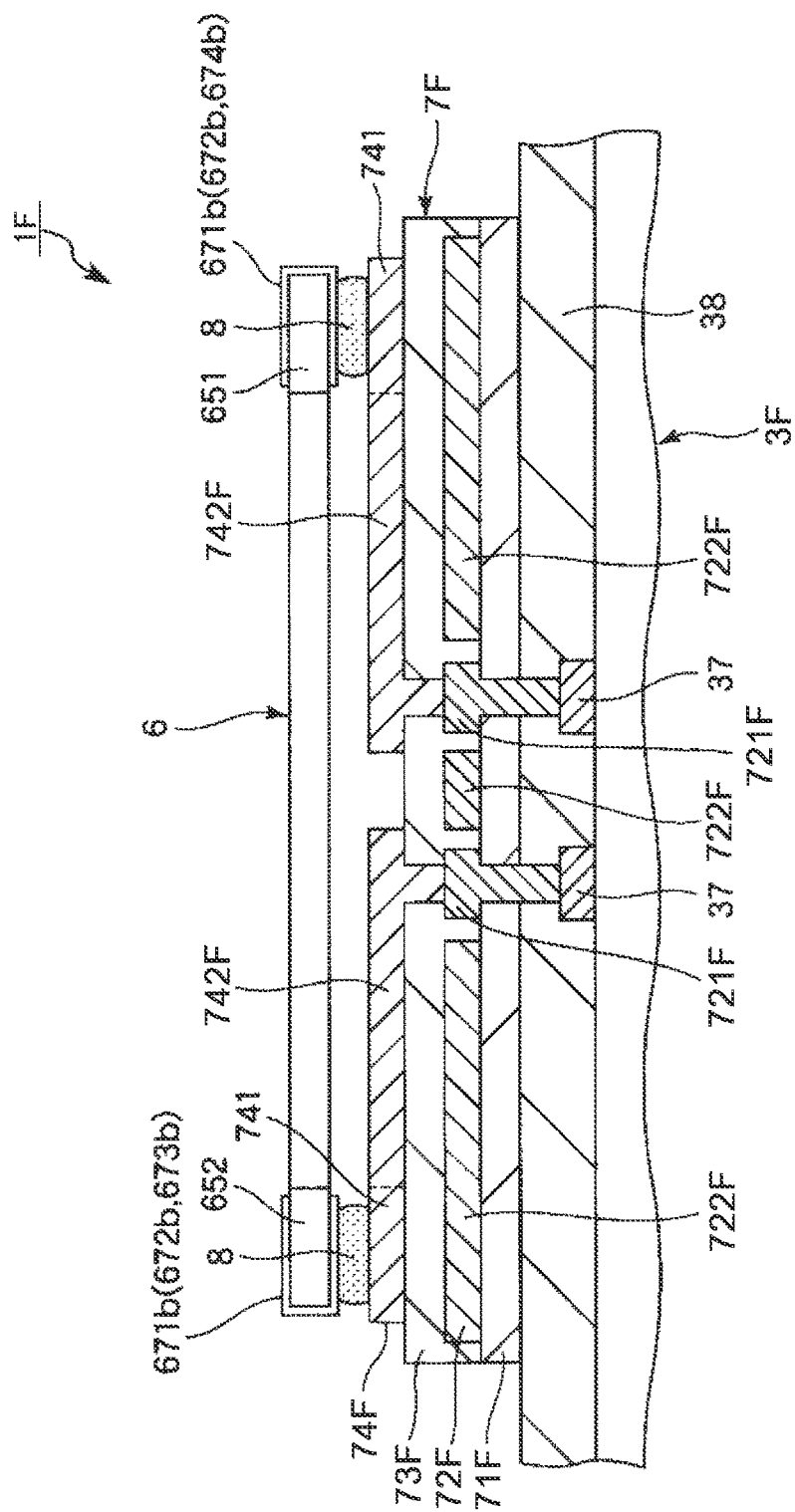
FIG. 21 is a cross-sectional view of a stress relaxation layer provided to the electronic device shown in FIG. 20.
Figure 22:
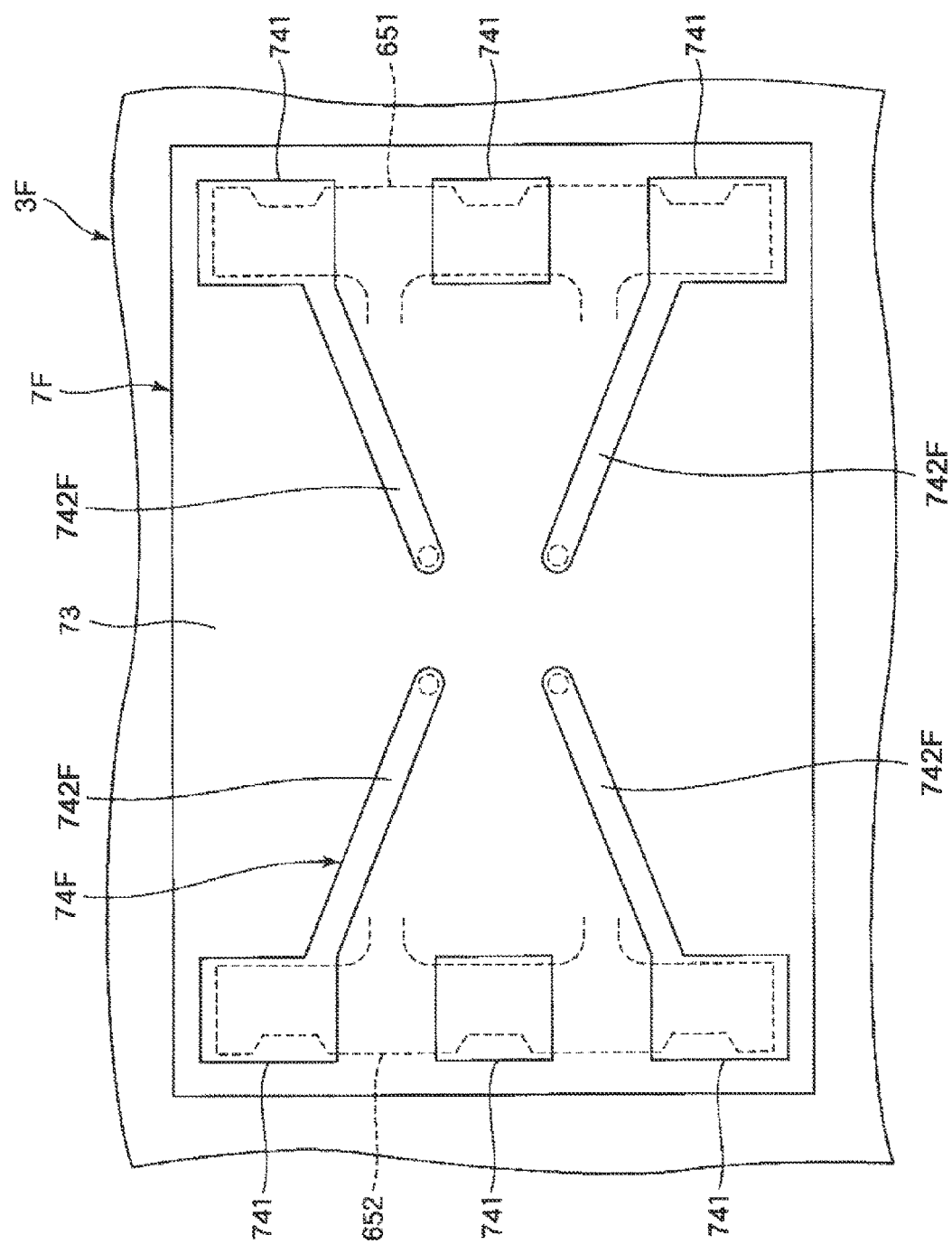
FIG. 22 is a plan view of the stress relaxation layer shown in FIG. 21.
Figure 24A:
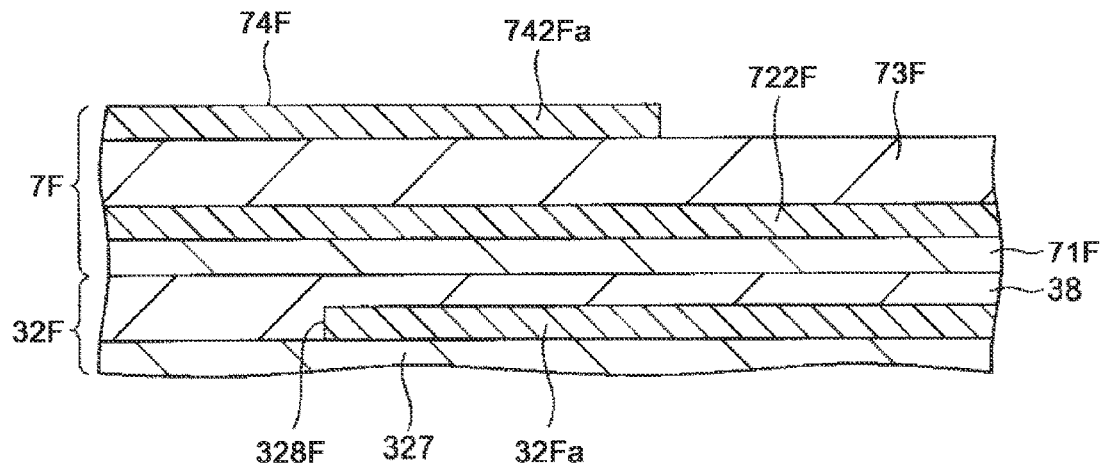
FIGS. 24A and 24B are cross-sectional views showing a shield wiring pattern.
Figure 24B:
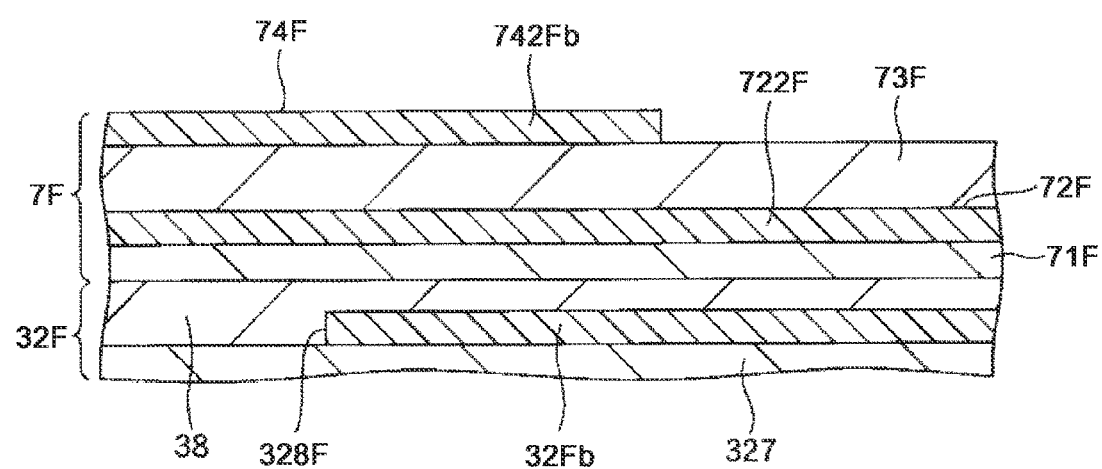

FIG. 20 is a cross-sectional view showing an electronic device according to a sixth embodiment of the invention. FIG. 21 is a cross-sectional view of a stress relaxation layer provided to the electronic device shown in FIG. 20. FIGS. 22 and 23 are each a plan view of the stress relaxation layer shown in FIG. 21. FIGS. 24A and 24B are cross-sectional views showing a shield wiring pattern. It should be noted that the upper side of FIG. 20 is also referred to as an "upper side" and the lower side thereof is also referred to as a "lower side" in the following descriptions for the sake of convenience of explanation. Further, as shown in FIG. 20, it is assumed that three axes perpendicular to each other are defined as an X axis, a Y axis, and a Z axis, and the thickness direction of the electronic device coincides with the Z axis.

The sixth embodiment will be explained with a focus on the differences from the first embodiment described above, and regarding substantially the same matters, the same reference symbols are provided, and the explanation thereof will be omitted.

The electronic device according to the sixth embodiment is different in the IC and the stress relaxation layer from the first embodiment.

The electronic device 1 shown in FIG. 20 is an angular velocity sensor capable of detecting the angular velocity ωz around the Z axis. Such an electronic device 1 includes a package 2 having a housing space S inside, an IC 3F housed in the housing space S, a stress relaxation layer 7F disposed on the IC 3F, and a vibration element 6 disposed on the stress relaxation layer 7F.

IC

In the IC 3F, wiring sections (first wiring pattern) 32Fa, 32Fb electrically connected to the drive signal terminal 673b of the vibrating element 6 are disposed in a fourth wiring pattern layer 328F of the wiring layer 32F.

Stress Relaxation Layer

As shown in FIG. 21, the stress relaxation layer 7F is located between the IC 3F and the vibration element 6, and is disposed on the upper surface of the IC 3F. By disposing the stress relaxation layer 7F, an impact received by the package 2 is relaxed, and it becomes difficult for the impact to be transmitted to the vibration element 6. Further, the stress caused by the difference in thermal expansion between the IC 3F and the vibration element 6 is relaxed, and it becomes difficult for the vibration element 6 to bend. Therefore, the mechanical strength of the electronic device 1F can be increased, and at the same time, the angular velocity ωz can more accurately be detected.

Such a stress relaxation layer 7F has a first insulating layer 71F stacked on the upper surface (on the passivation film 38) of the IC 3F, a first wiring pattern layer 72F disposed on the first insulating layer 71F, a second insulating layer 73F disposed on the first insulating layer 71F and the first wiring pattern layer 72F, and a second wiring pattern layer 74F disposed on the second insulating layer 73F.

Further, the first insulating layer 71F and the second insulating layer 73F each have elasticity. Therefore, the relaxation of the impact described above can be achieved. The constituent material of such first insulating layer 71F and second insulating layer 73F is not particularly limited, but there can be used a resin material such as polyimide, silicone-modified polyimide resin, epoxy resin, silicone-modified epoxy resin, acrylic resin, phenol resin, silicone resin, modified polyimide resin, benzocyclobutene, or polybenzooxazole. Thus, it is possible to form the first insulating layer 71F and the second insulating layer 73F each having sufficient elasticity, and thus, the advantages described above can more surely be exerted.

Further, as shown in FIGS. 21 and 22, the second wiring pattern layer 74F has six terminals (connection pads) 741 disposed so as to be opposed to the respective terminals (connection electrodes) 671b through 674b disposed on the support sections 651, 652 of the vibration element 6, and four wiring sections 742F connected respectively to four of the terminals 741. Further, the vibration element 6 is fixed to the terminals 741 via the fixation members 8.

Further, as shown in FIG. 23, the first wiring pattern layer 72F has wiring sections 721F for electrically connecting the wiring sections 742F of the second wiring pattern layer 74F and the connection terminals 37 of the IC 3F, respectively. Thus, the IC 3F and the vibration element 6 are electrically connected to each other via the fixation members 8 and the stress relaxation layer 7F, and it is possible to transmit and receive the signals between the IC 3F and the vibration element 6. As described above, the first wiring pattern layer 72F and the second wiring pattern layer 74F function as a wiring (relocation wiring) for electrically connecting the IC 3F and the vibration element 6 to each other. Therefore, the connection terminals 37 of the IC 3F can freely be disposed without taking the positions of the terminals 671b through 674b of the vibration element 6 into consideration. Therefore, the flexibility in design of the electronic device 1F is enhanced.

Further, the first wiring pattern layer 72F has a shield wiring pattern 722F besides the wiring sections 721F. The shield wiring pattern 722F is disposed so as to spread on the first insulating layer 71F as long as the arrangement of the wiring sections 721F is not hindered. Further, the shield wiring pattern 722F is electrically connected to a constant potential. Here, the constant potential denotes a ground potential or a potential fixed to a certain potential. Such a shield wiring pattern 722F is located between the second wiring pattern layer 74F and the wiring layer 32 of the IC 3F, and functions as a shield layer for reducing the capacitive coupling (the capacitance between the second wiring pattern layer 74F and the wiring layer 32) between the second wiring pattern layer 74F and the wiring layer 32. Therefore, by disposing the shield wiring pattern 722F, the S/N ratio is improved, and the electronic device 1F capable of more accurately detecting the angular velocity is obtained. Further, even in the case in which the noise has temperature dependency, since the noise itself can be reduced, the electronic device 1F superior in temperature characteristics is obtained.

In the more specific explanation, as shown in FIG. 24A, the shield wiring pattern 722F is disposed between wiring sections (the second wiring pattern) 742Fa provided to the second wiring pattern layer 74F and electrically connected to the detection signal terminals 671b, and a wiring section 32Fa provided to the wiring layer 32F and electrically connected to the drive signal terminal 673b. Therefore, mixture of noise from the wiring section 32Fa into the wiring sections 742Fa is reduced, and thus, a more accurate detection signal can be transmitted to the IC 3F. Similarly, as shown in FIG. 24B, the shield wiring pattern 722F is disposed between a wiring section (the second wiring pattern) 742Fb provided to the second wiring pattern layer 74F and electrically connected to the drive signal terminal 673b, and wiring sections (the first wiring pattern) 32Fb provided to the wiring layer 32F and electrically connected to the detection signal terminals 671b. Therefore, mixture of noise from the wiring sections 742Fb into the wiring section 32Fb is reduced, and thus, a more accurate detection signal can be transmitted to the IC 3F. By disposing the shield wiring pattern 722F in such a manner as described above, the electronic device 1F capable of more accurately detecting the angular velocity is obtained.

In particular, in the present embodiment, since the insulating layers are respectively disposed between the wiring sections 742Fa, 742Fb and the shield wiring pattern 722F, and between the wiring sections 32Fa, 32Fb and the shield wiring pattern 722F, it is possible to easily dispose the wiring sections 742Fa, 742Fb, 32Fa, and 32Fb, and the shield wiring pattern 722F.

It should be noted that although in the present embodiment, there is explained the configuration in which the wiring sections 32Fa, 32Fb are disposed inside the fourth wiring pattern layer 328, it is sufficient for the wiring sections 32Fa, 32Fb to be disposed in at least either one of the first, second, third, and fourth wiring pattern layers 322, 324, 326, 328F.

Here, the method of connecting the shield wiring pattern 722F to the ground is not particularly limited. For example, it is also possible for the shield wiring pattern 722F to be electrically connected to the ground wiring included in the IC 3F. According to this method, since the wiring originally provided to the IC 3F can be used, there is obtained an advantage that a complication (an increase in size) of the device is not involved.

Further, as another method, it is also possible to dispose a dedicated wiring, which connects the shield wiring pattern 722F to the ground, on the upper surface (the fourth wiring pattern layer 328F) of the IC 3F, electrically connect the shield wiring pattern 722F to the dedicated wiring, and electrically connect the dedicated wiring and the internal terminal 241 for grounding to each other with a bonding wire BW. According to such a method as described above, since the shield wiring pattern 722F can be connected to the ground without the intervention of the internal wiring of the IC 3F, the impedance of the wiring line between the shield wiring pattern 722F and the ground can be reduced. Therefore, the shield effect of the shield wiring pattern 722F can further be enhanced. It should be noted that in this method, it is also possible to share the internal terminal 241 for grounding with the IC 3F, or to separately dispose the internal terminal 241 for the IC 3F and the internal terminal 241 for the shield wiring pattern 722F, but it is preferable to share the internal terminal 241. Thus, it is possible to prevent an increase in the number of components to thereby prevent an increase in size and degradation in reliability of the device.

Further, as another method, it is also possible to directly connect the shield wiring pattern 722F to the internal terminal 241 for grounding disposed on the package 2 with a bonding wire or the like without the intervention of a wiring disposed in the IC 3F or a wiring disposed on the IC 3F. Thus, the configuration of the device becomes simpler. Further, it is possible to further decrease the impedance of the wiring line between the shield wiring pattern 722F and the ground.

Although in the present embodiment, the mixture of the noise from the wiring section electrically connected to the drive signal terminal into the wiring sections electrically connected to the detection signal terminals is explained as an example, it is also possible to prevent the mixture of noise from a communication circuit, which is provided to the wiring layer 32F, and is used for communicating with a host device. In particular, the communication circuit is high in operating frequency, and even low capacitance easily interferes with the operation of the communication circuit. Therefore, the electronic device 1F compatible with a high-frequency communication method, and superior in convenience can be provided.

Seventh Embodiment

Figure 25:
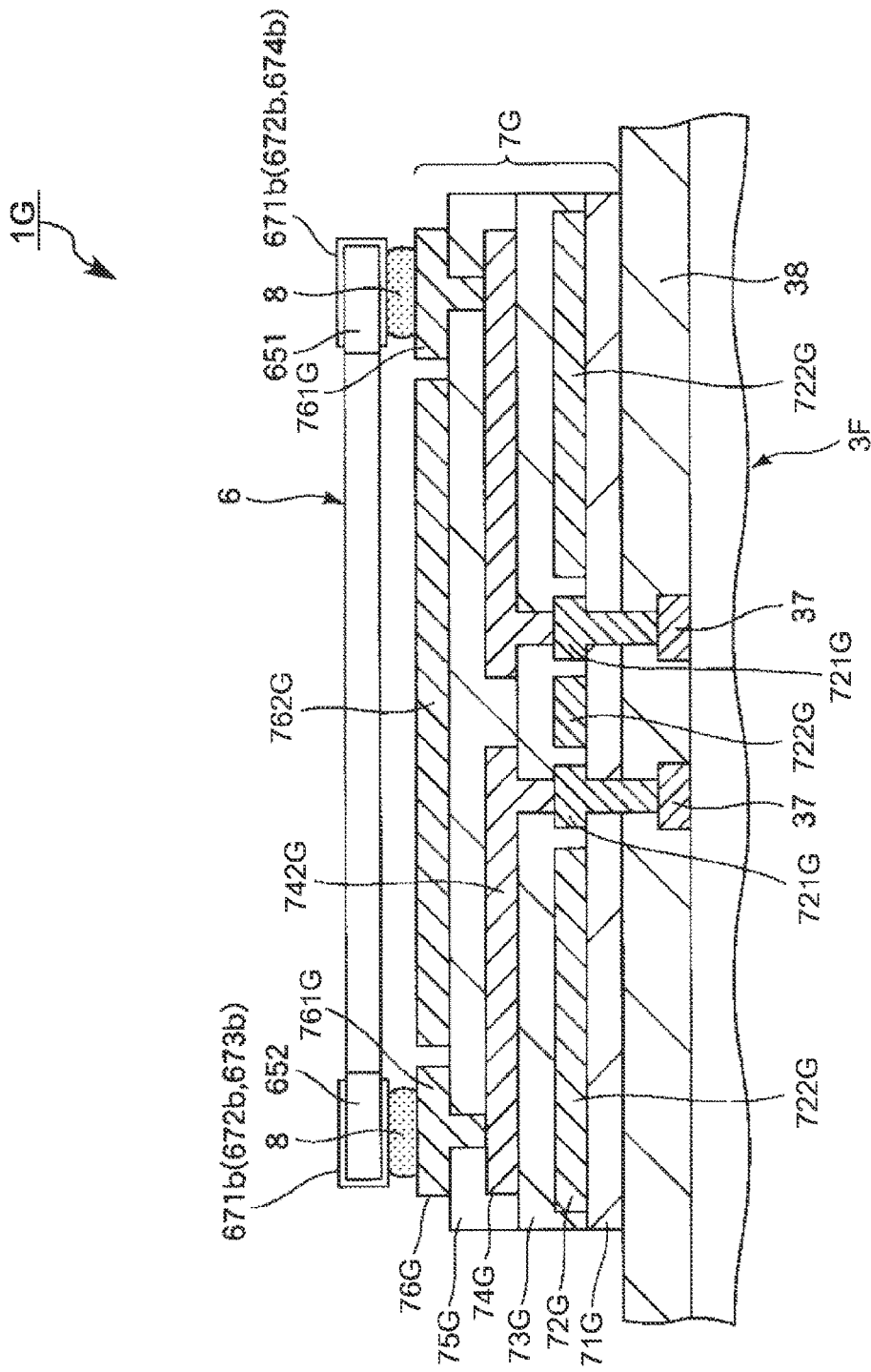
FIG. 25 is a cross-sectional view of a stress relaxation layer provided to an electronic device according to a seventh embodiment of the invention.
Figure 26:
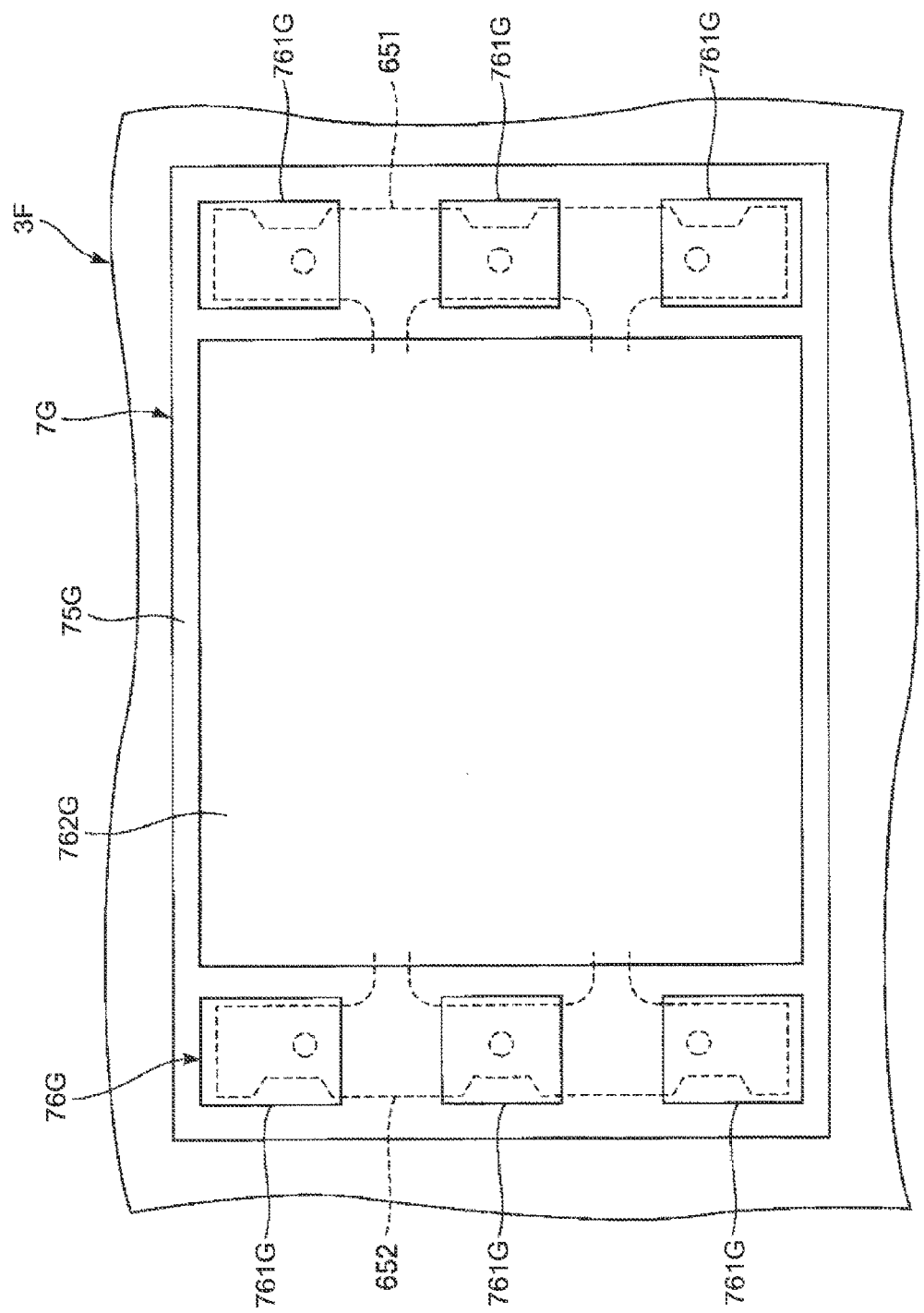
FIG. 26 is a plan view of the stress relaxation layer shown in FIG. 25.
Figure 27:
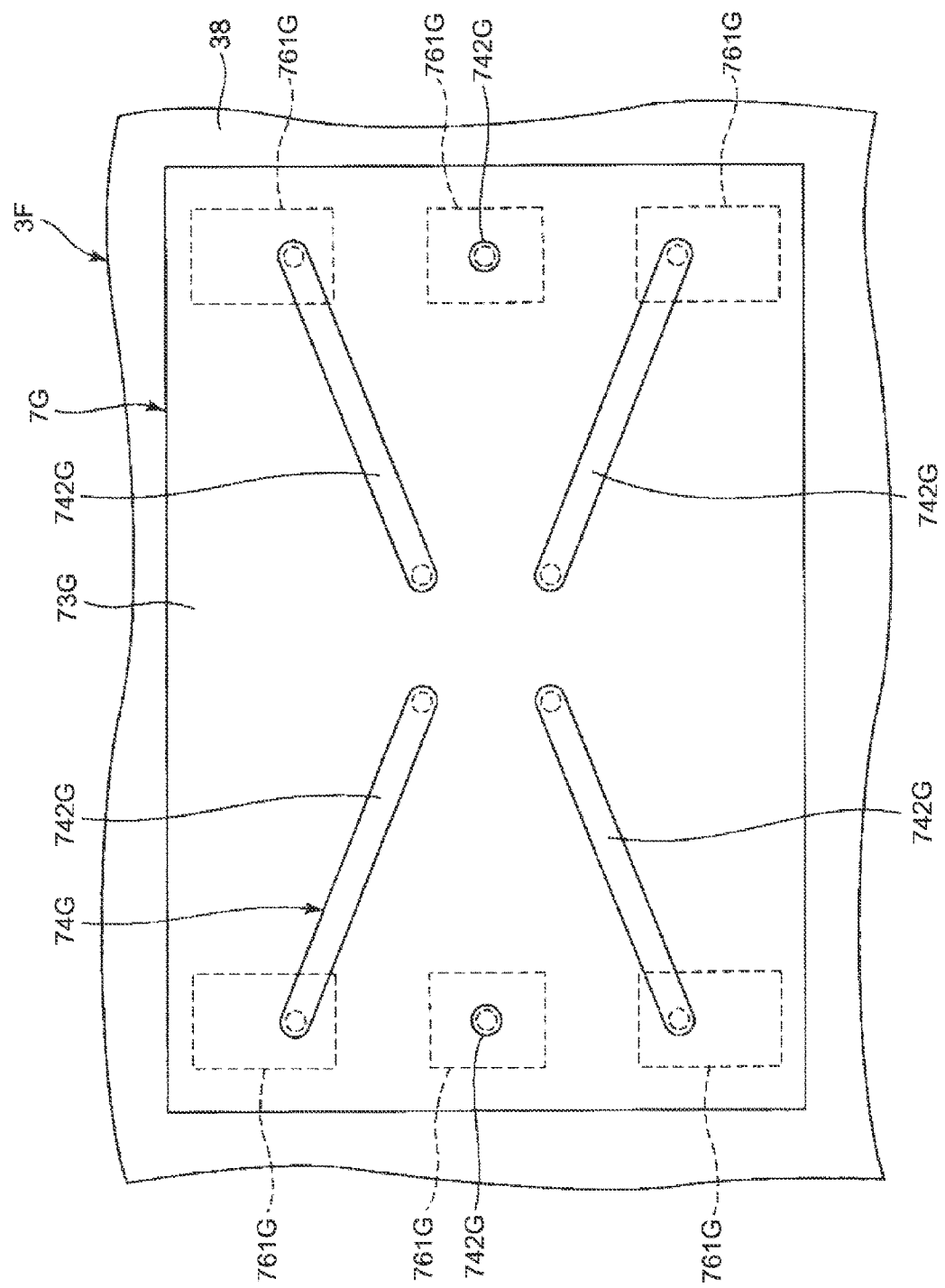
FIG. 27 is a plan view of the stress relaxation layer shown in FIG. 25.
Figure 28:
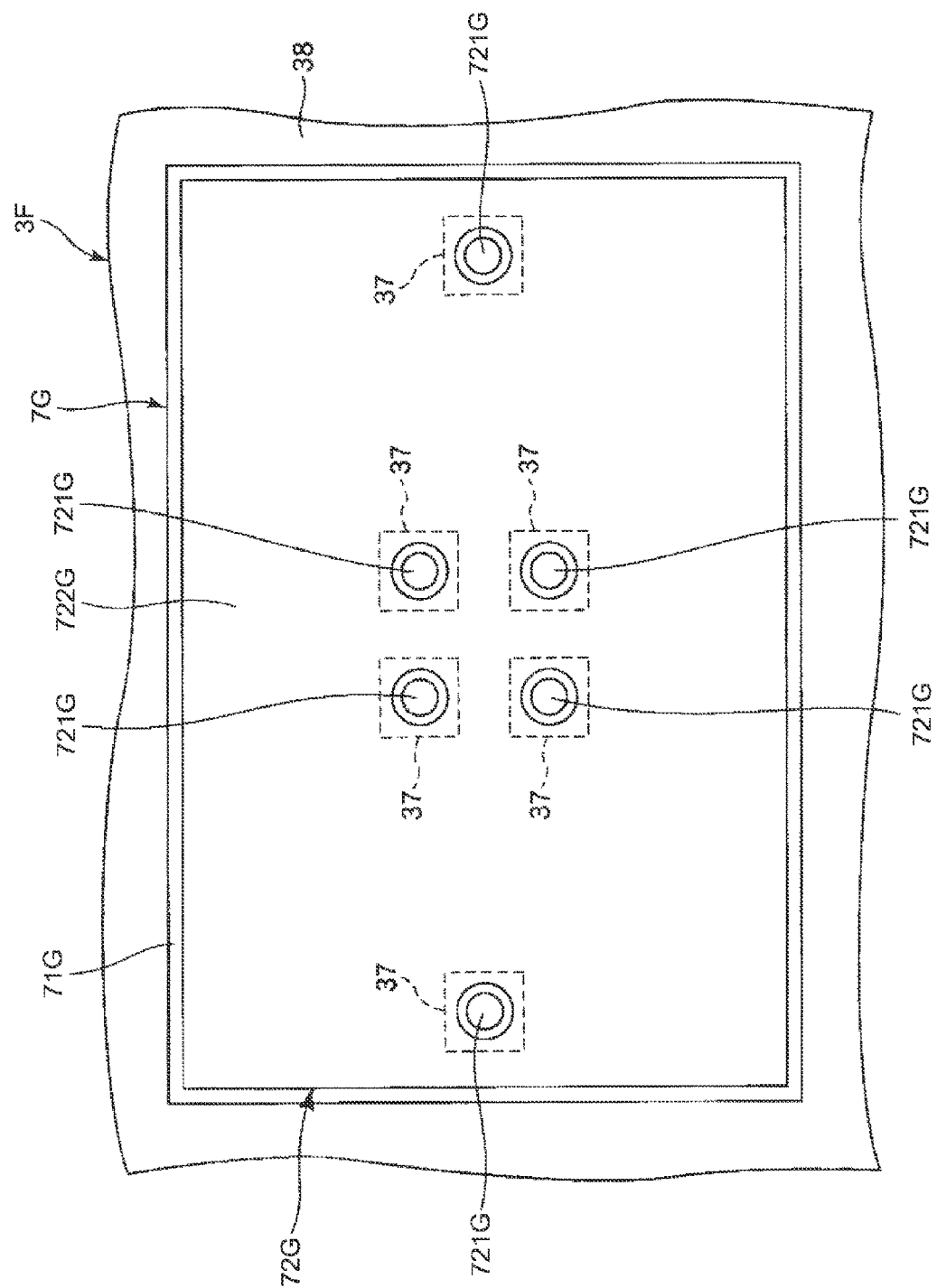
FIG. 28 is a plan view of the stress relaxation layer shown in FIG. 25.

FIG. 25 is a cross-sectional view of a stress relaxation layer provided to an electronic device according to a seventh embodiment of the invention. FIGS. 26 through 28 are each a plan view of the stress relaxation layer shown in FIG. 25. Hereinafter, the seventh embodiment will be explained with a focus on the differences from the sixth embodiment described above, and regarding substantially the same matters, the same reference symbols are provided, and the explanation thereof will be omitted.

The electronic device according to the seventh embodiment is different in the configuration of the stress relaxation layer from the sixth embodiment.

As shown in FIG. 25, the stress relaxation layer 7G provided to the electronic device 1G according to the present embodiment includes a first insulating layer 71G stacked on the upper surface (on the passivation film 38) of the IC 3F, a first wiring pattern layer 72G disposed on the first insulating layer 71G, a second insulating layer 73G disposed on the first insulating layer 71G and the first wiring pattern layer 72G, a second wiring pattern layer 74G disposed on the second insulating layer 73G, a third insulating layer 75G disposed on the second insulating layer 73G and the second wiring pattern layer 74G, and a third wiring pattern layer 76G disposed on the third insulating layer 75G. In the stress relaxation layer 7G having such a configuration as described above, since the number of insulating layers having elasticity is larger than, for example, that in the sixth embodiment described above, the impact relaxation characteristic is further improved.

Further, as shown in FIGS. 25 and 26, the third wiring pattern layer 76G has six terminals (connection pads) 761G disposed so as to be opposed to the respective terminals (connection electrodes) 671b through 674b disposed on the support sections 651, 652 of the vibration element 6. Further, the vibration element 6 is fixed to the terminals 761G via the fixation members 8. Further, the third wiring pattern layer 76G has shield wiring pattern 762G. The shield wiring pattern 762G is disposed so as to spread on the third insulating layer 75G as long as the arrangement of the terminals 761G is not hindered. Further, the shield wiring pattern 762G is electrically connected to a constant potential, in particular, to the ground in the present embodiment.

Further, as shown in FIG. 27, the second wiring pattern layer 74G has wiring sections 742G electrically connected to the terminals 761G. Further, as shown in FIG. 28, the first wiring pattern layer 72G has wiring sections 721G for electrically connecting the wiring sections 742G of the second wiring pattern layer 74G and the connection terminals 37 of the IC 3F, respectively, and shield wiring pattern 722G.

The shield wiring pattern 762G of the present embodiment is located between the second wiring pattern layer 74G and the vibration element 6, and therefore functions as a shield layer for reducing the capacitive coupling between the second wiring pattern layer 74G and the vibration element 6. Therefore, by disposing the shield wiring pattern 762G, the electronic device 1G capable of more accurately detecting the angular velocity is obtained.

In the more specific explanation, since the shield wiring pattern 762G is disposed between the wiring sections 742G provided to the second wiring pattern layer 74G and electrically connected to the detection signal terminals 671b, and the drive signal electrodes 673a provided to the vibration element 6, mixture of noise from the drive signal electrodes 673a into the wiring sections 742G is reduced, and it is possible to transmit a more accurate detection signal to the IC 3F. Similarly, since the shield wiring pattern 762G is disposed between the wiring section 742G provided to the second wiring pattern layer 74G and electrically connected to the drive signal terminal 673b, and the detection signal electrodes 671a provided to the vibration element 6, mixture of noise from the wiring section 742G into the detection signal electrodes 671a is reduced, and it is possible to transmit a more accurate detection signal to the IC 3F. By disposing the shield wiring pattern 762G in such a manner as described above, the electronic device 1G capable of more accurately detecting the angular velocity is obtained.

According also to such a seventh embodiment as described above, substantially the same advantages as in the sixth embodiment described above can be obtained.

Eighth Embodiment

Figure 29:
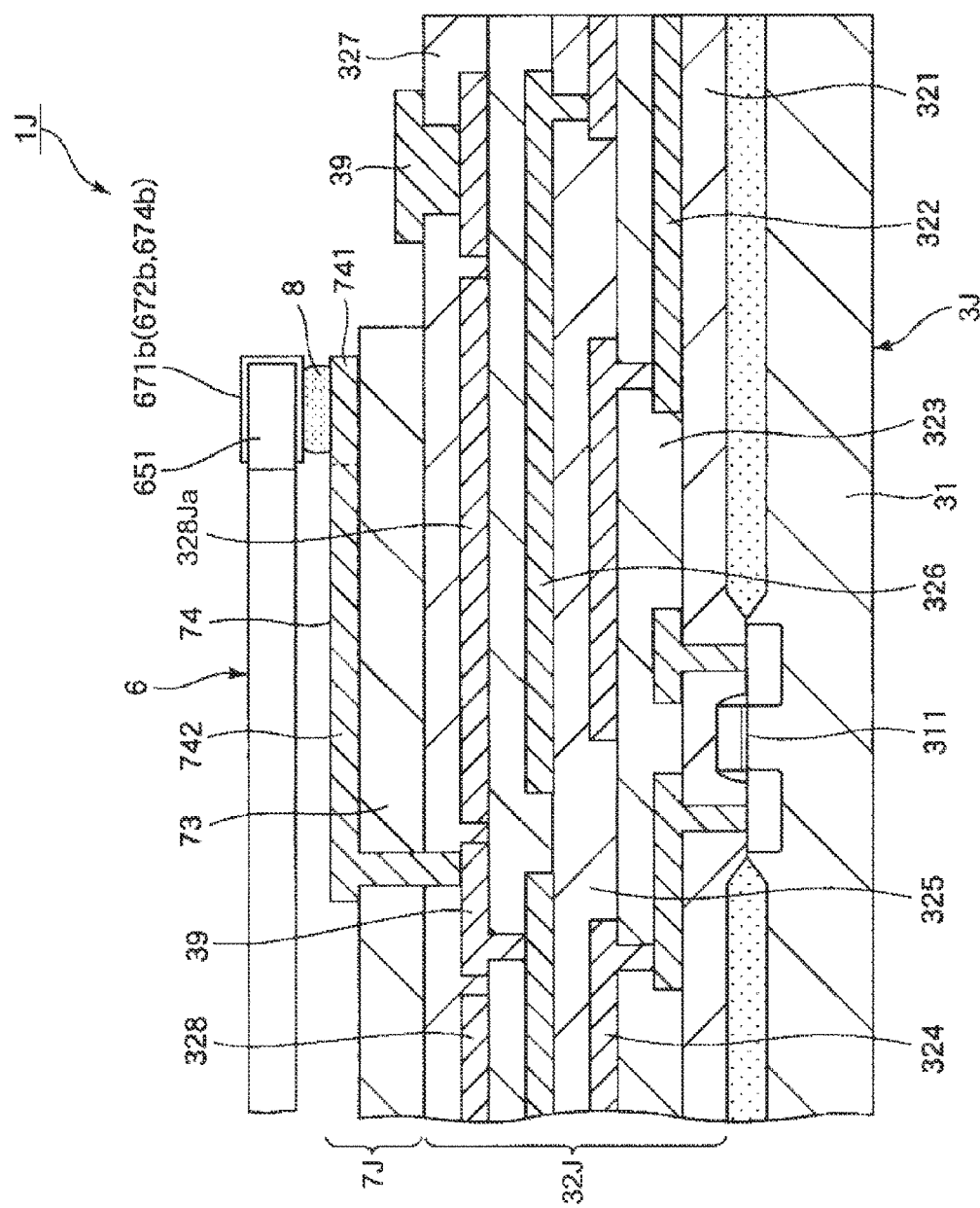
FIG. 29 is a cross-sectional view of an IC provided to an electronic device according to an eighth embodiment of the invention.

FIG. 29 is a cross-sectional view of an IC provided to an electronic device according to an eighth embodiment of the invention. Hereinafter, the eighth embodiment will be explained with a focus on the differences from the sixth embodiment described above, and regarding substantially the same matters, the same reference symbols are provided, and the explanation thereof will be omitted.

The electronic device according to the eighth embodiment is different from the sixth embodiment in the configuration of the IC and the stress relaxation layer.

As shown in FIG. 29, in the electronic device 1J according to the present embodiment, a shield wiring pattern 328Ja is disposed in the IC 3J. Specifically, the shield wiring pattern 328Ja is disposed as a part of a fourth wiring pattern layer 328 provided to a wiring layer 32J of the IC 3J. By disposing the shield wiring pattern 328a in the IC 3J as described above, it is possible to exert substantially the same advantages as in the sixth embodiment described above, and at the same time, the following advantages can further be exerted. That is, by disposing the shield wiring pattern 328Ja in the IC 3J, in the stress relaxation layer 7J, the first insulating layer 71F and the first wiring pattern layer 72F for disposing the shield wiring pattern can be omitted. Therefore, the stress relaxation layer 7J can be made thinner, and it is possible to achieve height reduction of the electronic device 1J.

According also to such an eighth embodiment as described above, substantially the same advantages as in the sixth embodiment described above can be obtained.

Ninth Embodiment

Figure 30:
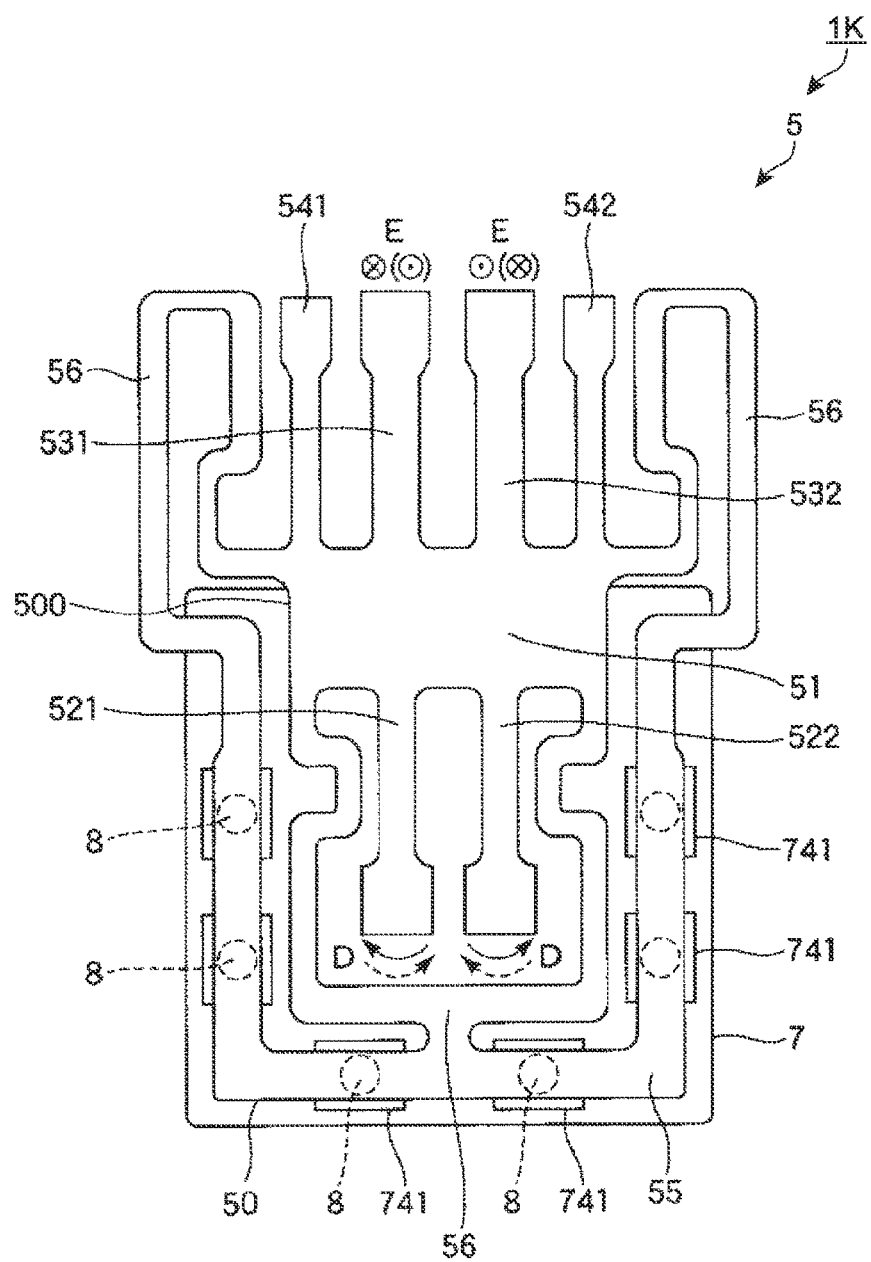
FIG. 30 is a plan view of a vibration element provided to an electronic device according to a ninth embodiment of the invention.

FIG. 30 is a plan view of a vibration element provided to an electronic device according to a ninth embodiment of the invention. Hereinafter, the ninth embodiment will be explained with a focus on the differences from the sixth embodiment described above, and regarding substantially the same matters, the same reference symbols are provided, and the explanation thereof will be omitted.

The electronic device according to the ninth embodiment is different in the configuration of the vibration element from the sixth embodiment.

The vibration element 5 provided to the electronic device 1K according to the present embodiment is a so-called "H-type" gyro element, and is capable of detecting the angular velocity $\omega x$ around the X axis. As shown in FIG. 30, such a vibration element 5 has a vibrating element 50 made of quartz crystal, and electrodes disposed on the vibrating element 50. It should be noted that the material of the vibrating element 50 is not limited to quartz crystal, but it is also possible to use a piezoelectric material such as lithium tantalate or lithium niobate.

The vibrating element 50 has a plate-like shape having a spread in an x-y plane defined by an x axis (an electric axis) and a y axis (a mechanical axis) as the crystal axes of the quartz crystal and a thickness in a z-axis (an optical axis) direction. Further, the vibrating element 50 has a base section 51, a pair of drive vibrating arms 521, 522 extending from the base section 51 toward the −y-axis side in parallel to each other, a pair of detection vibrating arms 531, 532 extending from the base section 51 toward the +y-axis side in parallel to each other, a pair of adjustment vibrating arms 541, 542 extending from the base section 51 toward the +y-axis side and located on both sides of the detection vibrating arms 531, 532, a support section 55 for supporting the base section 51, and connecting sections 56 for connecting the base section 51 and the support section 55 to each other. It should be noted that in such a vibrating element 50, the base section 51, the drive vibrating arms 521, 522, the detection vibrating arms 531, 532, and the adjustment vibrating arms 541, 542 constitute a vibration body 500.

Such a vibration element 5 is fixed to the stress relaxation layer 7F in the support section 55. Further, fixation of the vibration element 5 to the stress relaxation layer 7F is achieved using fixation members 8, and the vibration element 5 and the IC 3F are electrically connected to each other via the fixation members 8 and the stress relaxation layer 7F.

The drive vibrating arms 521, 522 are provided with drive signal electrodes not shown, and by applying an oscillation drive signal (an alternating voltage) from the IC 3F to the drive signal electrodes, a drive mode indicated by the arrows D is excited. Then, when the angular velocity $\omega x$ around the X axis is applied while the drive vibrating arms 521, 522 are vibrating in the drive mode, a detection mode indicated by the arrows E is excited, and thus, the detection vibrating arms 531, 532 vibrate. The detection vibrating arms 531, 532 are provided with detection signal electrodes not shown, and a detection signal (the charge) generated by the vibration of the detection vibrating arms 531, 532 is taken out through the detection signal electrodes. Then, the IC 3F detects the angular velocity $\omega x$ based on the detection signal thus taken out.

According also to such a ninth embodiment as described above, substantially the same advantages as in the sixth embodiment described above can be obtained.

Tenth Embodiment

Figure 31:
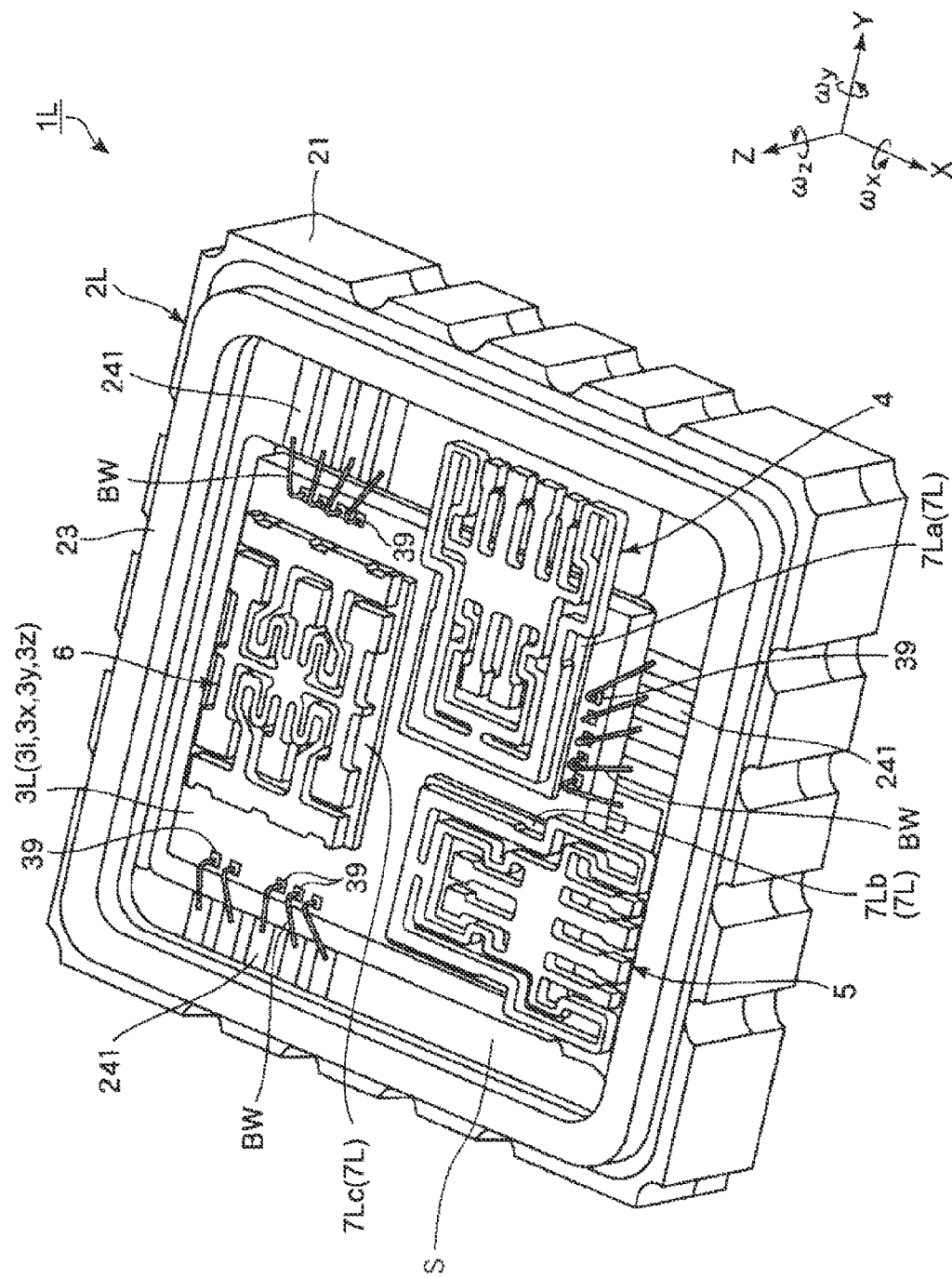
FIG. 31 is a perspective view showing an electronic device according to a tenth embodiment of the invention.
Figure 32:
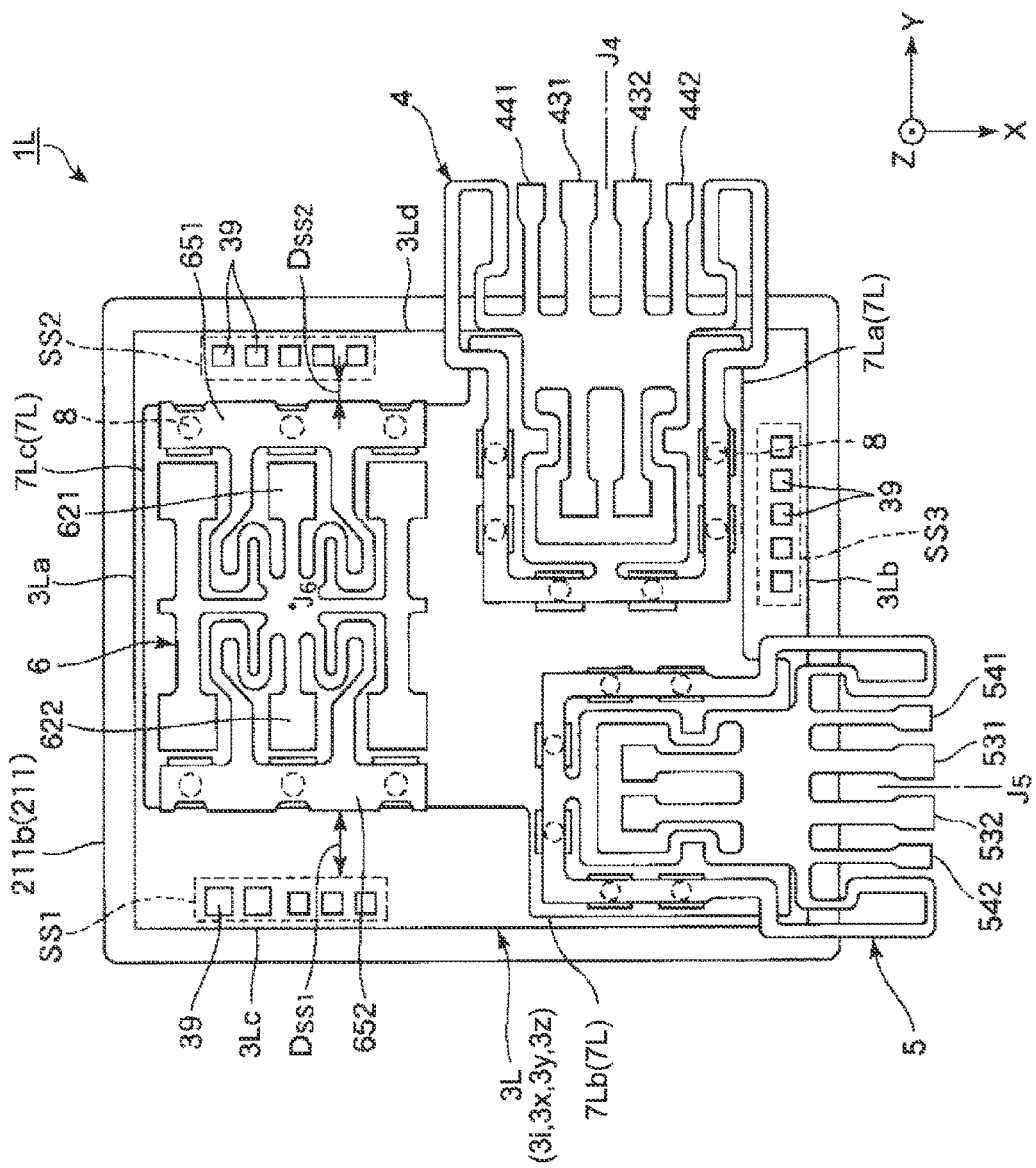
FIG. 32 is a plan view of the electronic device shown in FIG. 31.
Figure 33:
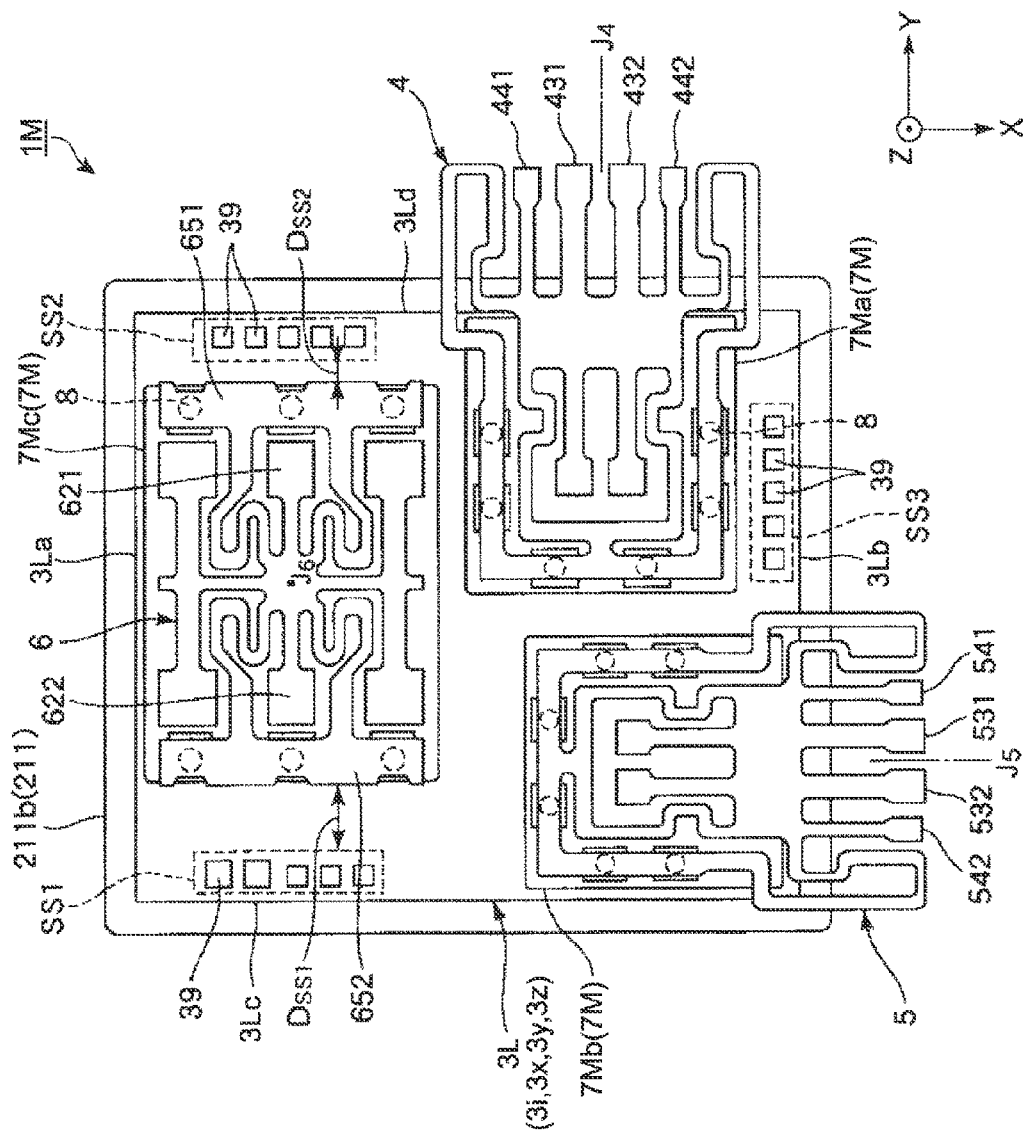
FIG. 33 is a plan view showing a modified example of the electronic device shown in FIG. 31.

FIG. 31 is a perspective view showing an electronic device according to a tenth embodiment of the invention. FIG. 32 is a plan view of the electronic device shown in FIG. 31. FIG. 33 is a plan view showing a modified example of the electronic device shown in FIG. 31. It should be noted that in FIG. 31, a lid is omitted from the drawing for the sake of convenience of explanation. Hereinafter, the tenth embodiment will be explained with a focus on the differences from the sixth embodiment described above, and regarding substantially the same matters, the same reference symbols are provided, and the explanation thereof will be omitted.

The tenth embodiment is different from the sixth embodiment in the configuration provided with a plurality of vibration elements.

The electronic device 1L according to the present embodiment is a triaxial angular velocity sensor, and is capable of detecting the angular velocity $\omega x$ around the X axis, the angular velocity $\omega y$ around the Y axis, and the angular velocity $\omega z$ around the Z axis independently of each other. Such an electronic device 1L has a package 2L provided with a housing space S formed inside, an IC 3L housed in the package 2L, and three vibration elements 4, 5, and 6 disposed on the IC 3L via a stress relaxation layer 7L. It should be noted that the vibration elements 5, 6 each have substantially the same configuration as explained in the above description of the embodiments, and the vibration element 4 has substantially the same configuration as that of the vibration element 5 except the point that vibration element is disposed in a different orientation.

IC

The IC 3L has a roughly rectangular planar shape, and the outer shape in the planar view includes a pair of outer edges 3La, 3Lb disposed so as to extend in the Y-axis direction, and a pair of outer edges 3Lc, 3Ld disposed so as to extend in the X-axis direction as shown in FIG. 32.

The IC 3L includes, for example, an interface section 3i for communicating with an external host device, a drive/detection circuit 3y for driving the vibration element 4 to detect the angular velocity ωy applied to the vibration element 4, a drive/detection circuit 3x for driving the vibration element 5 to detect the angular velocity ωx applied to the vibration element 5, and a drive/detection circuit 3z for driving the vibration element 6 to detect the angular velocity ωz applied to the vibration element 6.

Here, as shown in FIG. 32, a plurality of connection terminals 39 is disposed separately in three areas, namely a first terminal arrangement area SS1, a second terminal arrangement area SS2, and a third terminal arrangement area SS3, set on the upper surface of the IC 3L. The first terminal arrangement area SS1 is disposed along the outer edge 3Lc so as to be shifted toward the outer edge 3La, the second terminal arrangement area SS2 is disposed along the outer edge 3Ld so as to be shifted toward the outer edge 3La, and the third terminal arrangement area SS3 is disposed along the outer edge 3Lb so as to be shifted toward the outer edge 3Ld.

In the first terminal arrangement area SS1, there are disposed digital signal terminals in a lump such as a digital signal terminal for a slave selection signal SS for selecting a communication method, a digital signal terminal for a data input signal MOSI, a digital signal terminal for a clock signal SCLK, and a digital signal terminal for a data output signal MISO. Further, in the second terminal arrangement area SS2 and the third terminal arrangement area SS3, there are disposed analog signal terminals in a lump such as a ground terminal for the ground GND, a power supply signal terminal for the power supply VDDI of the interface section 3i, a power supply signal terminal for the power supply VDD of the drive/detection circuits 3x, 3y, and 3z, and a test signal terminal for testing.

By disposing the digital signal terminals and the analog signal terminals separately in the respective areas different from each other as described above, mixture of digital signals into the analog signal terminals (wiring) can be reduced. Therefore, the electronic device 1L capable of reducing the noise, and thus capable of performing more accurate drive is obtained. In particular, in the present embodiment, since there is adopted an arrangement of disposing the first terminal arrangement area SS1 distant from the second terminal arrangement area SS2 and the third terminal arrangement area SS3 as much as possible, the advantages described above can more effectively be exerted.

Arrangement of Vibration Elements

As shown in FIG. 32, the vibration element 4 is arranged so that a detection axis J4 coincides with the Y axis. Thus, the vibration element 4 can detect the angular velocity ωy. Further, the vibration element 4 is disposed on the upper surface of the IC 3L at a position shifted toward the outer edge 3Lb and the outer edge 3Ld. Further, on the +X-axis side of the vibration element 4 (between the vibration element 4 and the outer edge 3Lb), there is located the third terminal arrangement area SS3, and on the −X-axis side of the vibration element 4 (between the vibration element 4 and the outer edge 3La), there is located the second terminal arrangement area SS2. Further, the vibration element 4 is disposed so that the detection vibrating arms 431, 432 and the adjustment vibrating arms 441, 442 protrude from the outer edge 3Ld of the IC 3L toward the +Y side in a planar view. In other words, the vibration element 4 is disposed so that the detection vibrating arms 431, 432 and the adjustment vibrating arms 441, 442 do not overlap the IC 3L in the planar view.

Then an arrangement of the vibration element 5 will be explained. As shown in FIG. 32, the vibration element 5 is arranged so that a detection axis J5 coincides with the X axis. Thus, the vibration element 5 can detect the angular velocity ωx. Further, the vibration element 5 is disposed on the upper surface of the IC 3L at a position shifted toward the outer edge 3Lb and the outer edge 3Lc. Therefore, the vibration element 5 is located on the −Y-axis side with respect to the vibration element 4 (between the vibration element 4 and the outer edge 3Lc). Further, on the −X-axis side of the vibration element 5 (between the vibration element 5 and the outer edge 3La), there is located the first terminal arrangement area SS1. Further, the vibration element 5 is disposed so that the detection vibrating arms 531, 532 and the adjustment vibrating arms 541, 542 protrude from the outer edge 3Lb of the IC 3L toward the +X side in the planar view.

Then an arrangement of the vibration element 6 will be explained. As shown in FIG. 32, the vibration element 6 is arranged so that a detection axis J6 coincides with the Z axis. Thus, the vibration element 6 can detect the angular velocity ωz. Further, the vibration element 6 is disposed on the upper surface of the IC 3L at a position shifted toward the outer edge 3La. Therefore, the vibration element 6 is located on the −X-axis side with respect to the vibration elements 4, 5 (between the vibration elements 4, 5 and the outer edge 3La). Further, on the −Y-axis side of the vibration element 6 (between the vibration element 6 and the outer edge 3Lc), there is located the first terminal arrangement area SS1, and on the +Y-axis side (between the vibration element 6 and the outer edge 3Ld), there is located the second terminal arrangement area SS2.

Further, the vibration element 6 is disposed so as to be shifted toward the second terminal arrangement area SS2 rather than the first terminal arrangement area SS1. In other words, the vibration element 6 is disposed so that the distance DSS2 from the second terminal arrangement area SS2 is shorter than the distance DSS1 from the first terminal arrangement area SS1. Thus, it is possible to make the vibration element 6 distant from the first terminal arrangement area SS1 as much as possible, and thus, the mixture of the digital signal into the vibration element 6 is reduced. Therefore, the electronic device 1L capable of reducing the mixture of noise into the drive signal or the detection signal, and thus capable of performing more accurate drive is obtained.

Further, the vibration element 6 is disposed so that the direction, in which the support sections 651, 652 are arranged, coincides with the Y-axis direction. Since the length of the vibration element 6 in the direction, in which the support sections 651, 652 are arranged, is larger than the length thereof in the direction (the direction in which the connecting arms 631, 632 extend) perpendicular to the direction, in which the support sections 651, 652 are arranged, by disposing the vibration element 6 as described above, it is possible to make effective use of the space on the upper surface of the IC 3L. Therefore, for example, the distance between the outer edges 3La, 3Lb can be made shorter, and miniaturization of the IC 3L can be achieved.

By disposing the vibration elements 4, 5 in an area located on the upper surface of the IC 3L and on the outer edge 3Lb side so as to be arranged side by side in the Y-axis direction, and further disposing the vibration element 6 in an area located on the upper surface of the IC 3L and on the outer edge 3La side as described above, it is possible to dispose these three vibration elements 4, 5, and 6 in a relatively small space. Therefore, miniaturization of the IC 3L can be achieved, and accordingly, miniaturization of the electronic device 1L can be achieved.

Stress Relaxation Layer

The stress relaxation layer 7L has a first stress relaxation layer 7La disposed between the IC 3L and the vibration element 4, and having the vibration element 4 disposed on the upper surface thereof, a second stress relaxation layer 7Lb disposed between the IC 3L and the vibration element 5, and having the vibration element 5 disposed on the upper surface thereof, and a third stress relaxation layer 7Lc disposed between the IC 3L and the vibration element 6, and having the vibration element 6 disposed on the upper surface thereof. By dividing the stress relaxation layer 7L into the parts corresponding respectively to the vibration elements 4, 5, and 6 in such a manner as described above, it becomes difficult for the vibrations of the vibration elements 4, 5, and 6 from propagating to each other. Therefore, it is possible for each of the vibration elements 4, 5, and 6 to more accurately detect the angular velocity. It should be noted that although the configuration of each of the first stress relaxation layer 7La, the second stress relaxation layer 7Lb, and the third stress relaxation layer 7Lc is substantially the same as the configuration of the stress relaxation layer 7F described in the description of the sixth embodiment, and therefore the explanation thereof will be omitted, it is also possible to use the configuration of the stress relaxation layer 7G described in the description of the seventh embodiment.

According also to such a tenth embodiment as described above, substantially the same advantages as in the sixth embodiment described above can be obtained.

Modified Example

Although in the tenth embodiment described above, the stress relaxation layer 7L is divided into the first stress relaxation layer 7La, the second stress relaxation layer 7Lb, and the third stress relaxation layer 7Lc, it is also possible to adopt an electronic device 1M provided with a stress relaxation layer 7M obtained by integrally forming a first stress relaxation layer 7Ma, a second stress relaxation layer 7Mb, and the third stress relaxation layer 7Mc with each other as shown in FIG. 33, for example. In other words, it is also possible to dispose three vibration elements 4, 5, and 6 on the single stress relaxation layer 7M. Thus, since the gaps between the first stress relaxation layer 7La, the second stress relaxation layer 7Lb, and the third stress relaxation layer 7Lc are eliminated, mixture of the noise through the gaps is prevented, and thus, the shield effect can be improved.

Electronic Apparatus

Then, the electronic apparatus to which the electronic device is applied will be explained in detail with reference to FIGS. 34 through 36. Although the explanation is hereinafter presented citing the example of applying the electronic device 1, it is also possible to apply either one of the electronic devices 1A through 1M instead of the electronic device 1.

Figure 34:
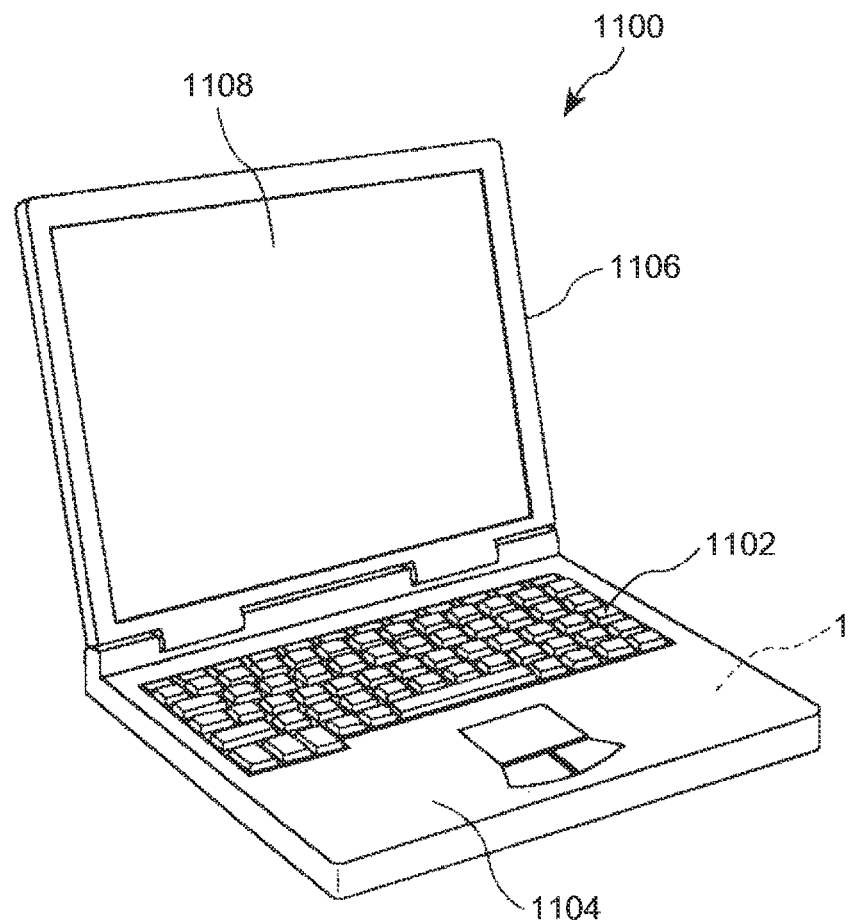
FIG. 34 is a perspective view showing a configuration of a personal computer to which the electronic apparatus equipped with the electronic device is applied.

FIG. 34 is a perspective view showing a configuration of a mobile type (or laptop type) personal computer as an example of the electronic apparatus equipped with the electronic device according to the embodiment of the invention.

In the drawing, the personal computer 1100 includes a main body section 1104 provided with a keyboard 1102, and a display unit 1106 provided with a display section 1108, and the display unit 1106 is pivotally supported with respect to the main body section 1104 via a hinge structure. Such a personal computer 1100 incorporates the electronic device 1 functioning as an angular velocity sensor (a gyro sensor). Therefore, the personal computer 1100 is higher in performance, and can be provided with high reliability.

Figure 35:
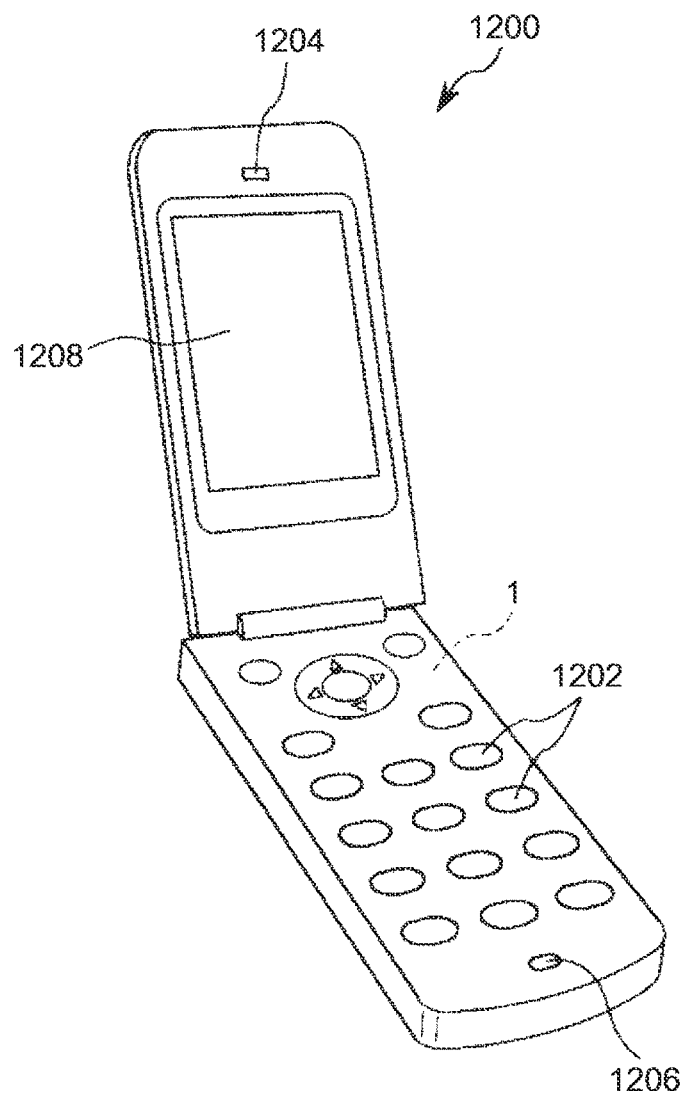
FIG. 35 is a perspective view showing a configuration of a cellular phone to which the electronic apparatus equipped with the electronic device is applied.

FIG. 35 is a perspective view showing a configuration of a cellular phone (including PHS) as an example of the electronic apparatus equipped with the electronic device according to the embodiment of the invention.

In this drawing, the cellular phone 1200 is provided with a plurality of operation buttons 1202, an ear piece 1204, and a mouthpiece 1206, and a display section 1208 is disposed between the operation buttons 1202 and the ear piece 1204. Such a cellular phone 1200 incorporates the electronic device 1 functioning as the angular velocity sensor (the gyro sensor). Therefore, the cellular phone 1200 is higher in performance, and can be provided with high reliability.

Figure 36:
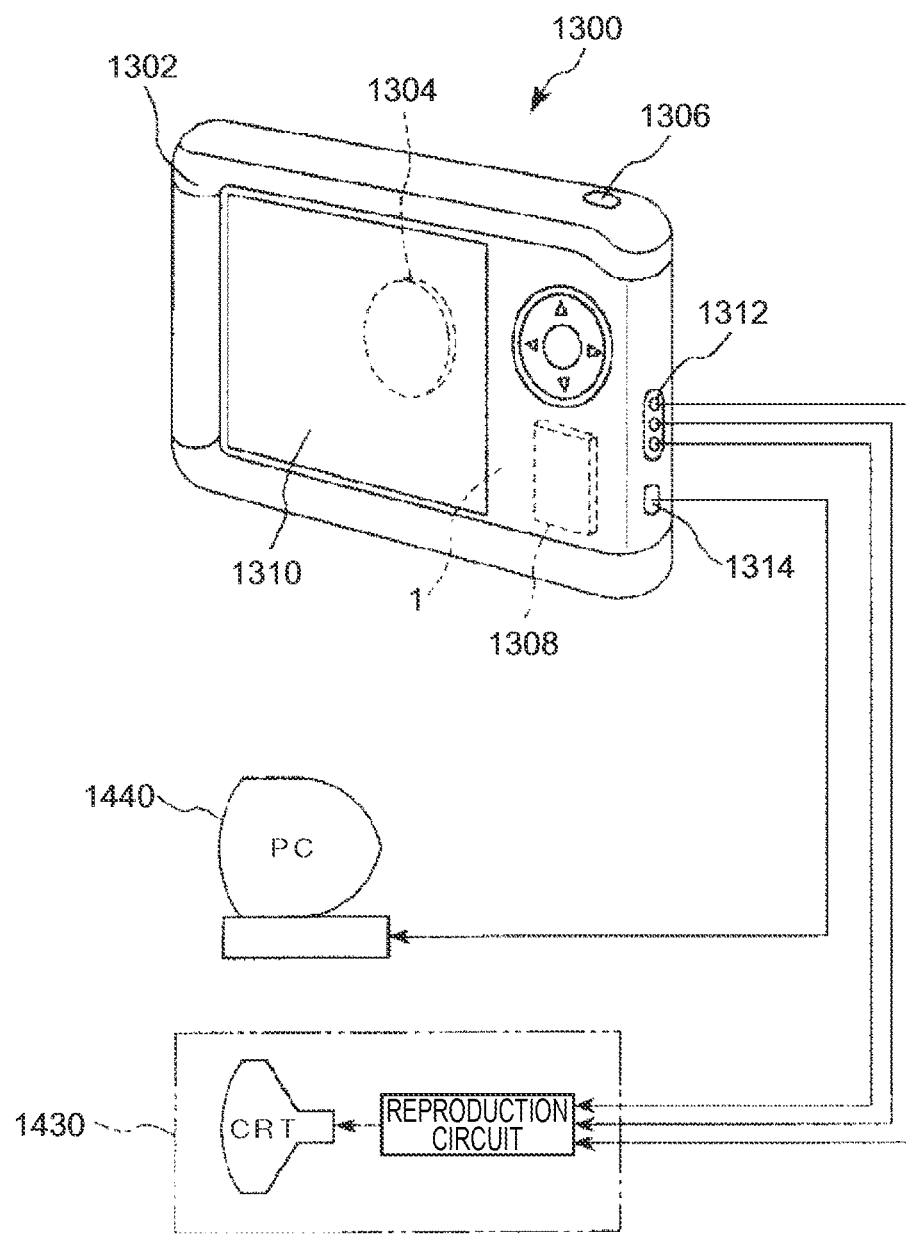
FIG. 36 is a perspective view showing a configuration of a digital still camera to which the electronic apparatus equipped with the electronic device is applied.

FIG. 36 is a perspective view showing a configuration of a digital still camera as an example of the electronic apparatus equipped with the electronic device according to the embodiment of the invention. It should be noted that the connection with external equipment is also shown briefly in this drawing.

The digital still camera 1300 performs photoelectric conversion on an optical image of an object using an imaging element such as CCD (Charge Coupled Device) to thereby generate an imaging signal (an image signal). A case (a body) 1302 of the digital still camera 1300 is provided with a display section 1310 disposed on the back surface of the case 1302 to provide a configuration of performing display in accordance with the imaging signal from the CCD, wherein the display section 1310 functions as a viewfinder for displaying the object as an electronic image. Further, the front surface (the back side in the drawing) of the case 1302 is provided with a light receiving unit 1304 including an optical lens (an imaging optical system), the CCD, and so on. When the photographer checks an object image displayed on the display section 1310, and then holds down a shutter button 1306, the imaging signal from the CCD at that moment is transferred to and stored in a memory device 1308.

Further, the digital still camera 1300 is provided with video signal output terminals 1312 and an input/output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation.

Such a digital still camera 1300 incorporates the electronic device 1 functioning as the angular velocity sensor (the gyro sensor). Therefore, the digital still camera 1300 is higher in performance, and can be provided with high reliability.

It should be noted that, as the electronic apparatus equipped with the electronic device, there can be cited, for example, an inkjet ejection device (e.g., an inkjet printer), a laptop personal computer, a television set, a video camera, a video cassette recorder, a car navigation system, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator, besides the personal computer (the mobile personal computer) shown in FIG. 34, the cellular phone shown in FIG. 35, and the digital still camera shown in FIG. 36.

Moving Object

Then, the moving object to which the electronic device is applied will be explained in detail with reference to FIG. 37. Although the explanation is hereinafter presented citing the example of applying the electronic device 1, it is also possible to apply either one of the electronic devices 1A through 1M instead of the electronic device 1.

Figure 37:
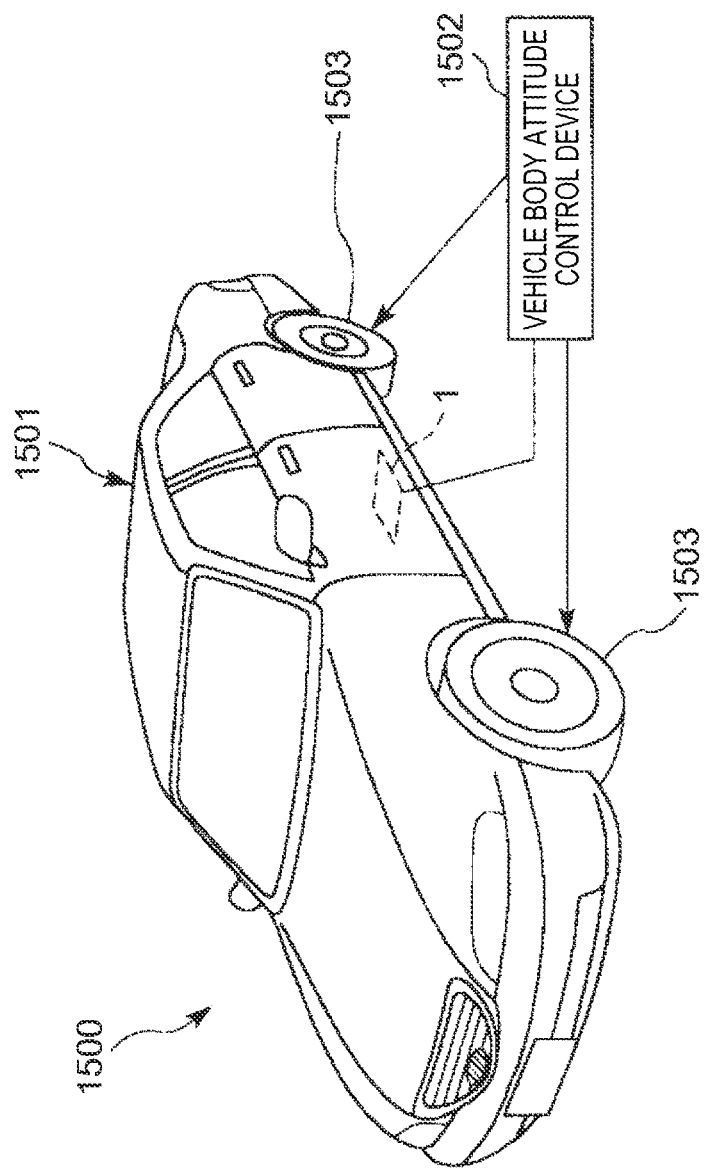
FIG. 37 is a perspective view showing a configuration of a vehicle to which a moving object quipped with the electronic device is applied.

FIG. 37 is a perspective view showing a configuration of a vehicle to which the moving object equipped with the electronic device according to the embodiment of the invention is applied.

The vehicle 1500 incorporates the electronic device 1 functioning as the angular velocity sensor (the gyro sensor), and the attitude of a vehicle body 1501 can be detected using the electronic device 1. The detection signal of the electronic device 1 is supplied to the vehicle body attitude control device 1502, and the vehicle body attitude control device 1502 detects the attitude of the vehicle body 1501 based on the detection signal, and it is possible to control the stiffness of the suspension or control the brake of each of wheels 1503 in accordance with the detection result. Besides the above, such posture control as described above can be used for a two-legged robot and a radio control helicopter. As described above, in realizing the posture control of a variety of types of moving objects, the electronic device 1 is incorporated.

Although the electronic device, the electronic apparatus, and the moving object according to the invention are described based on the embodiments shown in the accompanying drawings, the invention is not limited to these embodiments, but the constituents of each of the sections can be replaced with those having an identical function and any configuration. Further, it is also possible to add any other constituents to the invention. Further, the invention can be the combination of any two or more configurations (features) of the embodiments described above.

Further, although in some of the embodiments described above, the configuration in which a single vibration element is disposed on the IC is explained, the number of the vibration elements is not particularly limited, and it is also possible to dispose, for example, a vibration element capable of detecting the angular velocity around the X axis, a vibration element capable of detecting the angular velocity around the Y axis, and a vibration element capable of detecting the angular velocity around the Z axis.

Further, although in the embodiments described above, the angular velocity sensor as the electronic device is explained, the electronic device is not limited to the angular velocity sensor, but can also be, for example, an oscillator for outputting a signal with a predetermined frequency, or a physical quantity sensor capable of detecting a physical quantity (e.g., acceleration or atmospheric pressure) other than the angular velocity, or the like.

Further, although in the embodiments described above, a device having a configuration, in which the electrodes are disposed on the vibrating element formed of a quartz crystal substrate (a piezoelectric substrate), is used as the vibration element, the configuration of the vibration element is not limited thereto. It is also possible to adopt a vibration element having a configuration in which, for example, a piezoelectric element is disposed on the vibrating element obtained by pattering the silicon substrate, and a voltage is applied to the piezoelectric element to make the piezoelectric element expand and contract, to thereby make the vibrating element vibrate.

The entire disclosure of Japanese Patent Application Nos: 2014-219774, filed Oct. 28, 2014 and 2014-219775, filed Oct. 28, 2014 are expressly incorporated by reference herein.

What is claimed is:

1. An electronic device comprising:
   a vibration element including a vibration body and an electrode provided to the vibration body;
   a semiconductor substrate disposed so as to be opposed to the vibration element;
   a first wiring pattern located between the semiconductor substrate and the vibration element;
   a second wiring pattern located between the first wiring pattern and the vibration element, and different in potential from the first wiring pattern; and
   a shield wiring pattern disposed at least a part of an area, which is located between the first wiring pattern and the second wiring pattern, and in which the first wiring pattern and the second wiring pattern overlap each other in a planar view, the shield wiring pattern being electrically connected to a constant potential.

2. The electronic device according to claim 1, wherein the vibration body includes a drive vibrating section and a detection vibrating section,
   the electrode includes a drive signal electrode disposed in the drive vibrating section and a detection signal electrode disposed in the detection vibrating section, and
   one of the first wiring pattern and the second wiring pattern is electrically connected to the drive signal electrode, and the other of the first wiring pattern and the second wiring pattern is electrically connected to the detection signal electrode.

3. The electronic device according to claim 1, wherein the shield wiring pattern is grounded.

4. The electronic device according to claim 1, further comprising:
   an insulating layer disposed between the first wiring pattern and the shield wiring pattern.

5. The electronic device according to claim 1, further comprising:
   an insulating layer disposed between the second wiring pattern and the shield wiring pattern.

6. The electronic device according to claim 4, wherein the insulating layer has elasticity.

* * * * *